United States Patent
Gogoi

(10) Patent No.: US 10,280,074 B2
(45) Date of Patent: *May 7, 2019

(54) MONOLITHICALLY INTEGRATED MULTI-SENSOR DEVICE ON A SEMICONDUCTOR SUBSTRATE AND METHOD THEREFOR

(71) Applicant: Versana Micro Inc, Scottsdale, AZ (US)

(72) Inventor: Bishnu Prasanna Gogoi, Scottsdale, AZ (US)

(73) Assignee: Versana Micro Inc, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/669,916

(22) Filed: Aug. 5, 2017

(65) Prior Publication Data

US 2017/0355596 A1 Dec. 14, 2017

Related U.S. Application Data

(63) Continuation of application No. 15/050,388, filed on Feb. 22, 2016, now Pat. No. 9,758,368, which is a continuation of application No. 14/207,419, filed on Mar. 12, 2014, now Pat. No. 9,266,717, said application No. 15/050,388 is a continuation of
(Continued)

(51) Int. Cl.
| | |
|---|---|
| *B81B 7/02* | (2006.01) |
| *H01L 27/14* | (2006.01) |
| *H01L 27/22* | (2006.01) |
| *H01L 27/16* | (2006.01) |

(Continued)

(52) U.S. Cl.
CPC ............... *B81B 7/02* (2013.01); *H01L 27/14* (2013.01); *H01L 27/16* (2013.01); *H01L 27/22* (2013.01); *H01L 41/1132* (2013.01); *H01L 41/1138* (2013.01); *H05K 7/02* (2013.01); *B81B 2201/0207* (2013.01); *B81B 2201/0214* (2013.01); *B81B 2201/0228* (2013.01); *B81B 2201/0257* (2013.01); *B81B 2201/0264* (2013.01); *B81B 2201/0278* (2013.01); *B81B 2207/012* (2013.01); *B81B 2207/05* (2013.01);
(Continued)

(58) Field of Classification Search
CPC ....................................................... B81B 7/02
See application file for complete search history.

(56) References Cited

U.S. PATENT DOCUMENTS

| | | |
|---|---|---|
| 5,631,446 A | 5/1997 | Quan |
| 5,804,086 A | 9/1998 | Bruel |

(Continued)

*Primary Examiner* — William Coleman

(57) ABSTRACT

A monolithically integrated multi-sensor (MIMS) is disclosed. A MIMs integrated circuit comprises a plurality of sensors. For example, the integrated circuit can comprise three or more sensors where each sensor measures a different parameter. The three or more sensors can share one or more layers to form each sensor structure. In one embodiment, the three or more sensors can comprise MEMs sensor structures. Examples of the sensors that can be formed on a MIMs integrated circuit are an inertial sensor, a pressure sensor, a tactile sensor, a humidity sensor, a temperature sensor, a microphone, a force sensor, a load sensor, a magnetic sensor, a flow sensor, a light sensor, an electric field sensor, an electrical impedance sensor, a galvanic skin response sensor, a chemical sensor, a gas sensor, a liquid sensor, a solids sensor, and a biological sensor.

20 Claims, 33 Drawing Sheets

Related U.S. Application Data application No. 14/207,433, filed on Mar. 12, 2014, now Pat. No. 9,580,302, said application No. 15/050,388 is a continuation of application No. 14/207,443, filed on Mar. 12, 2014, now Pat. No. 9,327,965, said application No. 15/050,388 is a continuation of application No. 14/207,461, filed on Mar. 12, 2014, now Pat. No. 9,862,594.

(60) Provisional application No. 61/793,860, filed on Mar. 15, 2013.

(51) Int. Cl.
*H05K 7/02* (2006.01)
*H01L 41/113* (2006.01)

(52) U.S. Cl.
CPC ....... *B81B 2207/09* (2013.01); *H01L 2924/00* (2013.01)

(56) References Cited

U.S. PATENT DOCUMENTS

| | | | |
|---|---|---|---|
| 5,856,722 A | 1/1999 | Haronian et al. | |
| 6,938,334 B2 | 9/2005 | Yu | |
| 6,939,473 B2 | 9/2005 | Nasiri | |
| 6,956,268 B2 | 10/2005 | Faris | |
| 7,159,459 B2 | 1/2007 | Gogoi | |
| 7,215,991 B2 | 5/2007 | Besson et al. | |
| 7,223,624 B2 | 5/2007 | Wu et al. | |
| 7,243,561 B2 | 7/2007 | Ishigami et al. | |
| 7,247,246 B2 | 7/2007 | Nasiri | |
| 7,258,011 B2 | 8/2007 | Nasiri | |
| 7,276,789 B1 | 10/2007 | Cohn et al. | |
| 7,322,236 B2 | 1/2008 | Combi et al. | |
| 7,402,897 B2 | 7/2008 | Leedy | |
| 7,585,744 B2 | 9/2009 | Gogoi et al. | |
| 7,600,426 B2 | 10/2009 | Savolainen et al. | |
| 7,642,923 B2 | 1/2010 | Ploechinger | |
| 7,658,109 B2 | 2/2010 | Fukuda et al. | |
| 7,690,255 B2 | 4/2010 | Gogoi et al. | |
| 7,785,098 B1 | 8/2010 | Appleby et al. | |
| 7,793,544 B2 | 9/2010 | Merassi et al. | |
| 7,796,872 B2 | 9/2010 | Sachs | |
| 7,858,440 B2 | 12/2010 | Pressel et al. | |
| 7,907,838 B2 | 2/2011 | Nasiri | |
| 8,039,312 B1 | 10/2011 | Gunturu et al. | |
| 8,097,926 B2 | 1/2012 | De Graff et al. | |
| 8,138,062 B2 | 3/2012 | Liu et al. | |
| 8,149,564 B2 | 4/2012 | Liu et al. | |
| 8,158,492 B2 | 4/2012 | Liu et al. | |
| 8,186,221 B2 | 5/2012 | Lin et al. | |
| 8,220,330 B2 | 7/2012 | Miller et al. | |
| 8,227,876 B2 | 7/2012 | Nunan et al. | |
| 8,283,207 B2 | 10/2012 | Ramiah et al. | |
| 8,304,275 B2 | 11/2012 | Schlarmann et al. | |
| 8,350,346 B1 | 1/2013 | Huang | |
| 8,358,321 B1 | 1/2013 | Weidner | |
| 8,395,381 B2 | 3/2013 | Lo | |
| 8,470,630 B2 | 6/2013 | Rudhard et al. | |
| 8,470,631 B2 | 6/2013 | Kramer et al. | |
| 8,476,087 B2 | 7/2013 | Hooper et al. | |
| 8,487,387 B2 | 7/2013 | Lin et al. | |
| 8,513,042 B2 | 8/2013 | Perruchot et al. | |
| 8,592,241 B2 | 11/2013 | Hayes et al. | |
| 8,629,011 B2 | 1/2014 | Diamond et al. | |
| 8,629,353 B2 | 1/2014 | Dinyari et al. | |
| 8,659,100 B2 | 2/2014 | Zoellin et al. | |
| 8,692,340 B1 | 4/2014 | Ata et al. | |
| 8,823,114 B2 | 9/2014 | Tanaka et al. | |
| 2006/0001114 A1 | 1/2006 | Chen et al. | |
| 2006/0179940 A1 | 8/2006 | Liu et al. | |
| 2006/0219006 A1 | 10/2006 | Nasiri et al. | |
| 2007/0295456 A1 | 12/2007 | Gudeman et al. | |
| 2008/0022777 A1 | 1/2008 | Tan et al. | |
| 2008/0096301 A1 | 4/2008 | Ramamoorthi et al. | |
| 2008/0196499 A1 | 8/2008 | Li et al. | |
| 2008/0202209 A1 | 8/2008 | Lambkin et al. | |
| 2008/0284611 A1 | 11/2008 | Leedy | |
| 2010/0052082 A1 | 2/2010 | Lee et al. | |
| 2010/0193234 A1 | 8/2010 | Kisban et al. | |
| 2010/0242600 A1 | 9/2010 | Lin et al. | |
| 2010/0242603 A1 | 9/2010 | Miller et al. | |
| 2010/0276765 A1 | 11/2010 | Yamamoto et al. | |
| 2011/0015765 A1 | 1/2011 | Haughay, Jr. et al. | |
| 2011/0048132 A1 | 3/2011 | Rettig et al. | |
| 2011/0126632 A1 | 6/2011 | McNeil et al. | |
| 2011/0150036 A1 | 6/2011 | Lee et al. | |
| 2011/0218757 A1 | 9/2011 | Callsen et al. | |
| 2013/0088941 A1 | 4/2013 | Elian et al. | |
| 2013/0192356 A1 | 8/2013 | De Graff et al. | |

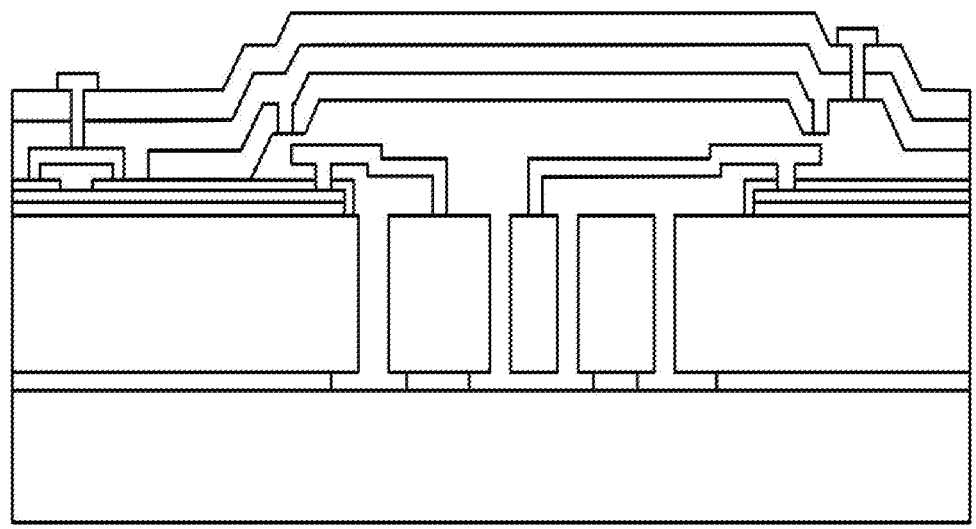
*FIG. 2*
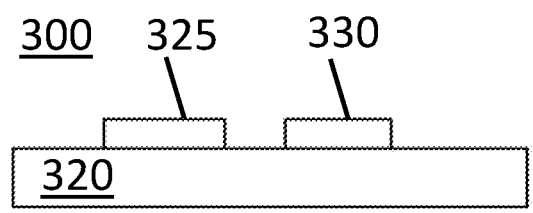
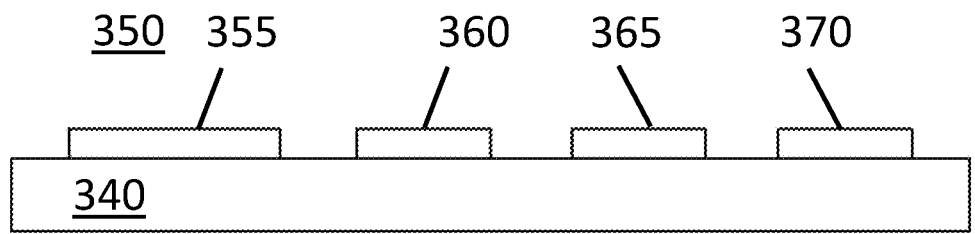
*FIG. 3*

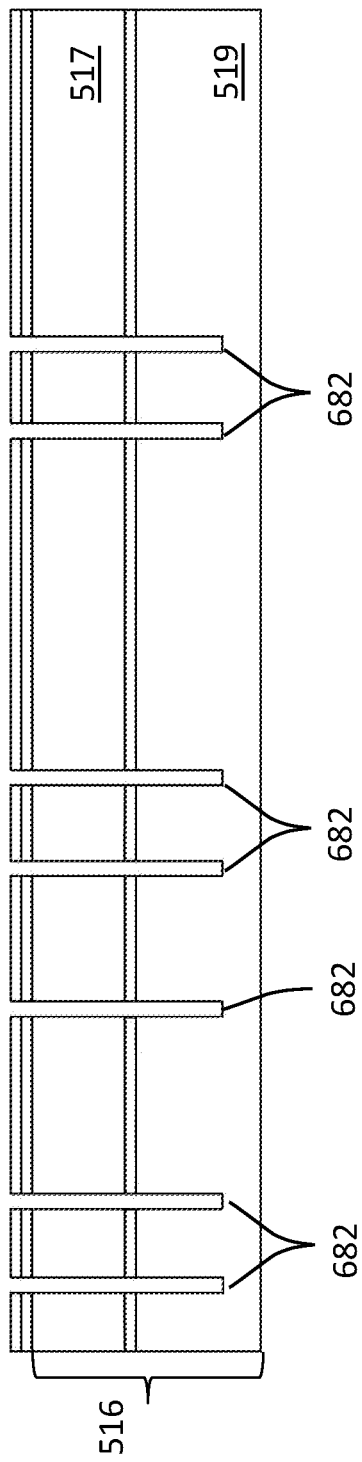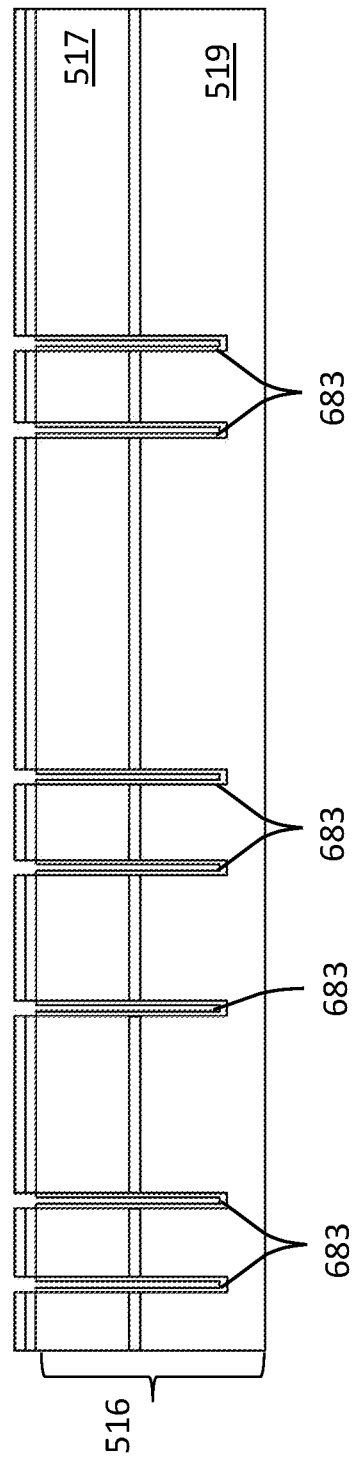

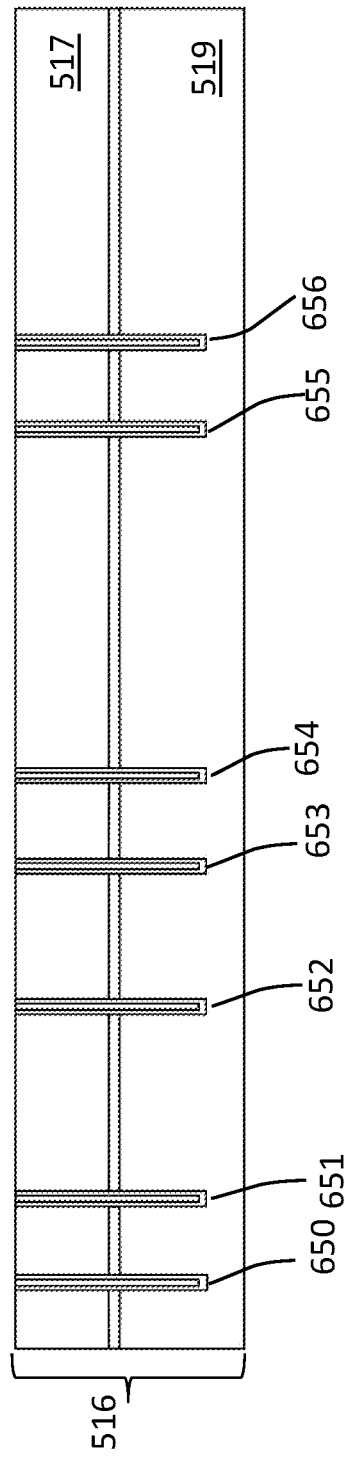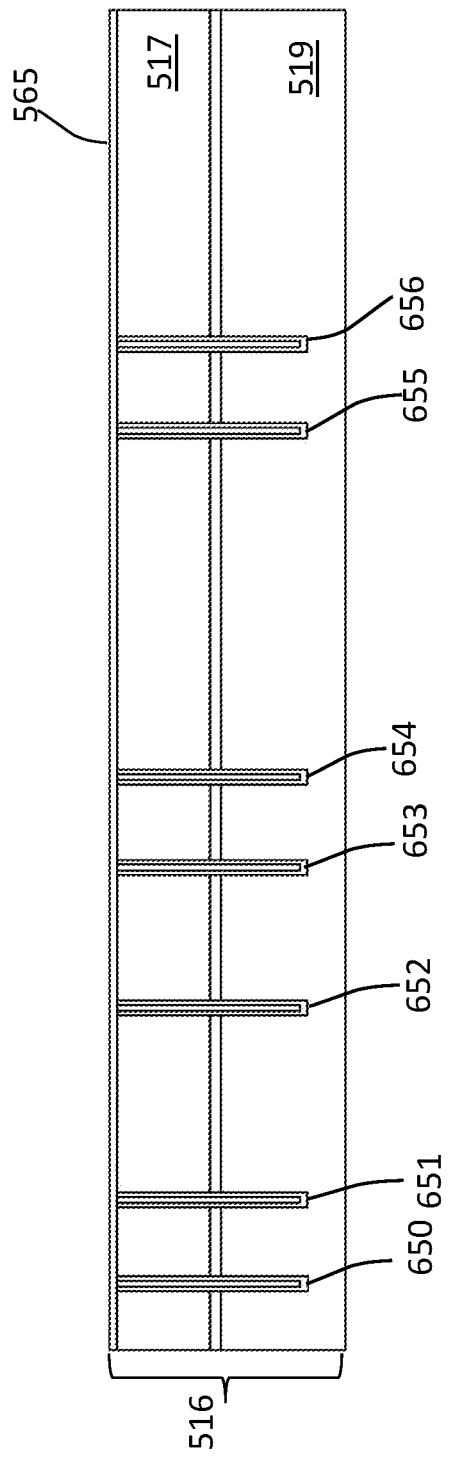

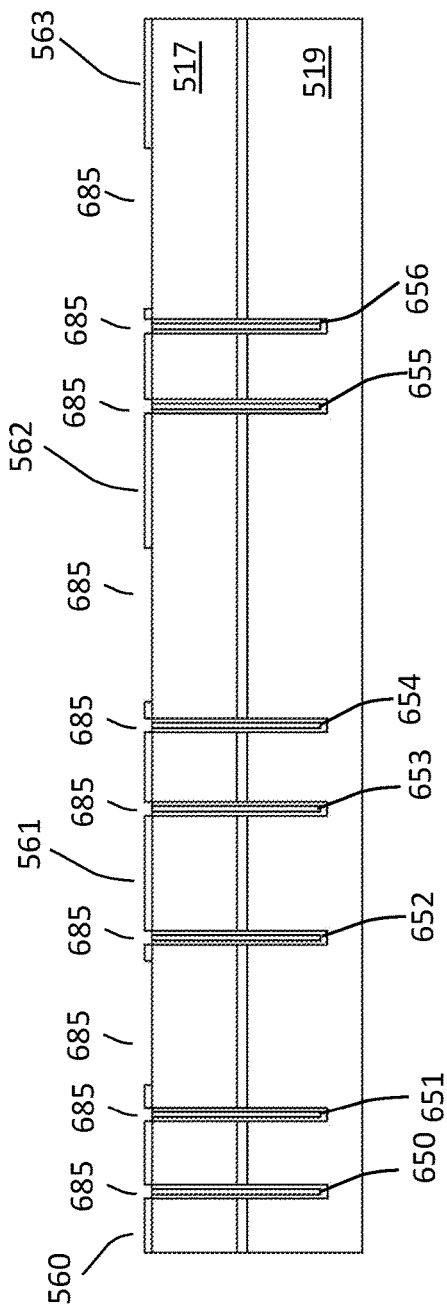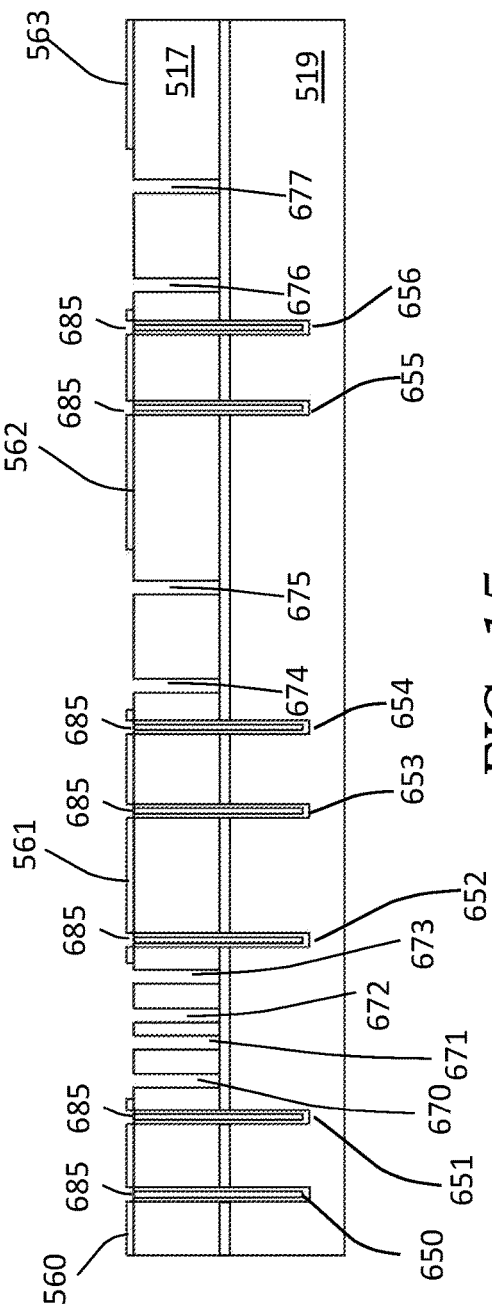

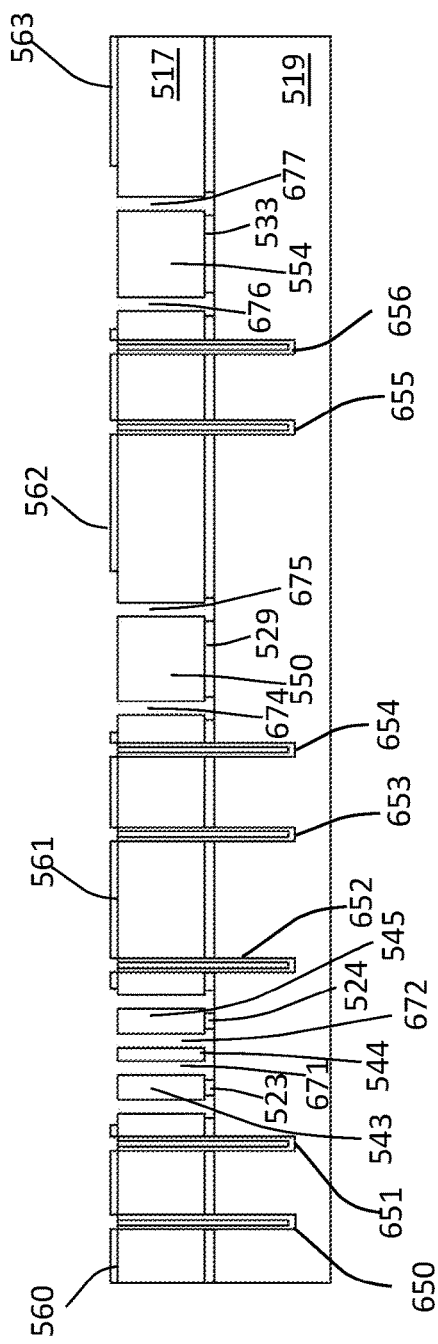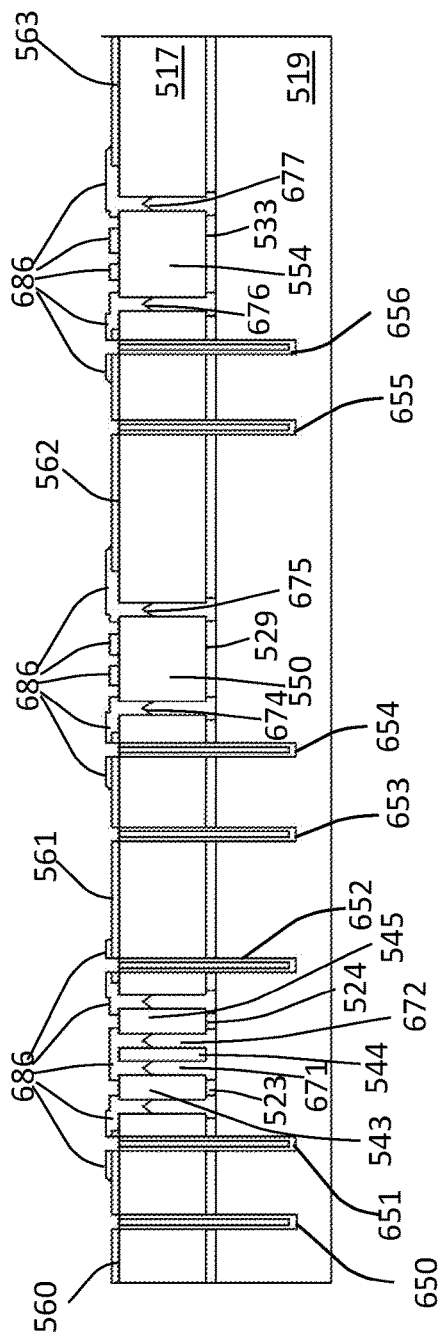

MONOLITHICALLY INTEGRATED MULTI-SENSOR DEVICE ON A SEMICONDUCTOR SUBSTRATE AND METHOD THEREFOR

CROSS-REFERENCE TO RELATED APPLICATIONS

This application is a continuation of U.S. application Ser. No. 15/050,388 filed on Feb. 22, 2016 the contents of which are hereby incorporated by reference in its entirety. U.S. application Ser. No. 15/050,388 is a continuation of applications Ser. Nos. 14/207,419, 14/207,433, 14/207,443, and 14/207,461 all filed on Mar. 12, 2014, wherein each Application listed above is hereby incorporated by reference in its entirety. applications Ser. Nos. 14/207,419, 14/207,433, 14/207,443, and 14/207,461 further claim the priority benefit of U.S. Provisional Patent Application No. 61/793,860 filed on 15 Mar. 2013 the disclosure of which is hereby incorporated herein by reference in its entirety.

FIELD

The present invention generally relates to sensors and more particularly, to different types of sensors formed on single or common substrate.

BACKGROUND

Many devices and systems include various numbers and types of sensors. The varied number and types of sensors are used to perform various monitoring and/or control functions. The systems can be active using real-time measurement data form the sensors in a work-flow or to control decision processes in operating devices. Sensors are used in conjunction with interface circuitry and control circuitry to interface with different sensor types, to control when measurements are taken, and to actively process the measurement data. Sensors are placed in proximity to the parameter being measured. Sensors can require direct interaction with the parameter of interest or conversely can be measured indirectly. In general, the number and uses of sensors is growing and being applied in a number of new and different applications.

Sensors can be mechanical, chemical, biological, electromechanical, or solid state to name but a few. A sensor is a singular component that is coupled to other electronic circuits via a printed circuit board or other connection means. MEMS (Micro-Electro-Mechanical Systems) technology is a type of micro-fabrication technique used to form a sensor that interacts with the environment to measure physical, chemical, or biological parameters. Thus, in recent years, many of the sensors used to perform monitoring and/or control functions use MEMS technology for their implementation. These sensors provide electrical parameters such as voltage, current, frequency, etc. as inputs to the interface circuits that are equivalent to the physical, chemical, biological etc. parameters that are being measured. At issue is that these sensors and other types of sensors are separate devices or a plurality of devices of the same type or measure similarly. Often to increase functionality or add further sensing capability different sensor types are combined in a package or on a PCB. This results in a larger foot-print, higher power consumption, higher complexity, increased cost and more complicated fabrication and assembly processes. Therefore, there is a need and benefit to combine sensors of different types that measure different parameters, in a monolithic process, and on a semiconducting substrate that reduces the size, improves performance, lowers cost, and reduces manufacturing and assembly complexity. Furthermore, this will open the door to new and different applications that were limited by the scale of system integration.

BRIEF DESCRIPTION OF THE DRAWINGS

Various features of the system are set forth with particularity in the appended claims. The embodiments herein, can be understood by reference to the following description, taken in conjunction with the accompanying drawings, in which:

FIG. 2 illustrates an example embodiment of an Indirect Interface Sensor (IIS);

FIG. 3 illustrates an example embodiment of a MIMS device (Monolithically Integrated Multi-Sensor);

FIGS. 6-29 are simplified cross section views of the MIMS device shown in FIG. 5B illustrating the various exemplary methodological steps that are used to make various MIMS devices in accordance with example embodiments;

Figure 1:
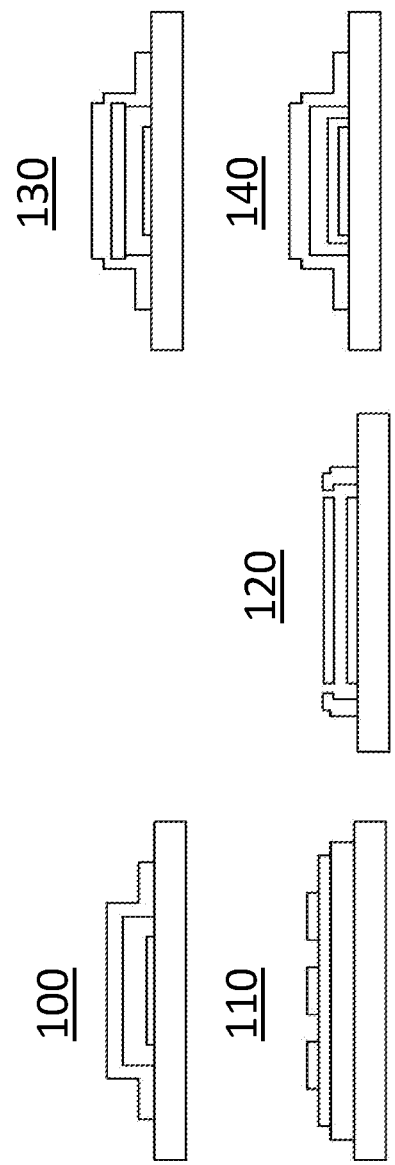
FIG. 1. illustrates example embodiments of Direct Interface Sensors (DIS)

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following description of exemplary embodiment(s) is merely illustrative in nature and is in no way intended to limit the invention, its application, or uses.

Processes, techniques, apparatus, and materials as known by one of ordinary skill in the art may not be discussed in detail but are intended to be part of the enabling description where appropriate. For example specific computer code may not be listed for achieving each of the steps discussed, however one of ordinary skill would be able, without undo experimentation, to write such code given the enabling disclosure herein. Such code is intended to fall within the scope of at least one exemplary embodiment.

In all of the examples illustrated and discussed herein, any specific materials, such as temperatures, times, energies, and material properties for process steps or specific structure implementations should be interpreted to be illustrative only and non-limiting. Processes, techniques, apparatus, and materials as known by one of ordinary skill in the art may not be discussed in detail but are intended to be part of an enabling description where appropriate. It should also be noted that the word "coupled" used herein implies that elements may be directly coupled together or may be coupled through one or more intervening elements.

Additionally, the sizes of structures used in exemplary embodiments are not limited by any discussion herein (e.g., the sizes of structures can be macro (centimeter, meter, and larger sizes), micro (micrometer), and nanometer size and smaller).

Notice that similar reference numerals and letters refer to similar items in the following figures, and thus once an item is defined in one figure, it may not be discussed or further defined in the following figures.

Modern electronic systems use different sensors that interact with the environment and transduce this information into the electrical domain. The input domain thus can be physical, chemical, biological etc. Thus, the sensors that interact with these domains can be classified as physical, chemical and biological sensors. These sensors may use a variety of transduction principles (based on physical, chemical and biological phenomena) to produce the equivalent electrical parameters that are the inputs to the interface circuit.

In order to derive benefits of high performance, low cost, low power consumption, small size and form factor, these sensors are realized in singular form by integrated circuit processes. Examples of different sensors that are useful for providing input to a system are physical sensors such as:

Inertial sensor—linear acceleration-multi-axis
Inertial sensor—angular acceleration-multi-axis
Inertial sensor—vibration-multi-axis
Inertial sensor—shock-multi-axis
Inertial sensor—angular rate-multi-axis
Pressure sensor—absolute
Pressure sensor—differential
Pressure sensor—gage
Tactile sensor—touch
Humidity sensor—relative humidity
Temperature sensor—ambient
Temperature sensor—infra-red
Temperature sensor—contact
Microphone—audio
Force sensor—force
Load sensor—loads and strain-multi-axis
Magnetic sensor—multi-directional magnetic fields
Flow sensor—fluid flow
Light sensor—imaging
Electrical field sensor
Electrical impedance—probe
Galvanic Skin Response sensor
Chemical sensors:
Various chemicals including gases, liquids and solids
Biological sensors:
Various biological samples of cells, tissue, fluids
Biological probes for neural, muscular signals The sensors can be classified also by how they interact with the measuring environment. In a broad classification, sensors can be classified as Direct Interface Sensors (DIS), Indirect Interface Sensors (IIS), and Direct Interface Sensors.

Some sensors need to interact directly with the sensing environment and must be exposed to the sensing medium. These sensors are called Direct Interface Sensors (DIS). The DIS must interact directly with the measurand and be able to withstand all the effects due to the exposure to the media where the sensor is used. Some examples of this class of sensors are pressure sensors where the ambient pressure must act on the measuring membrane and then transduced to an equivalent electrical signal. Similarly, a humidity sensor is exposed to the ambient humidity and provides an equivalent electrical signal. Also, a microphone responds to the sound waves and is directly exposed to it. The microprobes that are fabricated have to be in contact with the biological component that it is measuring. A neural probe has to be in contact with nerve cells while a muscle stimulating electrode must contact with muscle cells. Similarly, a flow sensor is exposed to the flow of the fluid directly to measure the flow. FIG. 1 illustrates example embodiments of Direct Interface Sensors.

Direct Interface Sensors can be further classified as:
Direct Interface Sensors—No Line of Sight
Direct Interface Sensors—Line of Sight
Direct Interface Sensors—Through a Medium
Direct Interface Sensors—No Line of Sight These Direct Interface Sensors need to be directly exposed to the sensing environment and not in the direct line of sight of the parameter that is being measured. In this case, the sensor responds to the sensed parameter of interest and do not need to be in the direct line of sight. An example of this type of DIS is a pressure sensor that senses the ambient pressure and produces a transduced signal. Another example would be a humidity sensor that senses the ambient humidity and produces the equivalent transduced signal. A pressure sensor 100 is a direct interface sensor and a humidity sensor 110 is also a direct interface sensor.

Direct Interface Sensors—Line of Sight

These Direct Interface Sensors need to be directly exposed to the sensing environment and directly in the line of sight of the parameter that is being measured. An example would be an optical sensor that is receiving input from the light source in front of it. Another example would be a microphone which is receiving audio energy from an audio source in front of it. Another example of a direct interface sensor would be a Galvanic skin Response sensor.

In FIG. 1, 120 is a microphone as an example of direct interface sensor with line of sight.

Direct Interface Sensors—Through a medium

These Direct Interface Sensors need to be exposed to the sensing environment but not directly but through a medium. These sensors sense the parameter of interest through a medium. An example of this type of DIS would be a magnetic field sensor which can be enclosed in a cavity and still be exposed to the parameter of interest and produce an equivalent transduced signal. Another example of this sensor can be an optical sensor in a cavity with an optically transparent window and which produces an equivalent transduced signal.

In FIG. 1, 130 is a magnetic sensor which is enclosed in a cavity to sense the magnetic field and 140 is an optical sensor which is enclosed in a cavity with a transparent window.

Indirect Interface Sensors

The second class of sensors does not need to be in direct contact or have direct exposure to the measuring environment. In this class of sensors, the sensing element or elements are indirectly exposed to the measurand and then provides a transduced electrical signal. This class of sensors is classified as Indirect Interface Sensors (IIS). An example for an IIS is an inertial sensor such as an accelerometer where the sensor element is in an enclosed environment and responds to the change in the acceleration and provides an equivalent electrical signal. In this class of sensors, the sensor element is not directly exposed to the measuring environment. Similarly, a gyroscope responds to the rate of rotational change without being exposed to the measuring environment. FIG. 2 illustrates an example embodiment of an Indirect Interface Sensor (IIS). An accelerometer 200 can be used as an example of an Indirect Interface Sensor.

The design and fabrication of sensors for measuring different environmental parameters have some common characteristics that can be utilized when combining sensors.

These structural elements may contain elements that respond to different physical, chemical, biological inputs. These structural elements may perform mechanical, electrical, chemical, material functions that enable the functioning of the sensors. The structural elements can be static or capable of movement, where it responds to an input or is subjected to movement by application of an applied force. These structural elements can form different parts of a sensor such as Suspensions
Plates
Beams
Membranes
Diaphragms
Wires
Anchors
Pillars
Posts
Walls
Tubes
Tips
Cavities
Sealed cavity in vacuum
Sealed cavity under pressure These structural elements can perform different functions that enable the implementation of different sensors Moving electrodes
Reference electrodes
Test electrodes
Shielding electrodes
Platforms for sensing materials
Provide electrical isolation
Provide thermal isolation
Provide mechanical isolation These structural elements can be implemented in different sensors to provide different functions for different sensors. By combining different structural elements to provide different functions for different sensors, multiple sensors can be implemented using a parallel design method and common fabrication process. The sensors can be combined using a structured method which is described below Determine the sensors required for the platform
Define the performance specifications for each sensor
Choose a common transduction principle for the majority of the sensors—capacitive, piezoresistive, piezoelectric, optical, resonant
Determine the transduction principle for the rest of the sensors
Identify the sensor with the highest fabrication complexity
Determine the fabrication flow for the sensor with the highest complexity
Determine the structural components for each of the other sensors
Determine the unique requirements for each sensor
Design each sensor for the specified performance
Iterate as needed until all performance specifications are met By combining different structural components from different sensors, it is possible to integrate multiple sensors on a common substrate that share structural layers for their implementation. This may be defined as a MIMS (Monolithically Integrated Multi-Sensor). A MIMS device may be defined as a collection of multiple sensors that are formed using substantially common layers on a common substrate. These multiple sensors perform different functions and respond to different input stimulus. The term "Monolithically Integrated" implies implementation on the same substrate, which may be a wafer. The substrate may be formed of semiconducting wafers or on conductive or non-conductive layers. The term "Multi-Sensor" means a number of at least two sensors formed on the substrate. The sensors formed on the MIMS device may comprise of direct interface sensors and indirect interface sensors. The multiple sensors of a MIMS device may be formed on a single substrate and then combined with an integrated circuit or it can be comprised of multiple sensors formed on the same substrate as an integrated circuit. Thus, a MIMS device may comprise of multiple sensors on the same substrate which may be semiconducting and also used to form an integrated circuit. The layers used for the implementation of a MIMS device may consist of a substrate on which different materials may be deposited, grown or formed. The substrate may itself be considered as a layer used for the formation of the MIMS device. The substrate may be formed of semiconducting material and may comprise of single crystal silicon, germanium, gallium arsenide, gallium nitride, indium phosphide and the like. The substrate may also comprise of layers of materials that can be semiconducting, insulating and the like. An example of a layered substrate may be a SOI (silicon on insulator) where a semiconductor silicon wafer is bonded to another semiconductor silicon layer with an intermediate bonding layer of insulating oxide. Another example of a layered substrate may be a SOS (silicon on sapphire) where a silicon semiconducting layer is boned to the surface of a sapphire insulating wafer.

The layers used for the MIMS device can also be deposited on the surface of the substrate and can be deposited using semiconductor processes such as LPCVD (Low Pressure Chemical Vapor Deposition), PECVD (Plasma Enhanced Chemical Vapor Deposition), APCVD (Atmospheric Pressure Chemical Vapor Deposition), SACVD (Sub Atmospheric Chemical Vapor Deposition), PVD (Physical Vapor Deposition), ALD (Atomic Layer Deposition), MOCVD (Metallo-Organic Chemical Vapor Deposition), MBE (Molecular Beam Epitaxy) and the like. The layers of a MIMS device can also be sputtered, evaporated, spin-coated, spray coated, electro-plated and the like.

The layers used for a MIMS device can also be grown using such processes as thermal growth, such as silicon dioxide, epitaxially growth using such processes as low temperature epitaxial growth, non-selective epitaxial growth and the like.

The layers used for a MIMS device are formed on the entire surface of the substrate for forming multiple sensors and then patterned to form elements or components of different sensors. The layers used for a MIMS device may be patterned using resist and photolithography and then etched using a wet etch, dry etch, a combination of wet and dry etch. The layers used for a MIMS device may also be patterned using physical methods such as laser etching, ion-milling and the like.

The patterning of the layers used in a MIMS device forms different structural components for different sensors that can be static or dynamic. The combination of these layers and the components formed using patterning allows for multiple sensors to be formed on a common substrate for a MIMS device. The multiple sensors formed on a MIMS device may consist of Direct Interface Sensors, Indirect Interface Sensors and a combination of the two.

The MIMS device may consist of an integrated circuit formed on the same semiconducting substrate or it may be combined with the integrated circuit using wirebonding or stacking or a combination of the two. For a MIMS device stacked with an integrated circuit, the MIMS device and the integrated circuit are placed so that electrical contacts from the MIMS device are vertically connected to the corresponding electrical contacts of the integrated circuit. The vertical contacts between the stacked MIMS device and integrated circuit may use vertical interconnects such as TSV (Through Silicon Vias), flip-chip, and the like. The vertical interconnects may use a bond or solder to reduce contact resistance between the electrical contacts of the MIMS device and the interface circuit.

FIG. 3 illustrates a MIMS device 300 formed on the same substrate 320 and containing a Direct Interface Sensor 325 and an Indirect Interface Sensor 330. Another example of a MIMS device 350 is shown in FIG. 3 where the same common substrate 340 is used to form Indirect Interface Sensor 355, a Direct Interface Sensor 360, a Direct Interface Sensor with line of sight 365 and a Direct Interface Sensor inside a cavity 370.

Figure 4:
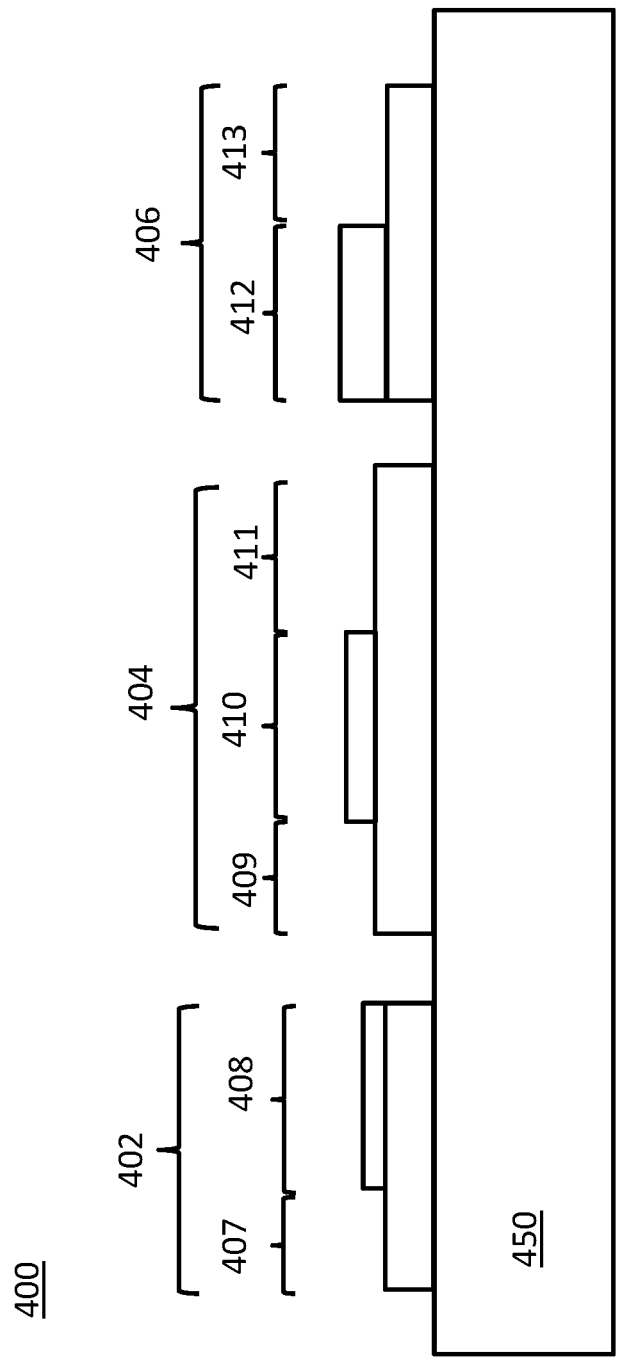
FIG. 4 illustrates an example embodiment of a MIMS device (Monolithically Integrated Multi-Sensor) including sensor and field regions.

An exemplary description of a MIMS device with multiple sensors formed on a common substrate is described. FIG. 4 illustrates an example embodiment of a MIMS device (Monolithically Integrated Multi-Sensor) including sensor and field regions. A device 400 is shown having a substrate on which multiple sensors are formed. In the exemplary description, three sensors are shown that are formed on a common substrate. The substrate 450 is the initial surface on which the sensors 402, 402, 404 are formed. Each sensor formed on the substrate has a field region and a sensor region. Thus, sensor 402 has field region 407, and sensor region 408, sensor 404 has field region 409, sensor region 410 and field region 411 and sensor 406 has sensor region 412 and field region 413.

The substrate 450 is the initial surface on which the sensors are formed. The substrate 450 may also be used for forming other devices such as semiconductor devices, integrated circuits, actuators. The substrate 450 may be in the form of wafers that are typically round in shape. It may also be of other shapes such as squares, rectangles that may be compatible with semiconductor fabrication process. If substrate 450 is in the form of wafers, it may be formed with single crystal silicon. Substrate 450 may also be formed with multiple layers that contain both conducting and insulating layers. In one embodiment, it may be composed of silicon on insulator (SOI). In other embodiments, it can be SOx, (silicon on x—where x is a carrier wafer that may be composed of germanium, sapphire, silicon carbide). For the embodiment where the substrate is SOI, it consists of a carrier wafer formed on single crystal silicon known as the handle wafer. Above the handle wafer is an intermediate layer of silicon dioxide known as the Buried Oxide (BOX). Above the BOX, there is another layer of single crystal silicon layer called the device layer. The substrate may also be used for the implementation of the different sensors.

The field region for each sensor contains elements that enable the sensor to be connected to an integrated circuit that converts the signals from the sensors into equivalent electrical signals. These elements can be interconnects that connect to the various electrodes of the sensor to other connection elements that connect to the interface circuit. The interface connecting elements can be bondpads, contact bumps, vertical interconnects, planar interconnects among others. If the connection elements are bondpads, wirebonds are formed that electrically connect each electrode to a corresponding bondpad in the interface circuit. If the connection elements are contact bumps, the electrode of the sensor is connected to a corresponding contact bump of the integrated circuit using a flip-chip assembly. If the connection elements are vertical interconnects, each electrode of the sensor is connected through the substrate in which the sensor is formed to a corresponding electrode of the integrated circuit using an intermediate connection conductive layer. If the vertical interconnects are formed in a silicon substrate, they are called through silicon vias (TSV). If the sensor is formed monolithically with the integrated circuit, each electrode of the sensor is connected to the corresponding electrode of the integrated circuit using planar interconnects.

In addition to the interconnects that connect to each electrode of the sensor, the field region may also contain electrodes that provide other functions such as shielding from electro-magnetic fields. These shielding electrodes can be formed for each interconnect structure—wirebonds, contact bumps, vertical interconnects. These shielding electrodes can be connected to different electrical potentials to protect the sensor electrodes from electromagnetic fields.

The sensor region for each sensor contains elements that are utilized in the design and functioning of the sensor. These elements form the structural components of each sensor to provide the specific function for which the sensor is designed. These structural components perform different functions which together enable the sensor to perform the function for which it is designed. These structural components or elements may be static, in which case, they do not move relative to the substrate on which the sensor is formed. Other structural elements or components may be dynamic, in which case, they may be capable of movement relative to the substrate on which the sensor is formed. The movement that the dynamic structural components perform may be linear, angular, rotational or a combination of motions. The linear motion may be on 1, 2 or 3 axis. The angular motion may also be in 1, 2 or 3 axis. The rotational motion may also be in 1, 2 or 3 axis (roll, pitch and yaw).

The static and dynamic structural elements or components in the sensor region are connected to the interconnects in the field region. The static and dynamic structural components are thereby connected to the interface circuit.

The static and dynamic structural elements or components are formed using different structural layers. These structural layers are formed by using different materials used in the formation of semiconductor and sensor fabrication process. These layers can be conductive, insulating, semiconducting among others. These layers can be formed using different semiconductor processes such as thermal oxidation, epitaxy, LPCVD (Low Pressure Chemical Vapor Deposition, PECVD, APCVD, SACVD, Sputtering, evaporation. Other techniques may include spin-on glass, spray deposition etc. Some of the commonly used structural layers are Single Crystal Silicon
Silicon/Germanium
Silicon dioxide
Polycrystalline silicon
Polycrystalline Germanium
Silicon nitride
Silicon oxynitride
Silicon Carbide
PSG(phospho-silicate glass)
BPSG (borophosphosilicate glass)
Metals
Polyimide
Parylene
Pyrex glass The static and dynamic structural components or elements are formed using the different structural layers used for the fabrication of the sensor. Each sensor is designed and fabricated using static and dynamic structural components that are formed using the different structural layers.

Different sensors can be formed on the same substrate using the same set of structural layers. The same structural layer in one sensor may be used for forming different structural components to perform one function while the same structural layer may be used for forming another set of structural components in another sensor. For example, a structural layer used for forming a static component in one sensor may be used for forming a dynamic component in another sensor. Another example is a structural layer that is used to form a structural component that is inside a sealed cavity in one sensor may be used for forming another component in another sensor that is exposed to the ambient environment. It is obvious to one experienced in the art that a single structural layer may be used for different structural components in different sensors formed on the same substrate. This ability to use the same structural layer for forming static and dynamic components for forming different sensors enables flexibility in design of multiple sensors on the same substrate.

The choice of structural layers can have a profound effect on the performance of the sensors that can be designed using a co-design or parallel method. By using the principles of structured design, multiple sensors can be designed using the common fabrication process that satisfies the performance specification for each sensor.

The substrate may also be used for forming structural components of different sensors formed on its surface. Both the top surface and bottom surface may be used for forming structural components of different sensors. The substrate can also be used as a structural layer for the formation of different sensors. If the substrate is composed of a SOI (silicon on insulator) wafer, all the three layers-handle wafer, buried oxide and active or device layer can be used as structural layers for formation of different structural components for different sensors. Thus, static and dynamic components of different sensors can be formed using the handle wafer, buried oxide and active or device layer. For example, in one sensor, the handle wafer may be used for forming a dynamic structural component, while in another sensor, the handle wafer may be used for forming a static structural element. In another example, the buried oxide may be partially removed in the sensor area for one sensor, while in another sensor, the buried oxide may be used for a static structural element. In yet another example, the active or device layer may be used to form a dynamic structural element for one sensor while the same active or device layer may be used for a static structural component for another sensor.

Figure 5A:
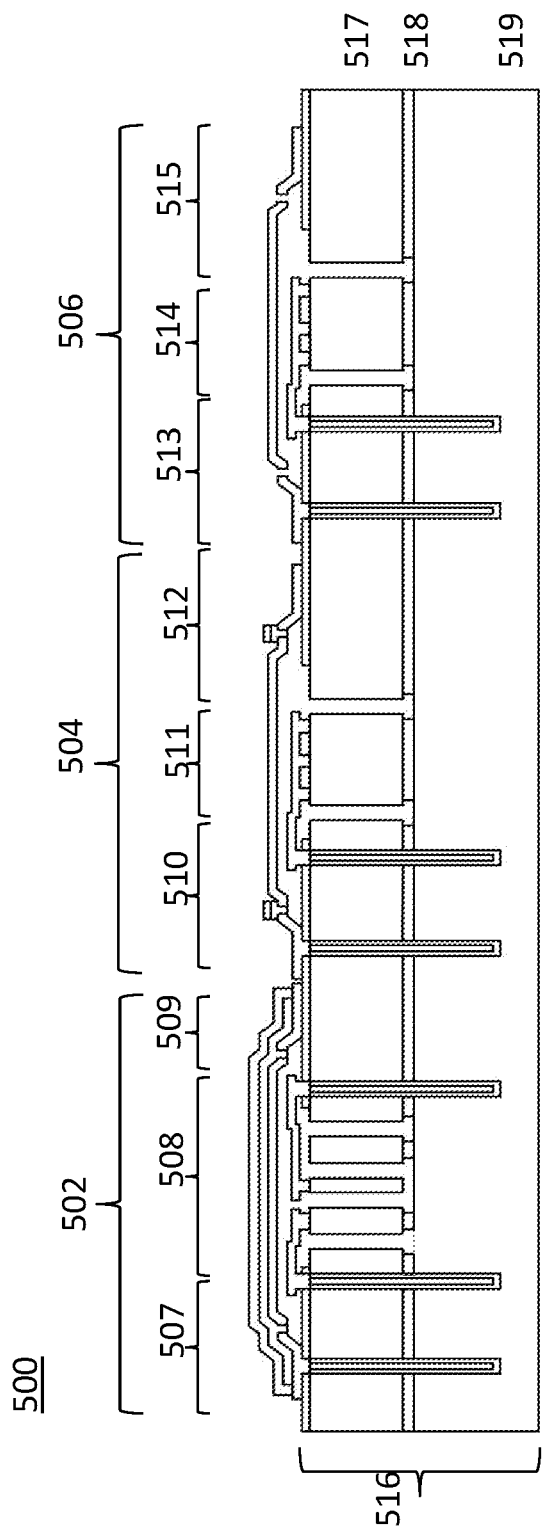
FIG. 5A illustrates a simplified cross section view of a MIMS device (Monolithically Integrated Multi-Sensor) in accordance with an example embodiment.

Turning now to the description, and with reference first to FIG. 5A, a simplified cross-sectional view of an exemplary MIMS device 500 is depicted. The device 500 consists of three separate sensors that are substantially formed simultaneously. The depicted device 500, which is shown in simplified cross-section form, comprises an inertial sensor 502, such as an accelerometer, a pressure sensor 504, and a sound sensitive microphone 506.

The exemplary device 500 is formed on an SOI (silicon on insulator) wafer 516. The SOI wafer 516, as it is generally known, includes a handle layer 519, an active layer or device layer 517 and a sacrificial layer 518 (known as the BOX-buried oxide layer) disposed between the active layer 517 and the handle layer 519.

Figure 5B:
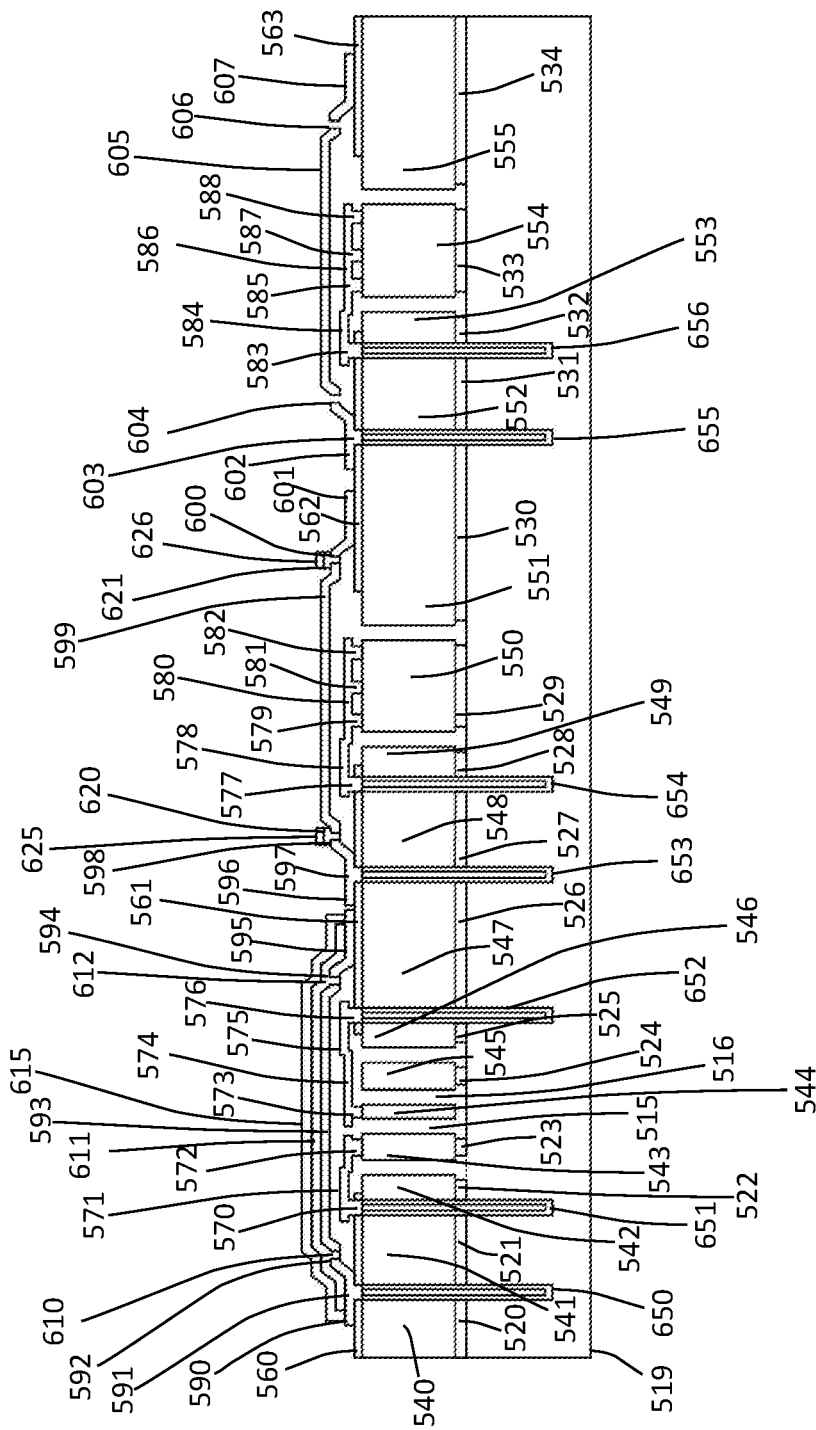
FIG. 5B illustrates a simplified cross section view of a MIMS device (Monolithically Integrated Multi-Sensor) in accordance with an example embodiment.

The sensor region and the field region are both formed in the active layer 517. The sensor region in the active layer is where the sensor is formed and the field region is a region of the active layer that remains in contact with the handle layer, via the sacrificial layer 518. In this exemplary device, the sensor layer is completely or partially released from the handle layer 519. The device 500, in this exemplary embodiment, may contain multiple field regions, 507, 509, 510, 512, 513 and 515. The device 500, in this exemplary embodiment, may contain multiple sensor regions, 508, 511 and 514, where the accelerometer 502, pressure sensor 504 and microphone 506 are formed. The field regions 507, 509, 510, 512, 513 and 515 in the device 500, in this exemplary embodiment, may contain structures to transfer leads from the sensor regions to the handle layer using through vertical interconnects or silicon vias (TSV) 650, 651,652, 653, 654, 655 and 656 as shown in FIG. 5B. The TSVs transfer the electrical connections from the sensors to an integrated circuit using bonding technology.

The structural layers used in this exemplary embodiment are used for implementing different structural components for each sensor. For this exemplary embodiment, each structural layer is used in the accelerometer, pressure sensor and microphone for implementing different structural components that can be static or dynamic. In this exemplary implementation, there are other structural layers which are removed in intermediate steps in the fabrication process. These structural layers may be partially or completely removed from the sensor region for each sensor.

In this exemplary embodiment of a MIMS device, the structural layers that are used for the co-design and parallel fabrication contains layers that have different material, mechanical, electrical properties that can combined for the implementation of the different sensors as illustrated in a simplified cross-sectional view of FIG. 5b.

The handle layer 519 of the SOI wafer is used as the substrate on which the accelerometer, pressure sensor and microphone are formed. In this exemplary embodiment, the handle layer is conductive and is formed of single crystal silicon that is doped with dopants such as phosphorus, arsenic, antimony, boron among others. In this exemplary embodiment, the handle layer serves as the substrate for each sensor on which the field region and sensor region is formed. Thus, for the accelerometer, the handle layer is used to support the vertical interconnects (TSV) to transfer the electrodes from the sensor region to the other surface of the handle layer, for subsequent connection to an interface circuit. In this exemplary embodiment, 650, 651 and 652 are the vertical interconnects for the accelerometer. In the sensor region for the accelerometer, the handle layer is used to support the static and dynamic structural components of the accelerometer. The handle layer for the accelerometer in the sensor region also serves as a motion limiting layer for the dynamic structural components. Thus, when a dynamic structural component of the accelerometer moves towards the handle layer, the motion of the dynamic structural component is stopped when it makes contact with the handle layer below the dynamic structural component. Here the handle layer also performs the function of a motion limiting layer in addition to providing support to the static and dynamic structural components of the accelerometer. When the static or dynamic structural component of the accelerometer is partially or wholly in contact with the handle layer, through the intermediate buried oxide structural layer, it is supported by the handle layer by the formation of a support or anchor region. In this exemplary embodiment, the handle layer in the accelerometer sensor region acts as motion limiting region for dynamic component 544 and as a support or anchor for the static components.

For the pressure sensor 504, the handle layer performs the function of serving as a substrate for all the structural components of the pressure sensor. Thus, for the pressure sensor, in the field region, the handle layer is used to support the vertical interconnects (TSV) to transfer the electrodes from the sensor region to the other surface of the handle layer, for subsequent connection to an interface circuit. In this exemplary embodiment, 653 and 654 are the vertical interconnects for the accelerometer. In the sensor region of pressure sensor 504, the handle layer is used to support the static and dynamic structural components of the pressure sensor. In this exemplary embodiment, the handle layer in the sensor region is used as a support or anchor region. In this case, the handle layer acts as a support for the static reference electrode of the pressure sensor through the intermediate buried oxide structural layer.

For the microphone 506, the handle layer performs the function of serving as the substrate for all the structural components of the microphone. Thus, for the microphone, in the field region, the handle layer is used to support the vertical interconnects (TSV) to transfer the electrodes from the sensor region to the other surface of the handle layer, for subsequent connection to an interface circuit. In this exemplary embodiment, 655 and 656 are the vertical interconnects for the pressure sensor. In the sensor region of the microphone 506, the handle layer is used support the static and dynamic structural components of the microphone. In this exemplary embodiment, the handle layer in the microphone in the sensor region is used as a support or anchor region. In this case, the handle layer acts as a support for the static references electrode of the microphone through the intermediate buried oxide structural layer.

Figure 6:
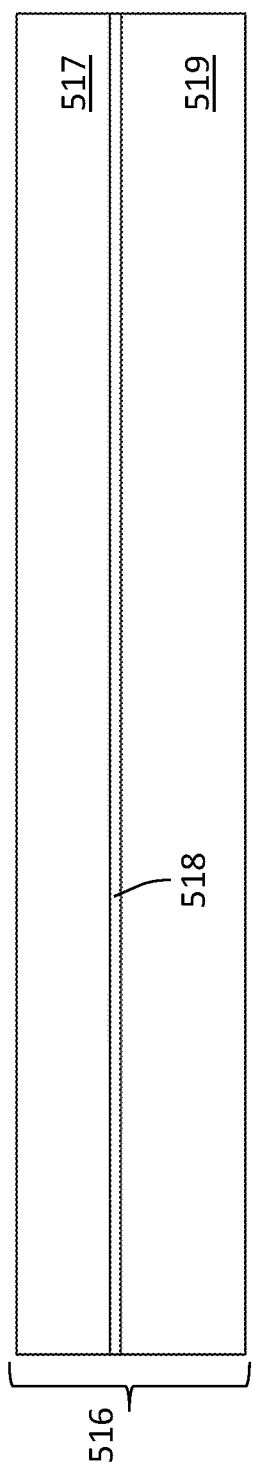

The buried oxide layer 518 shown in FIG. 6 is another structural layer that is used in this exemplary embodiment for the implementation of the accelerometer, pressure sensor and microphone. In this exemplary embodiment, the buried oxide layer is an insulator that does not conduct electricity. The buried oxide layer is used for implementation in both the field region and sensor region and for both static and dynamic structural components. In the field region, the buried oxide layer is used to support the formation of the vertical interconnects. In the sensor region, the buried oxide layer is used for the formation of the static and dynamic components of the accelerometer, pressure sensor and microphone.

For the accelerometer 502, the buried oxide layer is used to support the formation of the vertical interconnects in the field region. The buried oxide layer is partially removed to allow the formation of the vertical interconnects through the device layer, the buried oxide layer and the handle layer. In the sensor area of the accelerometer, the buried oxide layer is used to form the static and dynamic structural components of the accelerometer. In the sensor region of the accelerometer, the buried oxide layer is used to support the static components of the accelerometer. The buried oxide layer component 523 and 524 forms the anchor or support for static components of the accelerometer. These static components 522 and 545 can be fixed electrodes of the accelerometer that does not move with any input acceleration. Thus, 522 and 545 can be a fixed structural component such as a finger, blade, plate and the like that serves as a fixed electrode for an element such as a capacitor. The buried oxide component 525 and 526, form the anchor or support for a dynamic component of the accelerometer. The dynamic structural component of the accelerometer consists of the proof mass that moves in response to the inertial force, the spring suspension that provides the flexibility to the proof mass to move in response to the inertial force. The spring suspension also connects the proof mass to the anchor or support region that is supported by the buried oxide component 525 and 526. The buried oxide layer is removed below the proof mass and the spring suspension so that the dynamic components can move in response to the inertial force. The buried oxide layer may also act as a dynamic structural component if small buried oxide components are allowed to remain attached to the underside of the dynamic components such as the proof mass and suspension spring. In this case, the small buried oxide layer components attached to the underside of the dynamic components acts as a motion limiting stop, preventing the dynamic components such as the proof mass and the suspension springs from coming into contact directly with the handle layer.

For the pressure sensor 504, the buried oxide layer is used to support the formation of the vertical interconnects in the field region. The buried oxide layer is partially removed to allow the formation of the vertical interconnects through the device layer, the buried oxide layer and the handle layer. In the sensor area of the pressure sensor, the buried oxide layer is used to form the static and dynamic structural components of the pressure sensor. In the sensor region of the pressure sensor, the buried oxide layer is used to support the static component of the pressure sensor. The buried oxide layer component 530 forms the anchor or support for a static component of the pressure sensor.

For the microphone 506, the buried oxide layer is used to support the formation of the vertical interconnects in the field region. The buried oxide layer is partially removed to allow the formation of the vertical interconnects through the device layer, the buried oxide layer and the handle layer. In the sensor area of the microphone, the buried oxide layer is used to form the static and dynamic structural components of the microphone. In the sensor region of the microphone, the buried oxide layer is used to support the static component of the microphone. The buried oxide layer component 533 forms the anchor or support for a static component of the microphone.

The active layer or device layer 517 as shown in FIG. 6 is the next structural layer used for the exemplary embodiment that is used for the implementation of the accelerometer, pressure sensor and microphone. The active layer is used for each sensor device in both the field region and the sensor region. The active layer is used for each sensor to implement both the static and dynamic structural components of the accelerometer, pressure sensor and microphone. In this exemplary embodiment, the active layer is a conductive layer and is formed of single crystal silicon and is doped with dopants such as phosphorus, antimony, arsenic, boron among others.

For the accelerometer 502, the active layer or device layer is used in both the field region and sensor region to implement the static and dynamic structural components of the accelerometer. In the field region, the active layer is used to support the vertical interconnects that are used to connect the electrodes of the accelerometer to the interface circuit attached to the other surface of the handle layer. In this exemplary embodiment, the active layer is used to support the vertical interconnects by removing a portion of the active layer to form vertical trenches and then refilling with an insulating layer and a conductive layer. The vertical trenches are formed using DRIE (Deep Reactive Ion Etching) to remove the active layer down to the buried oxide, removing a portion of the buried oxide using RIE (reactive ion etching), and removing a portion of the handle layer using DRIE (Deep Reactive Ion Etching). The sidewalls of the trenches are lined with an insulating layer such as silicon dioxide and then the trenches are filled using a conductive layer such as in-situ doped LPCVD polycrystalline silicon.

For the accelerometer 502, the active layer or device layer is used in the sensor region to form the static and dynamic structural components of the accelerometer. In this exemplary embodiment, the accelerometer uses capacitive transduction to convert the input acceleration into an equivalent electrical capacitance.

For the accelerometer, the structural component 544 is the dynamic component that moves under the influence of an input acceleration that is applied to the accelerometer. In this exemplary embodiment, the input acceleration is applied laterally to the sensor and as such the sensor acts as a lateral accelerometer. The dynamic structural component 544 consists of a portion of the active layer or device layer that is separated from the rest of the active or device layer by the trenches 671 and 672. In this exemplary embodiment, the dynamic structural component is suspended by a spring-like structure 574, which is connected at the other end to another portion of the active or device layer to form an anchor structure or support structure. The dynamic structural component 544 is formed above the handle layer and a region of the buried oxide is removed below the dynamic structural component 544. Thus, for the accelerometer, the portion of the active or device layer is used to form the dynamic structural component 544 that is connected to the spring suspension 574 which is connected at the other end to an anchor structure that is supported by another portion of the active or device layer. Since the buried oxide region below the portion of the active or device layer is removed, the dynamic structural component 544 is capable of motion under the influence of an input lateral acceleration. The portion of the active or device layer that is used to form the dynamic structural component may consist of proof mass, fingers, frames, blades, electrodes and the like that move under the influence of an input acceleration. The portion of the active layer or device layer that forms the dynamic structural component may also be used to form a suspension or spring structure for the accelerometer.

The active layer or device layer for the accelerometer may also be used for forming static structural components for the accelerometer. The static structural components of the accelerometer do not move in response to the input acceleration. These static structural components are supported by the handle layer with a partial or complete region of the buried oxide layer. In the exemplary embodiment, the active or device layer is used for formation of the static structural components 542, which are supported by the handle layer with buried oxide layer components 522, static component 543 supported by the handle layer with buried oxide component 523, static component 545 supported by the handle layer with buried oxide component 524, and static component 546 supported by the handle layer with buried oxide component 525. In this exemplary embodiment, the active or device layer is used to form a static structural component such as a finger, plate, blade and the like of the accelerometer. Similarly, the active or device layer is used to form another static structural component such as a finger, plate, blade and the like of the accelerometer. The static structural component 543 is anchored to the handle layer by a portion of the buried oxide layer 523 and similarly the static structural component 545 is anchored to the handle layer by a portion of the buried oxide layer 524.

In this exemplary component, the active device layer structural components 543, 544, and 545 are used to sense and transduce the input acceleration into an equivalent electrical parameter. In this embodiment, the transduction principle that is used is capacitive, meaning that the input acceleration is converted or transduced by the accelerometer into an equivalent capacitance. The capacitive transducer is formed by 543 and 545, which forms the two fixed plates of the capacitance, since they are anchored to the handle layer by the buried oxide regions 523 and 524 respectively. The dynamic structural component 544 forms the moving plate of the capacitance that is formed between the static structural components 543 and 545 that form the static or fixed plates of the capacitance. For convenience, the capacitance structure is assumed to be a parallel plate capacitance whose capacitance is determined by formula $C=\varepsilon A/d$ where $\varepsilon$ is the dielectric constant, A is the area of each plate and d is the gap spacing between the plates. The capacitance that is formed between 543 and 544 is defined by the spacing 671 between 543 and 544 and the area of overlap of the plates formed by 543 and 544 into the plane of the drawing. Similarly, the capacitance that is formed between 544 and 545 is defined by the spacing 672 between 544 and 545 and the area of overlap of the plates into the plane of the drawing. Thus, 543, 544 and 545 form two capacitances with 543 and 545 as the fixed plates or electrodes and 544 as the moving or dynamic plate or electrode.

When an input acceleration is applied to the accelerometer in a direction laterally, the dynamic plate moves under the input acceleration. In the exemplary device, if the input acceleration is applied from right to left in the plane of the sensor, the dynamic plate moves towards the fixed plate or electrode 543. Thus, the gap 671 between the static plate and the moving plate is decreased and the gap 672 between the static plate 543 and the moving plate 544 is increased by the same lateral distance. The decrease in the distance between the static plate 543 and the dynamic plate 544 means that the capacitance between 543 and 544 is increased. The increase in the distance between static plate 545 and the moving or dynamic plate 544 means that the capacitance between 544 and 545 is decreased. The change in capacitance between 543 and 544 or between 544 and 545 in the presence of the applied acceleration and from a condition of no acceleration is a measure of the applied acceleration. Thus the method of capacitance transduction is able to convert the applied acceleration into an equivalent electrical capacitance change. Thus, the dynamic and static structural components formed by the active or device layer are used for the formation of a capacitance transducer to convert the input mechanical acceleration to an equivalent electrical capacitance change. This change in the capacitance is used as the input for the interface circuit to which the accelerometer is connected.

For the pressure sensor 504, the active or device layer is used in structural components in both the field region and the sensor region to implement the static and dynamic structural components. In this exemplary embodiment, in the field region, the active layer is used to support the vertical interconnects that are used to connect the electrodes of the pressure sensor to the interface circuit connected to the other side of the handle layer. In this exemplary embodiment, the active layer is used to support the vertical interconnects by removing a portion of the active layer to form vertical trenches and then refilling with an insulating layer and a conductive layer. The vertical trenches are formed using DRIE (Deep Reactive Ion Etching) to remove the active layer down to the buried oxide, removing a portion of the buried oxide using RIE (reactive ion etching), and using a portion of the handle layer using DRIE (Deep Reactive Ion Etching). The sidewalls of the trenches are lined with an insulating layer such as silicon dioxide and then the trenches are filled using a conductive layer such as in-situ doped LPCVD polycrystalline silicon.

For the pressure sensor, the active layer or device layer is used in the sensor region to form a static structural component of the pressure sensor. In this exemplary embodiment, the pressure sensor uses capacitive transduction to convert the input pressure into an equivalent electrical capacitance. In this exemplary embodiment, the capacitive transduction is implemented using a static structural plate that serves as a reference electrode and forming another structural element that forms a diaphragm or membrane with a gap between the static plate and the whole structure enclosing a cavity that is sealed in vacuum. When a pressure is applied on the diaphragm, it deflects towards the static or reference plate, thereby changing the gap between the static plate and the diaphragm.

The diaphragm and the static reference plate form a capacitance where the area of overlap between the static plate and the diaphragm and the gap between the two determines the capacitance between the two. For ease of analysis, the capacitance between the static plate and the dynamic diaphragm is approximated by a parallel plate capacitance in which case, the capacitance is represented by the formula=$\varepsilon A/d$ where $\varepsilon$ is the dielectric constant, A is the area of each plate and d is the gap spacing between the plates. Thus, if the pressure applied on the diaphragm is increased, the diaphragm deflects more towards the static plate and the gap between the diaphragm and the static reference plate is decreased and the capacitance increases. If the pressure applied on the diaphragm is decreased, the diaphragm deflects less towards the static plate and the gap between the static reference plate and the diaphragm increases and the capacitance decreases. Thus, the change in the capacitance is representative of the change in the pressure applied to the diaphragm. This change in the capacitance is converted to an equivalent electrical parameter that represents the change in the pressure that is being measured. Thus the method of capacitance transduction is able to convert the applied pressure into an equivalent electrical capacitance change. Thus, the static structural component formed by the active or device layer is used for the formation of a capacitance transducer to convert the input mechanical pressure to an equivalent electrical capacitance change.

In the exemplary embodiment, the portion of the active or device layer 550, is used as a static structural component of the pressure sensor using capacitance transduction. The static structural component formed by the portion of the active layer 550, is supported by the portion of the buried oxide layer 529 that is attached to the handle layer 600.

For the microphone 506, the active or device layer is used in structural components in both the field region and the sensor region to implement the static and dynamic structural components. In this exemplary embodiment, in the field region, the active layer is used to support the vertical interconnects that are used to connect the electrodes of the microphone to the interface circuit connected to the other side of the handle layer. In this exemplary embodiment, the active layer is used to support the vertical interconnects by removing a portion of the active layer to form vertical trenches and then refilling with an insulating layer and a conductive layer. The vertical trenches are formed using DRIE (Deep Reactive Ion Etching) to remove the active layer down to the buried oxide, removing a portion of the buried oxide using RIE (reactive ion etching), and using a portion of the handle layer using DRIE (Deep Reactive Ion Etching). The sidewalls of the trenches are lined with an insulating layer such as silicon dioxide and then the trenches are filled using a conductive layer such as in-situ doped LPCVD polycrystalline silicon.

For the microphone 506, the active layer or device layer is used in the sensor region to form a static structural component of the microphone. In this exemplary embodiment, the microphone uses capacitive transduction to convert the input acoustic or audio waves into an equivalent electrical capacitance. In this exemplary embodiment, the capacitive transduction is implemented using a static structural plate that serves as a reference electrode and forming another structural element that forms a membrane with a gap between the static plate and the whole structure enclosing a cavity. When sound waves impinge on the membrane, pressure is applied on the membrane, it vibrates and deflects with references to the static or reference plate, thereby changing the gap between the static plate and the membrane.

The membrane and the static reference plate form a capacitance where the area of overlap between the static plate and the membrane and the gap between the two determines the capacitance between the two. For ease of analysis, the capacitance between the static plate and the dynamic membrane is approximated by a parallel plate capacitance in which case, the capacitance is represented by the formula $C=\varepsilon A/d$ where $\varepsilon$ is the dielectric constant, A is the area of each plate and d is the gap spacing between the plates. Thus, if the acoustic pressure due to an impinging sound wave applied on the diaphragm is increased, the membrane deflects more towards the static plate and the gap between the membrane and the static reference plate is decreased and the capacitance increases. If the acoustic pressure applied on the membrane is decreased, the membrane deflects less towards the static plate and the gap between the static reference plate and the membrane increases and the capacitance decreases. Thus, the change in the capacitance is representative of the change in the pressure applied to the membrane by the impinging sound wave. This change in the capacitance is converted to an equivalent electrical parameter that represents the change in the acoustic pressure that is being applied by the impinging sound wave. Thus the method of capacitance transduction is able to convert the applied sound wave into an equivalent electrical capacitance change. Thus, the static structural component formed by the active or device layer is used for the formation of a capacitance transducer to convert the input sound wave to an equivalent electrical capacitance change.

In the exemplary embodiment, the portion of the active or device layer 554, is used as a static structural component of the microphone using capacitance transduction. The static structural component formed by the portion of the active layer 554, is supported by the portion of the buried oxide layer 610n that is attached to the handle layer 600.

In this exemplary embodiment, the active or device layer is used in the different sensors for formation of different structural components that enable the formation of static and dynamic structural components of the accelerometer 502, pressure sensor 504, and microphone 506. For each sensor, the active or device layer is used to support the formation of the vertical interconnects to connect each sensor to an interface circuit. Thus, vertical interconnects are used to connect the accelerometer, pressure sensor and microphone to the opposite side of the handle layer to an interface circuit. The active or device layer is used to form the static electrode 543 and 545 of the accelerometer, the dynamic structural component 544 such as the proof mass, sensing finger, suspension string, the anchor or static support for the dynamic components, the motion limiting stops for the dynamic structural components. The same active or device layer is used to form a portion of the static or reference electrode 550 of the pressure sensor and the static or reference electrode 554 of the microphone. It will be evident to those skilled in the arts that the active or device layer can be used for implementing for the static and dynamic structural components of different sensors that respond to different input stimulus.

The nitride layer 565 is another layer used in the exemplary embodiment of implementation of the accelerometer 502, pressure sensor 504 and microphone 506 using parallel design and fabrication technology and method. The nitride layer is used in both the field region and sensor region for the implementation of the accelerometer 502, pressure sensor 504 and microphone 506. In the field region, the nitride layer 565 is used to protect and support the vertical interconnects as well as to provide electrical isolation for the static and dynamic structural components of the accelerometer 502, pressure sensor 504 and microphone 506.

In the exemplary embodiment, the nitride layer 565 is used to support and protect the vertical interconnects in the field region and to provide mechanical support and electrical isolation for the static and dynamic structural components in the sensor region.

In the field region for the accelerometer, the nitride layer is used to protect the vertical interconnects 650, 651 and 652 that are used to connect the electrodes of the accelerometer to the interface circuit that is attached to the opposite surface of the handle layer. Since the vertical interconnects are formed by a lining of insulating layer such as silicon dioxide that encloses a layer of conducting material such as doped polycrystalline silicon, it is essential to protect the silicon dioxide layer from fabrication steps that uses chemicals such as HF or BHF in the formation of the accelerometer. The nitride layer must be removed over the conducting layer forming the vertical interconnect so that it can be connected to the different electrodes of the sensor. In the field region for each vertical interconnect, the nitride layer is removed so that it covers the top surface of the active layer in the field region and the edges of the silicon oxide liner is not exposed to the chemicals such as HF or BHF. The nitride layer is also used to support the static structural components of the accelerometer to provide an anchor and also electrically isolation. The static structural component of the accelerometer that is supported by the nitride layer in the field region is the cap 593, which is formed to protect the static and dynamic structural components from the assembly and packaging processes. The cap structure is anchored or supported by the nitride layer 560 and 561 to provide mechanical support. Thus, 560 and 561 are used in the field regions of the accelerometer to provide isolation and protect the vertical interconnects 650, 651 and 652.

The nitride structural layer 565 can also be used in the accelerometer in the sensor region to form and support the static and dynamic structural components. The nitride layer may be patterned on top of the static or dynamic structural components formed by the active or device layer, and can provide mechanical support or electrical isolation. The nitride layer may be used in the sensor region for the formation of pillars, posts, walls and the like to provide mechanical support for the cap structure.

For the pressure sensor 504, the nitride layer represented by 561 is used in the field region and the sensor region to form and support the static and dynamic structural components of the sensor.

In the field regions 510 and 512 for the pressure sensor as shown in FIG. 5A, the nitride layer is used to protect the vertical interconnects that are used to connect the electrodes of the pressure sensor to the interface circuit that is attached to the opposite surface of the handle layer. Since the vertical interconnects are formed by a lining of insulating layer such as silicon dioxide that encloses a layer of conducting material such as doped polycrystalline silicon, it is essential to protect the silicon dioxide layer from fabrication steps that uses chemicals such as HF or BHF in the formation of the accelerometer. The nitride layer must be removed over the conducting layer forming the vertical interconnect so that it can be connected to the different electrodes of the sensor. In the field region for each vertical interconnect, the nitride layer is removed so that it covers the top surface of the active layer in the field region and the edges of the silicon oxide liner is not exposed to the chemicals such as HF or BHF. The nitride layer is also used to support the dynamic structural component of the pressure sensor to provide an anchor and also electrically isolation. The dynamic structural component of the pressure sensor that is supported by the nitride layer in the field region is the diaphragm 599, which is formed to sense the pressure by deflection. The diaphragm is anchored or supported by the nitride layer 561 and 562 to provide mechanical support and electrical isolation. Thus, 561 and 562 are used in the field regions of the pressure sensor to provide isolation and protect the vertical interconnects 653 and 654.

The nitride structural layer 565 can also be used in the pressure sensor in the sensor region to form and support the static and dynamic structural components. The nitride layer may be patterned on top of the static or dynamic structural components formed by the active or device layer, and can provide mechanical support or electrical isolation. The nitride layer may be used in the sensor region for the formation of pillars or posts to provide mechanical support for the static and dynamic structural components.

For the microphone 506, the nitride layer is used in the field region and the sensor region to form and support the static and dynamic structural components of the sensor.

In the field regions 513 and 515 as shown in FIG. 5A, for the microphone 506, the nitride layer is used to protect the vertical interconnects that are used to connect the electrodes of the microphone to the interface circuit that is attached to the opposite surface of the handle layer. Since the vertical interconnects are formed by a lining of insulating layer such as silicon dioxide that encloses a layer of conducting material such as doped polycrystalline silicon, it is essential to protect the silicon dioxide layer from fabrication steps that uses chemicals such as HF or BHF in the formation of the accelerometer. The nitride layer must be removed over the conducting layer forming the vertical interconnect so that it can be connected to the different electrodes of the sensor. In the field region for each vertical interconnect, the nitride layer is removed so that it covers the top surface of the active layer in the field region and the edges of the silicon oxide liner is not exposed to the chemicals such as HF or BHF. The nitride layer is also used to support the dynamic structural component of the microphone to provide an anchor and also electrically provide electrical isolation. The dynamic structural component of the microphone that is supported by the nitride layer in the field region is the membrane 605, which is formed to sense the acoustic pressure by deflection. The membrane is anchored or supported by the nitride layer 562 and 563 to provide mechanical support and electrical isolation. Thus, 562 and 563 are used in the field regions of the microphone to provide isolation and protect the vertical interconnects 655 and 656.

The nitride structural layer can also be used in the microphone in the sensor region to form and support the static and dynamic structural components. The nitride layer may be patterned on top of the static or dynamic structural components formed by the active or device layer, and can provide mechanical support or electrical isolation. The nitride layer may be used in the sensor region for the formation of pillars or posts to provide mechanical support for the static and dynamic structural components.

A polycrystalline silicon or polysilicon layer 660 is another structural layer used in the implementation of the multiple sensors that are co-designed and use a parallel fabrication process. In the exemplary embodiment 500, the polysilicon layer is used in both the field region and sensor region of the accelerometer 502, pressure sensor 504 and microphone 506 and for the implementation of static and dynamic structural components for the accelerometer 502, pressure sensor 504 and microphone 506. The polysilicon layer 660 is a conductive layer and is doped with dopants such as phosphorus, arsenic, antimony, boron and the like. The doping of the polysilicon layer may be in-situ (as it is being deposited), ion-implantation followed by an anneal to distribute the dopants, with a solid state doping source followed by an anneal to distribute the dopants and other methods to dope polysilicon layers.

In the exemplary embodiment, the polysilicon layer 660 is used in the field region and sensor region for the implementation of static and dynamic structural components of the accelerometer 502. In the field regions 507 and 509, the polysilicon structural layer is used to form the interconnects from the electrodes of the sensor in the sensor region to the vertical interconnects which connect the sensor electrodes to the interface circuit that is attached to the opposite surface of the handle layer. The structural layer 660 is used to form the bridge structural components 571 and 575 that connect the static and dynamic structural components of the accelerometer. The bridge structure 571 connects the static structural component 543 to the vertical interconnect 651 in the field region. The bridge structure 575 connects the dynamic structural component 544 to the vertical interconnect 652 in the field region. In the field region, the polysilicon structural layer may also contain a structural component that is supported on the nitride structural layer and connected to a bridge structural component at one end and to the vertical interconnect 651 and 652 at the other end. Thus, the polysilicon structural layer may serve as a planar interconnect between the bridge structural component 571 and the vertical interconnect structure 651.

In the sensor region of the accelerometer 502, in the exemplary embodiment, the polysilicon structural layer 660 is used for the formation of static and dynamic structural components of the accelerometer. In the sensor region, the polysilicon structural component 575 is used to serve to form a bridge structure to connect the dynamic structural component 544 to the vertical interconnect 652. This structural component 574 also forms a part of the dynamic structural component of the accelerometer by providing a suspension or spring using 574 for the dynamic structural component of the accelerometer. The dynamic structural component of the accelerometer is able to move under the influence of the input acceleration force and can constitute the proof mass, fingers for sensing, plate structures, suspension spring. The polysilicon structural layer is used to form the suspension spring 574 which also serves as a bridge to connect the dynamic structural component of the accelerometer to the vertical interconnect. The part of the suspension spring 573 and 576 that is connected to the vertical interconnect also serves as the anchor or support for the dynamic structural component of the accelerometer.

In the sensor region of the accelerometer 502, in the exemplary embodiment, the polysilicon structural layer is used to connect the static structural components to the vertical interconnects. The polysilicon layer may also be used to connect different static structural components by using a bridge structure, and which are at the same electrical potential. In the sensor region, the polysilicon structural layer is used to form a bridge between the static structural component 543 and the vertical interconnect 651. The polysilicon structural layer 660 may also be used to form part of the static structural component of the accelerometer by forming fingers or plates that serve as reference electrodes of the accelerometer 502.

In the sensor region, the polysilicon structural layer may also be used as a motion stop to prevent excessive motion of the dynamic structural component of the accelerometer under the input acceleration. The polysilicon layer may be used in the static and dynamic structural components of the motion limiting stop structure of the accelerometer.

In the sensor region, the polysilicon structural layer may also be used for formation of pillars, posts, walls and the like to support the protective cap that is formed in subsequent steps in the fabrication of the accelerometer. These pillars, posts, walls are formed with static structural components of the accelerometer and enable the cap structure to protect the static and dynamic structural components of the accelerometer from the effects of assembly and packaging.

In the exemplary embodiment, the polysilicon structural layer is used in the pressure sensor 504 in both the field region and region for formation of both the static and dynamic structural components.

In the field regions 510 and 512, the polysilicon structural layer 660 is used to form the interconnects from the electrodes of the sensor in the sensor region to the vertical interconnects which connect the sensor electrodes to the interface circuit that is attached to the opposite surface of the handle layer. The structural layer 660 is used to form the bridge structural components that connect the static and dynamic structural components of the pressure sensor. The bridge structure 577 and 578 connects the static structural component 580 to the vertical interconnect 654 in the field region. In the field region, the polysilicon structural layer may also contain a structural component that is supported on the nitride structural layer and connected to a bridge structural component at one end and to the vertical interconnect 654 at the other end. Thus, the polysilicon structural layer may serve as a planar interconnect between the bridge structural component 580 and the vertical interconnect structure 654.

In the sensor region of the pressure sensor 504, in the exemplary embodiment, the polysilicon structural layer 660 is used for the formation of static and dynamic structural components of the pressure sensor. In the sensor region, the polysilicon structural component 580 along with 578 is used to serve to form a bridge structure to connect the static structural component to the vertical interconnect 654. The polysilicon structural layer is used to form the static structural component 580 that forms the static or fixed or reference plate of the pressure sensor. This static or fixed reference plate is attached to the underlying active layer or device layer by a number of posts or pillars 579, 581, and 582. This static or fixed reference plate is also connected to the bridge structure formed by the polysilicon structural layer to the field region so that it is connected to the vertical interconnect 654. The static structural component 580 that forms the fixed or reference plate of the pressure sensor may be connected electrically to the underlying component of the device or active layer if the nitride structural layer is removed and the anchors 579, 581 and 582 attach directly to the static structural component 550 formed by the device or active layer. In this present embodiment, the static or reference plate formed by the polysilicon structural layer 580 is attached by a number of pillars or posts 579, 581 and 582 to the static structural component formed by the device layer. Thus, the two static components 580 and 550 are both electrically and mechanically connected and together form the static or reference plate or electrode of the pressure sensor.

In another embodiment, the fixed or reference plate formed by the polysilicon structural layer may be isolated from the underlying static structural component formed by the active or device layer. In this embodiment, the nitride structural layer is not removed between the pillars or posts formed by the polysilicon structural layer and the underlying device or active layer. In this embodiment, the static structural component 580 formed by the polysilicon structural layer is mechanically connected to the underlying static structural component 550 formed by the active or device layer but electrically isolated from it due to the presence of the intermediate nitride structural layer.

In yet another embodiment, the static or reference plate formed by the polysilicon structural layer may be attached directly to the underlying static structural component formed by the active or device structural layer, without any pillars or posts. In this embodiment, the static or reference plate of the pressure sensor is formed on the surface of the static component formed by the active or device layer. If the intermediate nitride structural layer is removed between the polysilicon structural component 580 and the static component formed by the active or device layer 550, the two static components 580 and 550 are both electrically and mechanically connected and together form the static or reference plate or electrode of the pressure sensor. If the intermediate nitride structural layer is present between the polysilicon structural component 580 and the static component formed by the active or device layer 550, the two static components 580 and 550 are mechanically connected but electrically isolated and only polysilicon static structural component 580 forms the static or reference plate or electrode of the pressure sensor.

In the exemplary embodiment, the polysilicon structural layer is used in the microphone 506 in both the field region and region for formation of both the static and dynamic structural components.

In the field regions 513 and 515, the polysilicon structural layer is used to form the interconnects from the electrodes of the sensor in the sensor region to the vertical interconnects which connect the sensor electrodes to the interface circuit that is attached to the opposite surface of the handle layer. The structural layer 660 is used to form the bridge structural components that connect the static and dynamic structural components of the microphone. The bridge structure 584 connects the static structural component 586 to the vertical interconnect 656 using 583 in the field region. In the field region, the polysilicon structural layer may also contain a structural component that is supported on the nitride structural layer and connected to a bridge structural component at one end and to the vertical interconnect 656 at the other end. Thus, the polysilicon structural layer may serve as a planar interconnect between the bridge structural component 586 and the vertical interconnect structure 656.

In the sensor region 514 of the microphone 506, in the exemplary embodiment, the polysilicon structural layer 660 is used for the formation of static and dynamic structural components of the microphone. In the sensor region, the polysilicon structural component 586 is used to serve to form a bridge structure using 584 to connect the static structural component to the vertical interconnect 656. The polysilicon structural layer is used to form the static structural component 586 that forms the static or fixed or reference plate of the microphone. This static or fixed reference plate 586 is attached to the underlying active layer or device layer by a number of posts or pillars 585, 587, and 588. This static or fixed reference plate is also connected to the bridge structure formed by the polysilicon structural layer to the field region so that it is connected to the vertical interconnect 656. The static structural component 586 that forms the fixed or reference plate of the microphone may be connected electrically to the underlying component of the device or active layer 554 if the nitride structural layer is removed and the anchors 585, 587 and 588 attach directly to the static structural component 554 formed by the device or active layer. In this present embodiment, the static or reference plate formed by the polysilicon structural layer is attached by a number of pillars or posts to the static structural component formed by the device layer. Thus, the two static components 586 and 554 are both electrically and mechanically connected and together form the static or reference plate or electrode of the microphone.

In another embodiment, the fixed or reference plate formed by the polysilicon structural layer may be isolated from the underlying static structural component formed by the active or device layer. In this embodiment, the nitride structural layer is not removed between the pillars or posts formed by the polysilicon structural layer and the underlying device or active layer. In this embodiment, the static structural component 586 formed by the polysilicon structural layer is mechanically connected to the underlying static structural component 554 formed by the active or device layer but electrically isolated from it due to the presence of the intermediate nitride structural layer.

In yet another embodiment, the static or reference plate formed by the polysilicon structural layer may be attached directly to the underlying static structural component formed by the active or device structural layer, without any pillars or posts. In this embodiment, the static or reference plate of the microphone is formed on the surface of the static component formed by the active or device layer. If the intermediate nitride structural layer is removed between the polysilicon structural component 586 and the static component formed by the active or device layer 554, the two static components 586 and 554 are both electrically and mechanically connected and together form the static or reference plate or electrode of the microphone. If the intermediate nitride structural layer is present between the polysilicon structural component 586 and the static component formed by the active or device layer 554, the two static components 586 and 554 are mechanically connected but electrically isolated and only polysilicon static structural component 586 forms the static or reference plate or electrode of the microphone.

The polysilicon structural layer 661 is another layer used for the implementation of the exemplary embodiment using parallel design methodology for the device 500 with co-designed accelerometer 502, pressure sensor 504 and microphone 506. This polysilicon structural layer is used in both the field region and sensor region for the formation of static and dynamic structural components of the accelerometer 502, pressure sensor 504 and microphone 506. The polysilicon layer 661 is a conductive layer and is doped with dopants such as phosphorus, arsenic, antimony, boron and the like. The doping of the polysilicon layer may be in-situ (as it is being deposited), ion-implantation followed by an anneal to distribute the dopants, with a solid state doping source followed by an anneal to distribute the dopants and other methods to dope polysilicon layers.

In the accelerometer 502, the polysilicon structural layer 661 is used in the field region 507 and 509 and sensor region 508 for the formation of static and dynamic structural components.

In the field region of the accelerometer 507 and 509, the polysilicon structural layer 661 is used to form the anchor or support of the cap structure of the accelerometer. The cap structure is supported on the nitride structural layer by the anchor or support components formed in the field region 590 and 595. The polysilicon structural layer 661 is also used, in the exemplary embodiment, to connect the cap structure to the vertical interconnect that is used to connect the cap structure to an electrode of the interface circuit that is attached to the other side of the handle layer. Thus, the polysilicon structural layer 661 is used to form a contact to the vertical interconnect 651. In another embodiment, the structural layer 661 may be used to form a planar interconnect structure that is supported on the nitride structural layer 750 and connects the cap structure to the vertical interconnect 651.

In the sensor region of the accelerometer 502, the polysilicon structural layer 661 is used to form a cap structure 593 that is formed on top of static and dynamic structural components of the accelerometer. Since the accelerometer contains dynamic structural components that move under the influence of an input acceleration and contains small gaps that enable the dynamic structural components such as the proof mass, fingers, spring suspension to move and also contains static structural components such as fingers or plates that form capacitances where one plate (the dynamic structural components) moves relative to another plate (the static structural components), it is necessary to protect these static and dynamic structural components of the accelerometer from the deleterious effects of assembly and packaging. When the fabrication process of the device 500 is completed, it is prepared for attaching to the interface circuit and then further for assembly in a package. These processes require that the device 500 be able to withstand such processes such as wafer thinning (grinding, etching), sawing (where the wafer is singulated to individual die), die bond (where the die is bonded to the interface circuit), die attach (where the die is attached to a package), rinsing (with water and other chemicals). These processes can cause generation of particles that can lodge in the small gaps between the static and dynamic structural components of the sensors formed by device 500. These processes may also cause the liquids (water and other chemicals) to which the static and dynamic structural components are exposed to generate various surface forces causing surface tension, adhesion, van der Waals forces causing the sensor to fail due to phenomena such as stiction, corrosion etc.

The polysilicon structural layer 661 is used to form a protective cap structure that surrounds all the static and dynamic structural components of the accelerometer 502, and prevents the exposure of the small gaps between the static and dynamic structural components of the accelerometer to the assembly and packaging processes. Thus, the polysilicon structural layer is used to form the protective cap structure 593 over the static and dynamic structural components of the accelerometer. Thus, in the sensor region of the accelerometer 508, the polysilicon layer 661 is used to form the cap structural component 593 that serves to protect the static and dynamic structural components of the accelerometer. The cap structural component 593 is a static component that does not move relative to the static or dynamic structural component of the sensor region of the accelerometer.

In the sensor region, the cap structural component 593 formed by the polysilicon structural layer 661 can also be used to form pillars, post, walls and the like to increase the mechanical strength and resistance to the assembly and packaging processes. Thus, while the cap structure 593 is supported by the anchor region in the periphery, it can be used in the sensor region to form pillars, posts and walls to improve the mechanical strength of the cap structure. These static structural components such as pillars, posts and walls are formed on top of other static components of the accelerometer which as supported by the polysilicon structural layer, nitride structural layer, active layer, buried oxide layer, handle layer.

In the sensor region of the accelerometer 502, the polysilicon structural layer can also be used in the cap structural component to act as a motion stop for the dynamic structural component of the accelerometer. Thus, the cap structural component 593 may also serve to limit the motion of the dynamic structural components of the accelerometer under an excessive input acceleration or shock.

The polysilicon structural layer 661 may also be used to form etch holes 592 and 594 in the accelerometer 502. These are openings in the cap structural component 593 and can be formed in both the field region and the sensor region. The polysilicon structural layer is removed in the cap structural component so as to provide access to the sacrificial oxide structural layers (not shown in FIG. 5). In this exemplary embodiment, the polysilicon structural layer is removed to form the etch holes 592 and 594 in the field region. In another embodiment, the etch holes in the polysilicon structural layer 661 can be formed in the sensor region. These etch holes in the polysilicon cap structural component are then sealed using another structural layer to form a sealed cavity.

In the pressure sensor 504, the polysilicon structural layer 661 is used in the field region 510 and 512 and sensor region 511 for the formation of static and dynamic structural components.

In the field regions 510 and 512 of the pressure sensor 504, the polysilicon structural layer 661 is used to form the anchor or support of the pressure sensor diaphragm. The diaphragm is supported on the nitride structural layer by the anchor or support components 597 and 601 formed in the field region. The polysilicon structural layer 661 is also used, in the exemplary embodiment, to connect the diaphragm to the vertical interconnect that is used to connect the diaphragm to an electrode of the interface circuit that is attached to the other side of the handle layer. Thus, the polysilicon structural layer 661 is used to form a contact 597 to the vertical interconnect 653. In another embodiment, the structural layer 661 may be used to form a planar interconnect structure that is supported on the nitride structural layer 561 and connects the diaphragm to the vertical interconnect 653.

In the sensor region 511 of the pressure sensor 504, the polysilicon structural layer 661 is used to form the dynamic structural component of the pressure sensor. This dynamic structural component of the pressure sensor is the diaphragm 599 that responds to the ambient pressure applied by the fluid in contact with the diaphragm. The polysilicon structural layer 661 is used to form the diaphragm 599 of the pressure sensor that moves under an applied pressure by being supported by an anchor region that contacts the underlying nitride structural layer in its periphery and then forming a gap from the static or reference structural component 580 and 550 of the pressure sensor which encloses a cavity that is sealed in vacuum. Thus, the diaphragm 599 of the pressure sensor encloses a cavity that is at a pressure lower than atmospheric pressure (range). Thus, the pressure inside the cavity provides a reference pressure applied to one side of the pressure sensing diaphragm.

Since the side of the pressure sensor diaphragm that encloses the static or reference plate of the pressure sensor is at a low pressure (vacuum), and the opposite side of the pressure sensor diaphragm is at the ambient pressure, the difference of the pressure applied on the pressure sensor diaphragm can cause the deflection of the diaphragm. The amount of deflection of the pressure sensor diaphragm is governed by material properties and geometrical dimensions of the pressure sensor diaphragm. The deflection is dependent on the thickness of the polysilicon structural layer 661, the geometric dimensions of the pressure sensor diaphragm, the material properties of the polysilicon structural layer such as modulus of elasticity, Poisson's ratio etc. The pressure sensor diaphragm may have different shapes depending on the design and the application for which the pressure sensor is intended to be used. The pressure sensor may be circular, square, rectangular, octagonal etc. in shape. In the exemplary embodiment, the shape of the diaphragm is assumed to be circular. In this case, the size (radius) is chosen to have a maximum deflection for the range of pressure that is to be measured by the pressure sensor.

In the sensor region of the pressure sensor, the polysilicon structural layer 661 thus is used to form the diaphragm, the dynamic structural component 599. The pressure sensor in this exemplary embodiment uses capacitance transduction to convert the pressure being measured into an equivalent electrical parameter. In this exemplary embodiment, the dynamic structural component which is the diaphragm is separate by a small gap from the static structural component or the reference plate or electrode 580 and 550 formed by the polysilicon structural layer and the active or device structural layer. Thus, the diaphragm 599 forms a plate of a capacitance that is capable of movement (deflection) under the influence of an applied pressure. The structural component 580 and 550 forms the static or reference plate of the capacitance formed with the diaphragm. For ease of analysis, the capacitance is considered to be a parallel plate capacitance with the diaphragm forming one plate or electrode of the capacitance and the reference or static plate forming the other plate or electrode of the parallel plate capacitance. The capacitance is defined by the formula $C=\varepsilon A/d$ where $\varepsilon$ is the dielectric constant, A is the area of each plate and d is the gap spacing between the plates. When the dynamic component of the pressure sensor, which is the diaphragm, moves down (deflects down towards the reference plate) due to an increase in the ambient pressure, the gap between the diaphragm and the static reference plate is decreased and the capacitance is increased. The change in the capacitance is equivalent to the change in the pressure applied to the diaphragm from an equilibrium value or reference pressure. If the pressure applied on the diaphragm (which is the dynamic component) is decreased, the diaphragm moves up (deflects away from the reference plate) and the gap between the diaphragm and the reference plate is increased. The increase in the gap between the diaphragm and the static or reference plate decreases the capacitance and the change in capacitance is equivalent to the change in the pressure applied to the diaphragm from an equilibrium value or reference pressure. Other methods of transduction may also be used to convert the deflection of the diaphragm to an equivalent electrical signal. These other transduction methods may be piezoresisitive, piezoelectric, resonant, optical, magnetic, electromagnetic and the like.

The polysilicon structural layer 661 may also be used to form etch holes 598 and 600 in the pressure sensor 504. These are openings in the diaphragm structural component 599 and can be formed in both the field region and the sensor region. The polysilicon structural layer is removed in the diaphragm structural component so as to provide access to the sacrificial oxide structural layers (not shown in FIG. 5). In this exemplary embodiment, the polysilicon structural layer is removed to form the etch holes 598 and 600 in the field region. In another embodiment, the etch holes in the polysilicon structural layer 599 can be formed in the sensor region. These etch holes in the diaphragm structural component are then sealed using another structural layer to form a sealed cavity that encloses a vacuum.

In the microphone 506, the polysilicon structural layer is used in the field region 513 and 515 and sensor region 514 for the formation of static and dynamic structural components.

In the field region 513 and 515 of the microphone 506, the polysilicon structural layer 661 is used to form the anchor or support of the microphone membrane. The membrane is supported on the nitride structural layer by the anchor or support components 602 and 607 formed in the field region. The polysilicon structural layer 661 is also used, in the exemplary embodiment, to connect the membrane to the vertical interconnect that is used to connect the membrane to an electrode of the interface circuit that is attached to the other side of the handle layer. Thus, the polysilicon structural layer 661 is used to form a contact 603 to the vertical interconnect 655. In another embodiment, the structural layer 661 may be used to form a planar interconnect structure that is supported on the nitride structural layer 562 and connects the diaphragm to the vertical interconnect 655.

In the sensor region 514 of the microphone 506, the polysilicon structural layer 661 is used to form the dynamic structural component of the membrane. This dynamic structural component of the microphone is the membrane 605 that responds to the sound waves that exert pressure on the membrane. The polysilicon structural layer 661 is used to form the membrane 605 of the membrane that moves under the impinging sound waves by being supported by an anchor region that contacts the underlying nitride structural layer in its periphery and then forming a gap from the static or reference structural component 12 of the membrane which encloses a cavity that is exposed to the ambient pressure. Thus, the membrane 605 of the microphone encloses a cavity that is at a pressure same as the ambient pressure.

The amount of deflection of the microphone membrane is governed by material properties and geometrical dimensions of the microphone membrane. The deflection is dependent on the thickness of the polysilicon structural layer 661, the geometric dimensions of the microphone membrane, the material properties of the polysilicon structural layer such as modulus of elasticity, Poisson's ratio etc. The microphone membrane may have different shapes depending on the design and the application for which the microphone is intended to be used. The microphone membrane may be circular, square, rectangular, octagonal etc. in shape. In the exemplary embodiment, the shape of the membrane is assumed to be circular. In this case, the size (radius) is chosen to have a maximum deflection at the center of the membrane and the range of frequencies to be detected by the microphone.

In the sensor region of the microphone, the polysilicon structural layer 661 thus is used to form the membrane, the dynamic structural component 605. The microphone in this exemplary embodiment uses capacitance transduction to convert the sound waves being measured into an equivalent electrical parameter. In this exemplary embodiment, the dynamic structural component which is the membrane is separate by a small gap from the static structural component or the reference plate or electrode 586 and 554 formed by the polysilicon structural layer and the active or device structural layer. Thus, the membrane 605 forms a plate of a capacitance that is capable of movement (deflection) under the influence of an applied sound wave. The structural component 586 and 554 forms the static or reference plate of the capacitance formed with the membrane. For ease of analysis, the capacitance is considered to be a parallel plate capacitance with the membrane forming one plate or electrode of the capacitance and the reference or static plate forming the other plate or electrode of the parallel plate capacitance. The capacitance is defined by the formula $C=sA/d$ where c is the dielectric constant, A is the area of each plate and d is the gap spacing between the plates. When the dynamic component of the microphone, which is the membrane, moves down (deflects down towards the reference plate) due to an increase in the ambient pressure applied by the sound wave, the gap between the diaphragm and the static reference plate is decreased and the capacitance is increased. The change in the capacitance is equivalent to the change in the acoustic pressure applied to the membrane from an equilibrium value. If the pressure applied on the membrane (which is the dynamic component) is decreased, the membrane moves up (deflects away from the reference plate) and the gap between the diaphragm and the reference plate is increased. The increase in the gap between the diaphragm and the static or reference plate decreases the capacitance and the change in capacitance is equivalent to the change in the pressure applied to the membrane from an equilibrium value. Thus, the membrane and the static or reference plate forms a capacitance transducer that converts the incident acoustic or sound waves into an equivalent capacitance. Other methods of transduction may also be used to convert the deflection of the membrane to an equivalent electrical signal. These other transduction methods may be piezoresisitive, piezoelectric, magnetic, electromagnetic, resonant, optical and the like.

The polysilicon structural layer 661 may also be used to form etch holes 604 and 606 in the microphone 506. These are openings in the diaphragm structural component 605 and can be formed in both the field region and the sensor region. The polysilicon structural layer is removed in the membrane structural component so as to provide access to the sacrificial oxide structural layers (not shown in FIG. 5B). In this exemplary embodiment, the polysilicon structural layer is removed to form the etch holes 604 and 606 in the field region. In another embodiment, the etch holes in the polysilicon structural layer 661 can be formed in the sensor region. These etch holes in the diaphragm structural component enables the membrane to vibrate in response to the incident acoustic or sound waves.

The layer used in 611 is another layer used for the structural components of the device 500. In this exemplary embodiment, layer used in 611 is an APCVD oxide. It is an insulator and is deposited in a non-conformal manner. Layer used in 611 is used in the accelerometer 502, pressure sensor 504 and microphone 506, for the implementation of the static and dynamic structural components of the sensors in both the field region and the sensor region.

In the accelerometer 502, the layer used in 611 is used in the field area to provide a seal for the etch holes 592 and 594 in the field region and provide mechanical support for the cap structural component 611 in the sensor region. In the field region of the accelerometer, the layer forms a seal over the etch holes so that the atmosphere in the cavity enclosed by the cap structure is fixed and does not allow the external atmosphere from affecting the performance of the accelerometer. The non-conformal deposition of the layer ensures that the etch holes 592 and 594 are sealed by layer 661, which acts as a plug 610 and 612 for the etch holes 592 and 594.

In the sensor area of the accelerometer, the layer forms a continuous layer 611 over the cap structural component to provide mechanical support to the cap structure 615. By increasing the combined thickness of the cap structure 593 and 611, the mechanical strength of the cap is increased so that it does not exhibit deflection due to the ambient pressure applied on the cap structure. Since the mechanical strength of a plate increases by a cube of its thickness, by increasing the thickness of the layers used for the cap structure, the mechanical strength is increased non-linearly. The sealing of the cavity under the cap by the sealing plugs 610 and 612 and the mechanical strength from the cap and sealing layers ensures that the cavity under the cap is at a fixed volume.

In the pressure sensor 504, the layer used in 611 can be used in the field and sensor regions for the implementation of the static and dynamic structural components. In the exemplary embodiment shown in FIG. 5B, layer 611 is not used in the field and sensor regions of the pressure sensor 504. In other embodiments, the layer 611 may be used for forming a bossed diaphragm to improve the linearity of the pressure sensor.

In the microphone 506, the layer used in 611 can be used in the field and sensor regions for the implementation of the static and dynamic structural components. In the exemplary embodiment shown in FIG. 5B, layer used in 611 is not used in the field and sensor regions of the microphone 506.

The layer used in 615 is another layer used for the structural components of the device 500. In this exemplary embodiment, layer used in 615 is a LPCVD silicon nitride. It is an insulator and is deposited in a conformal manner. Layer used in 615 is used in the accelerometer 502, pressure sensor 504 and microphone 506, for the implementation of the static and dynamic structural components of the sensors in both the field region and the sensor region.

In the accelerometer 502, the layer used in 615 is used in the field area to provide a seal for the seal layer 611 in the field region and provide mechanical support for the cap structural component 593 in the sensor region. In the field region of the accelerometer, the layer forms a seal over the sealing layer 611 so that the atmosphere in the cavity enclosed by the cap structure is fixed and does not allow the external atmosphere from affecting the performance of the accelerometer. The conformal deposition of the layer 615 ensures that the etch holes 592 and 594 are sealed by layer 615, which acts as a plug for the etch holes. In the field region of accelerometer 502, the layer 615 extends beyond the seal layer 611 and provides protection during subsequent fabrication steps of the device 500.

In the sensor area of the accelerometer, the layer 615 forms a continuous layer over the cap structural component to provide mechanical support to the cap structure 593 and 611. By increasing the combined thickness of the cap structure 593 and 611, the mechanical strength of the cap is increased so that it does not exhibit deflection due to the ambient pressure applied on the cap structure. Since the mechanical strength of a plate increases by a cube of its thickness, by increasing the thickness of the layers used for the cap structure, the mechanical strength is increased non-linearly.

In the pressure sensor 504, the layer used for 615 can be used in the field and sensor regions for the implementation of the static and dynamic structural components. In the exemplary embodiment shown in FIG. 5, layer used for 615 is not used in the field and sensor regions of the pressure sensor 504. In other embodiments, the layer used for 615 may be used for forming a bossed diaphragm to improve the linearity of the pressure sensor.

In the microphone 506, the layer used for 615 can be used in the field and sensor regions for the implementation of the static and dynamic structural components. In the exemplary embodiment shown in FIG. 5B, layer used for 615 is not used in the field and sensor regions of the microphone 506.

The layer 620 is another layer used for the structural components of the device 500. In this exemplary embodiment, layer 620 is a PECVD Oxide layer. It is an insulator and is deposited in a non-conformal manner. Layer 620 is used in the accelerometer 502, pressure sensor 504 and microphone 506, for the implementation of the static and dynamic structural components of the sensors in both the field region and the sensor region.

In the accelerometer 502, the layer 620 may be used in the field region and sensor region for the implementation of the static and dynamic structural components of the accelerometer. In this exemplary embodiment, the layer 620 is not used for the implementation of the accelerometer. In other embodiments, the layer 620 may be left on top of the cap structure formed by 593, 611 and 615 to increase the mechanical strength of the cap structure. Since the mechanical strength of a plate increases by a cube of its thickness, by increasing the thickness of the layers used for the cap structure, the mechanical strength is increased non-linearly.

In the pressure sensor 504, the layer 620 may be used in the field region and sensor region for the implementation of the static and dynamic structural components of the pressure sensor. In this exemplary, embodiment, the layer 620 is used in the field region of the pressure sensor to form a seal or plug over layer 598 so that the atmosphere in the cavity enclosed by the diaphragm is fixed. In this exemplary embodiment, since the layer 620 is a PECVD oxide which is deposited at about (0.5-5) Torr, the cavity enclosed by the pressure sensor diaphragm is sealed at about (0.5-5) Torr. Thus, structural components 620 and 621 form plugs or seals over the etch holes 598 and 600 in the field region of the pressure sensor diaphragm 599. In other embodiments, layer 620 may be used in the sensor region 511 of the pressure sensor to form a bossed diaphragm to improve the linearity of the pressure sensor. Since the cavity below the diaphragm of the pressure sensor is sealed at a vacuum, it is capable of varying in volume due to the deflection of the diaphragm under the pressure applied on the surface of the diaphragm on the external side of the cavity, In the microphone 506, the layer 620 may be used in the field region and sensor region for the implementation of the static and dynamic structural components of the microphone. In this exemplary embodiment, the layer 620 is not used for the implementation of the microphone.

The layer 625 is another layer used for the structural components of the device 500. In this exemplary embodiment, layer 625 is a LPCVD Silicon Nitride layer. It is an insulator and is deposited in a conformal manner. Layer 625 is used in the accelerometer 502, pressure sensor 504 and microphone 506, for the implementation of the static and dynamic structural components of the sensors in both the field region and the sensor region.

In the accelerometer 502, the layer 625 may be used in the field region and sensor region for the implementation of the static and dynamic structural components of the accelerometer. In this exemplary embodiment, the layer 625 is not used for the implementation of the accelerometer. In other embodiments, the layer 625 may be left on top of the cap structure formed by 593, 611 and 615 to increase the mechanical strength of the cap structure. Since the mechanical strength of a plate increases by a cube of its thickness, by increasing the thickness of the layers used for the cap structure, the mechanical strength is increased non-linearly.

In the pressure sensor 504, the layer 625 may be used in the field region and sensor region for the implementation of the static and dynamic structural components of the pressure sensor. In this exemplary, embodiment, the layer 625 is used in the field region of the pressure sensor to form a seal or plug over layer 620 so that the atmosphere in the cavity enclosed by the diaphragm is fixed. Thus, structural components 625 and 626 form plugs or seals over the plugs or seals 620 and 621 in the field region of the pressure sensor diaphragm 599. In other embodiments, layer 625 may be used in the sensor region 511 of the pressure sensor to form a bossed diaphragm to improve the linearity of the pressure sensor.

In the microphone 506, the layer 625 may be used in the field region and sensor region for the implementation of the static and dynamic structural components of the microphone. In this exemplary embodiment, the layer 625 is not used for the implementation of the microphone.

As shown in FIG. 6, the substrate 516 for the implementation of device 500 is a SOI (Silicon on Insulator) wafer. The SOI wafer consists of the handle layer 519 which provides mechanical support for the sensors that are built in device 500. In one embodiment, the handle layer is composed of monocrystalline silicon and is doped n-type. The buried oxide (BOX) 518 is a layer over the handle layer and is used to serve a number of purposes in the device 500 such as acting as an anchor, a sacrificial layer, a motion stop layer and the like. The thickness of the BOX layer is between (0.2-3) microns. The device layer 517 of the SOI wafer is composed of monocrystalline silicon and is doped n-type. The handle layer and the device layer can be any semiconductor material or combinations of materials such as silicon, monocrystalline silicon, silicon carbide, silicon germanium, gallium arsenide and the like and the BOX layer can be any insulator such as silicon dioxide, silicon nitride, silicon oxynitride, PSG and the like. In one embodiment, the BOX layer is a silicon dioxide and used as a sacrificial layer.

Figure 7:
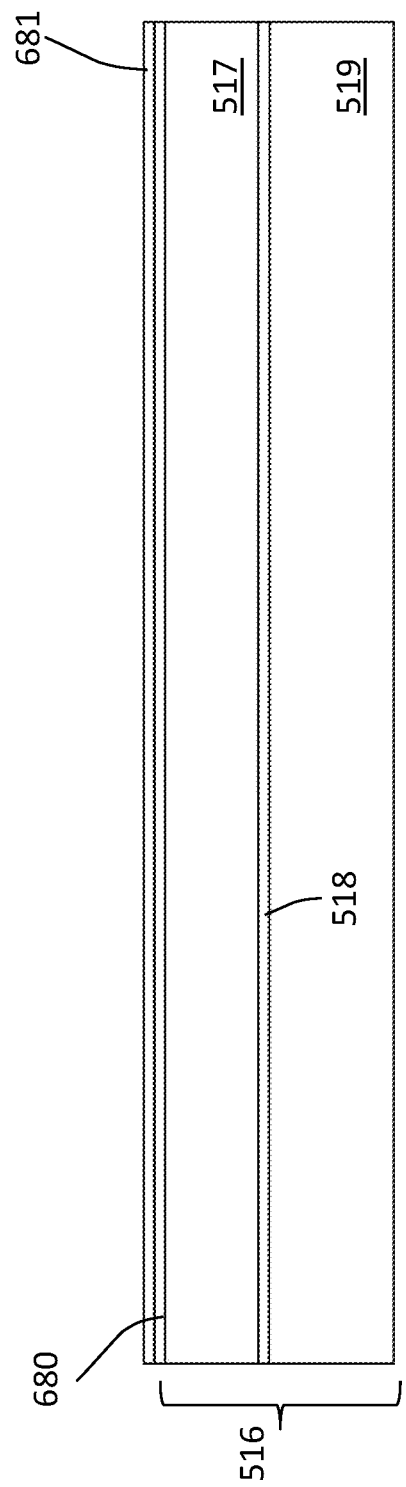

As illustrated in FIG. 7, a pad oxide layer 680 and a silicon nitride layer 681 is deposited during the formation of the vertical interconnect structures for the device 500. In one embodiment, the thickness of the pad oxide is approximately 0.1 microns in thickness and is grown on top of the surface of the device layer 517. In one embodiment, the silicon nitride layer is deposited by LPCVD (Low Pressure Chemical Vapor Deposition) and is approximately 0.2 microns in thickness. The pad oxide layer 680 and the silicon nitride layer 681 are used as etch mask for the vertical structures formed in subsequent fabrication steps.

As Illustrated in FIG. 8, the pad oxide 680 and silicon nitride layer 681 are patterned to form the openings of the vertical interconnects for the sensors formed in device 500. The pad oxide 680 and silicon nitride 681 are coated with a photoresist using spin coating and a pattern defined in the photoresist using a lithography mask. The photoresist is selectively removed over the regions where the vertical interconnects are formed. The silicon nitride layer and the pad oxide layers are then removed by a method of etching. The etching of the silicon nitride layer 681 and pad oxide layer 680 can be achieved by using wet etching with chemicals or by RIE (reactive ion etching) or by a combination of wet etching and RIE. In one embodiment, the silicon nitride layer and pad oxide layer are etched using RIE. The etching of the silicon nitride layer 681 and the pad oxide 680 exposes the silicon of the device layer 517. The device layer 517 is then etched to define openings for the vertical connect structures. It will be appreciated that any one of numerous etching processes may be used. However, in a preferred embodiment, a DRIE (Deep Reactive Ion Etch) is used. This DRIE process allows for trenches to be formed with high aspect ratio. The DRIE process is used to remove the silicon in the device layer 517 to the surface of the BOX (Buried Oxide) layer. The buried oxide layer 518 below the openings formed in the device layer is then etched using any one of a wet etch, dry etch (RIE—reactive ion etching) or a combination of the two. In a preferred embodiment, the buried oxide layer is etched using a RIE. The removal of the oxide in the openings defined for the vertical interconnects is followed by another etching process for the handle layer 519. The etching of the openings for the vertical interconnects is achieved using DRIE, in a preferred embodiment. FIG. 8 shows device 500 after etching the openings for the vertical interconnect structures. FIG. 8 shows the openings 682 that are made by etching layer 680 and 681 by RIE, followed by DRIE of the device layer 517, RIE of BOX layer 518 and DRIE of the handle layer 519. The shape of the openings may be (1-20) microns and the shape of the openings may be square, round, rectangular, octagonal and the like. In one embodiment, the size of the openings 682 are 6 microns and the shape is round. The depth of the openings 682 may range from (5-100) microns. In one embodiment, the depth of the openings for the vertical interconnects is 100 microns.

In FIG. 9, the walls of the trenches 682 are covered by an insulating layer to provide isolation from the conductive substrate, (the device layer 517 and the handle layer 519) so as to prevent electrical shorting of the vertical interconnects and also to reduce the capacitance coupling to the conductive substrate. The insulating layer may be an silicon dioxide, silicon nitride, silicon oxynitride, or a combination of insulating layers. The thickness of the insulating layer can be (0.5-5) microns. In one embodiment, a silicon oxide layer is used for the insulating layer. The silicon oxide layer may be grown using thermal oxide, or deposited as LPCVD oxide, LPCVD TEOS, LPCVD LTO, LPCVD HTO, SACVD, so as to form a conformal layer on the sidewalls and bottom of the trenches 682. In one embodiment, the silicon oxide layer is formed using growth of thermal oxide. In FIG. 9, 683 is the conformal oxide layer for the insulating layer. In one embodiment, the thickness of the silicon oxide insulating layer is 1 micron.

Figure 10:
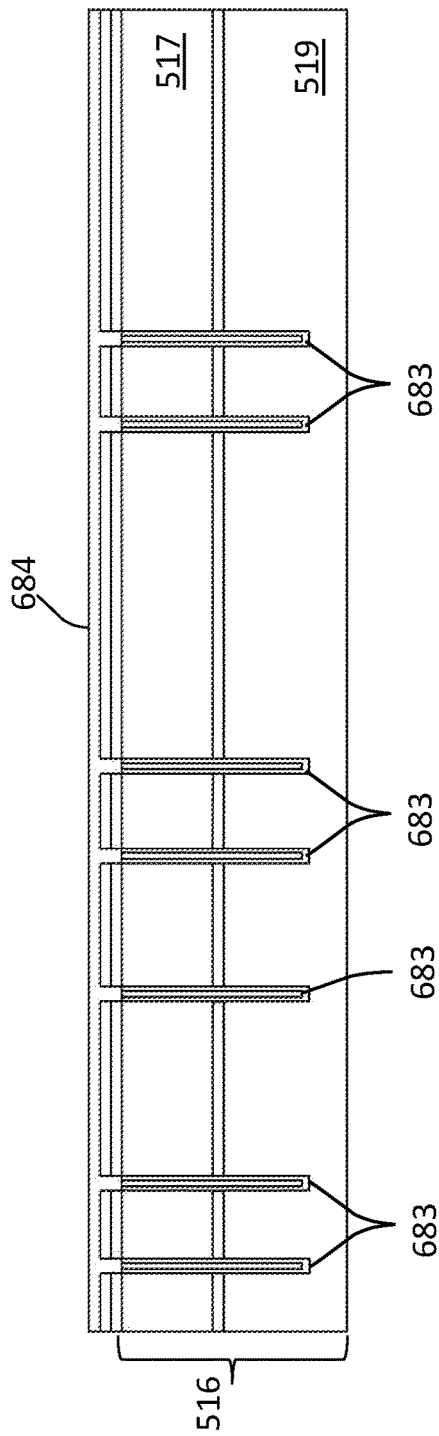

The refilling of the openings for the vertical interconnects with a conductive layer 684 is shown in FIG. 10. The openings that are lined with the insulating layer are refilled using a conductive layer using any one of a deposition process. This conductive layer may be composed of polycrystalline (polysilicon) that is doped, epitaxially deposited silicon and the like and doped with phosphorus, arsenic, antimony, boron and the like. The thickness of the conductive layer is chosen to completely refill the openings for the vertical interconnects after the formation of the insulating liner on the sidewalls. In one embodiment, the conductive layer 684 is formed by depositing LPCVD polysilicon that is doped in-situ (as-deposited) with phosphorus. In another embodiment, the conductive layer is formed by epitaxial growth of silicon which is doped in-situ. In another embodiment, the conductive layer is formed with a metal layer such as tungsten, tantalum and the like. In another embodiment, the vertical interconnect module may be completed after the fabrication of the sensors.

Figure 11:
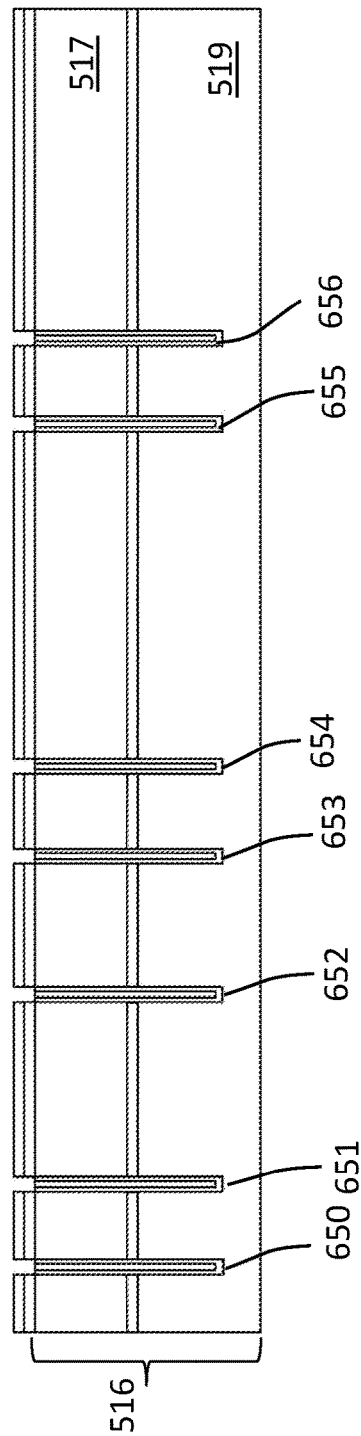

As illustrated in FIG. 11, the conductive layer in the top surface of the substrate is removed leaving the conductive layer 684 only in the refilled trenches. The removal of the conductive layer is done by etching which can be using RIE (reactive ion etching), wet etching, combination of RIE and wet etching, CMP (chemical mechanical polishing) followed by RIE or wet etching. The conductive layer 684 is removed to be substantially planar with the top surface of the substrate. In one embodiment, the conductive layer used to refill the vertical interconnect trench is a phosphorus doped polysilicon and the layer on the top surface of the substrate is removed using RIE (reactive ion etching) to form the conductive regions of the vertical interconnects 650, 651, 652, 653, 654, 655, 656. In this embodiment, the vertical interconnect is known as a Thru Silicon Via (TSV). In another embodiment, the TSV may contain another conductive layer between the liner insulating layer and the conductive layer to reduce the parasitic capacitance coupling to the substrate.

After forming the vertical interconnects, the nitride layer 681 and pad oxide 680 is removed from the top surface of the substrate (which is the device layer of the SOI substrate). FIG. 12 shows the substrate after the removal of the nitride layer and pad oxide layer. The nitride layer 681 and the pad oxide 680 is removed by RIE (reactive ion etching), wet etching, combination of wet etching and RIE and the like. In one embodiment, the nitride layer is removed using RIE and the pad oxide layer is removed using a wet etchant containing Hydrofluoric acid or Buffered Hydrofluoric acid and the like.

As illustrated in FIG. 13, an insulating layer 565 is deposited on the top surface of the device layer of the substrate 516. This insulating layer is meant to provide several functions for the sensors formed in device 500. In one embodiment, the insulating layer 565 is a LPCVD (low pressure Chemical Vapor Deposition) silicon nitride layer. In another embodiment, the layer 565 is a silicon rich silicon nitride layer that has low residual stress and higher selectivity to HF based etch chemistry that is used in subsequent processing steps for the fabrication of the sensors in device 500. The thickness of the silicon nitride insulating layer is between (0.2-1) microns. In one embodiment, the thickness of layer 565 is 0.5 microns and is a silicon rich LPCVD silicon nitride layer. The residual stress of the silicon rich silicon nitride layer is less than 200 MPa tensile stress.

The layer 565 is used in the accelerometer 502, pressure sensor 504 and microphone 506 in the sensor region and field region for the implementation of static and dynamic structural components. The layer 565 is patterned using conventional processing (photolithography with masks, followed by etching, such as reactive ion etching) to form the different structural components of the sensors in device 500.

For each of the vertical interconnects of the sensors formed in device 500, the layer 565 is used to protect the insulating layer from subsequent processing steps. In one embodiment, the silicon nitride layer 565 is patterned over the top of each vertical interconnect or TSV over the conductive polysilicon refill layer so as to seal the edges of the polysilicon used in the vertical interconnect and not expose the lining oxide of the vertical interconnect to HF based chemistry used in subsequent processing steps.

The layer 565 is patterned so as to define the sensor regions and field regions for the accelerometer 502, pressure sensor 504 and microphone 506. Thus, in FIG. 14, the silicon nitride layer is patterned to define the sensor region 508 for the accelerometer 502, sensor region 511 for the pressure sensor 504 and sensor region 514 for the microphone. In one embodiment, the layer 565 is removed in the sensor region 508 for the accelerometer 502, sensor region 511 for the pressure sensor 504 and sensor region 514 for the microphone 506. The openings in the layer 565 are 685 in FIG. 14, leaving regions 560, 561, 562 and 563 which are used in the field regions for the device 500.

FIG. 15 illustrates the fabrication of the device 500 in a further state of processing. The active or device layer of the substrate is patterned and etched to define the field and sensor regions of the sensors and to form the static and dynamic structural components of the accelerometer 502, pressure sensor 504 and microphone 506. The device or active layer 517 is patterned to form trenches by using photolithography (photoresist and masks) followed by an etching step such as DRIE (deep reactive ion etching) of the device or active layer. DRIE allows the formation of trenches which as high aspect ratio (the depth of the trenches are higher than the width of the openings of the trenches). The patterning process forms trenches 670, 671, 672, 673, 674, 675, 676 and 677 which define the static and dynamic structural components in the field and sensor regions for accelerometer 502, pressure sensor 504 and microphone 506. The width of the trenches formed by the patterning range from (1-5) microns and the depth of the trenches range from (2-100) microns.

In one embodiment, the width of the trenches is approximately 1.8 to 2.0 microns and the vertical sidewall of the trench being approximately 89 to 90 degrees with respect to the substrate 516. The DRIE, in one embodiment, etches down to the BOX (buried oxide) layer 518, which acts as an etch stop layer.

The patterning of the device or active layer is used to define field regions and sensor regions for the accelerometer 502, pressure sensor 504 and microphone 506 and form static and dynamic structural components for the sensors.

In the accelerometer 502, the patterning of the active or device layer forms the field regions 540, 541 and 547, which support the vertical interconnects 650, 651 and 652 and provides an anchor or support to the protective cap structure 598 that is subsequently formed. The trenches 670, 671, 572, 673 are used to pattern the active layer in the sensor region to form the structural components 542, 543, 544, 545, and 546. The active layer structural components 542 and 543 are static components formed by patterning the active or device layer by forming trenches 670 and 671. Similarly, the patterning of the active layer to define trenches 672 and 673 forms static structural components 545 and 546 from the active layer.

The patterning of the active layer by forming trenches 671 and 672 defines the dynamic structural component 544 that is able to respond to an input acceleration. This dynamic structural component 544 represents the proof mass, suspension spring, fingers, plates and the like that is capable of responding to an acceleration in a direction parallel to the top surface of the substrate.

In the pressure sensor 504, the patterning of the active or device layer forms the field regions 547, 548, 549 and 551 which support the vertical interconnects 653 and 654 and provides anchors or supports 596 and 601 for the perimeter of the diaphragm 599 that is subsequently formed. The trenches 674 and 675 are used to pattern the device or active layer in the sensor region to form the structural component 550 that forms a static or reference electrode for the pressure sensor. The structural component 550 is a wide plate structure and may be round, square, rectangular and the like to form a fixed plate of a capacitive pressure sensor formed with subsequently defined process steps.

In the microphone 506, the patterning of the active or device layer forms the field regions 551, 552, 553, 554 and 555 which support the vertical interconnects 655 and 656 and provides anchors or supports 602 and 607 for the perimeter of the membrane 605 that is subsequently formed. The trenches 676 and 677 are used to pattern the device or active layer in the sensor region to form the structural component 554 that forms a static or reference electrode for the microphone. The structural component 550 is a wide plate structure and may be round, square, rectangular and the like to form a fixed plate of a capacitive microphone formed with subsequently defined process steps. In one embodiment, the structural component 550 may contain additional trenches for improved performance of the microphone to reduce air damping.

In FIG. 15, the device or active layer of the SOI substrate wafer is patterned to form field regions and sensor regions for the accelerometer 502, pressure sensor 504 and microphone 506. It will be evident to those skilled in the art that the same layer (device layer or active layer) is patterned to form static and dynamic structural components for different sensors that respond to different input stimuli.

As illustrated in FIG. 16, a first release etch is performed to release the dynamic structural components of the accelerometer 504, pressure sensor 504 and microphone 506. The release etch is used to remove a portion of the Buried Oxide (BOX) layer below the dynamic structural components so that they are free to respond to an input stimulus. In one embodiment, a hydrofluoric acid (HF) wet etch is used to remove the portion of the BOX layer below the dynamic structural components. Other processes such as vapor phase HF etch and gaseous HF etch can also be used. The release etch process is performed to minimize the effect of stiction in the x, y and z direction between the dynamic and fixed to static structural components of the sensors. In the accelerometer 502, in the sensor area, the release etch removes the BOX layer below the dynamic structural component 544. The dynamic structural component consists of the proof or seismic mass of the accelerometer, sense fingers, spring suspension, and other electrodes that move under the influence of an input acceleration. The release etch also partially undercuts the BOX layer below the static structural components to form anchors or supports. Thus, the release etch forms BOX anchor 523 for the fixed or static electrode 522 and BOX anchor 524 for static electrode 545. The release etch may also be controlled to form a residual stub or dimple (not shown) below the dynamic structural component to prevent stiction between the handle layer of the substrate. The release etch also undercuts a portion of the BOX layer in the field region to form regions 522 and 525 in the accelerometer 502.

As shown in FIG. 16, in the pressure sensor 504, the release etch undercuts the BOX layer in the static or reference electrode 550 leaving an anchor 529 that connects the static electrode to the handle layer and prevents it from any movement. In addition, the release etch also forms BOX anchor regions 528 and 530 in the field region of the pressure sensor.

In the microphone 506, the release etch undercuts the BOX layer in the static or reference electrode 554 leaving an anchor 533 that connects the static electrode to the handle layer and prevents it from any movement. In addition, the release etch also forms BOX anchor regions 532 and 534 in the field region of the microphone.

After the first release etch, the trenches formed in the device layer by using DRIE are refilled by using a first sacrificial layer. The first sacrificial layer is deposited and patterned over the device 500, as shown in FIG. 17. The first sacrificial layer seals the trenches 670, 671, 672, 673, 674, 675, 676 and 677 by covering up the openings in the device layer and creates a top planar surface in the device layer 517. The first sacrificial layer may fill the trenches 670, 671, 672, 673, 674, 675, 676 and 677 completely or partially depending on the process used to form the first sacrificial layer. In one embodiment, the first sacrificial layer is formed by using PSG (phosphosilicate glass) and the process used for the deposition is PECVD (plasma enhanced Chemical Vapor Deposition). In one embodiment, the first sacrificial layer of PSG is deposited using PECVD to refill the trenches in a non-conformal manner and then reflowed using a high temperature anneal to seal the trenches 670, 671, 672, 673, 674, 675, 676 and 677 and form a planar surface on the device 500. In one embodiment, the first sacrificial layer of PECVD PSG is annealed in a N2, O2 or combination of the above environment to seal the top of the trenches 670, 671, 672, 673, 674, 675, 676 and 677. The material chosen for the first sacrificial layer is able to with stand high temperature processing and able to be removed easily in another etch process in subsequent processing, as will be explained in more detail below.

As illustrated in FIG. 17, the first sacrificial layer is patterned to form openings which expose portion of the nitride insulating layer, the vertical interconnects, anchor regions for the static and dynamic components of the accelerometer 502, pressure sensor 504 and microphone 506. The first sacrificial layer may be patterned using a resist layer and photolithography and a dry etch, wet etch or a combination of the above. The portions of the first sacrificial layer left on the surface of the device layer 517 after the patterning is represented by 686 in FIG. 17.

Figure 18:
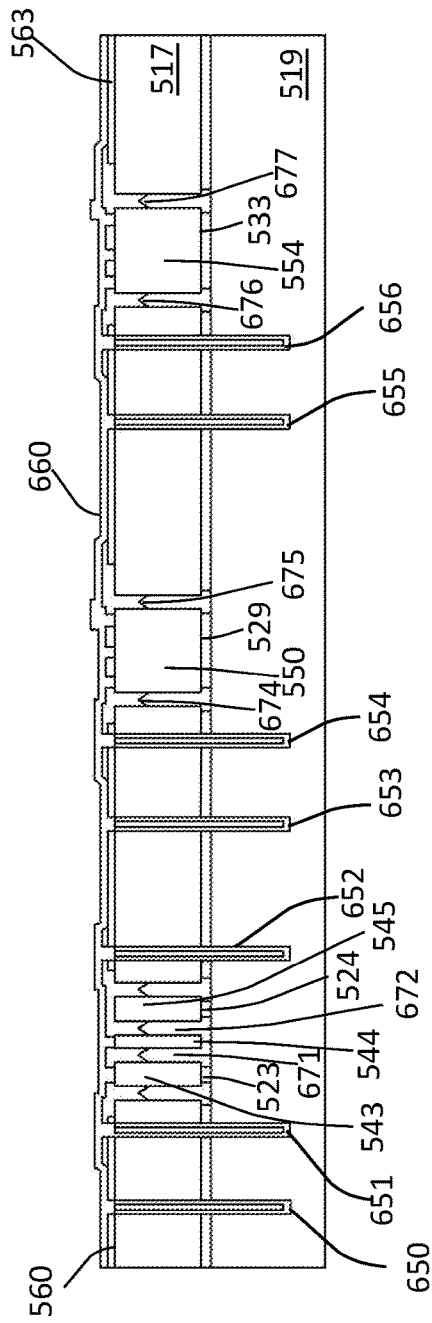
Figure 19:
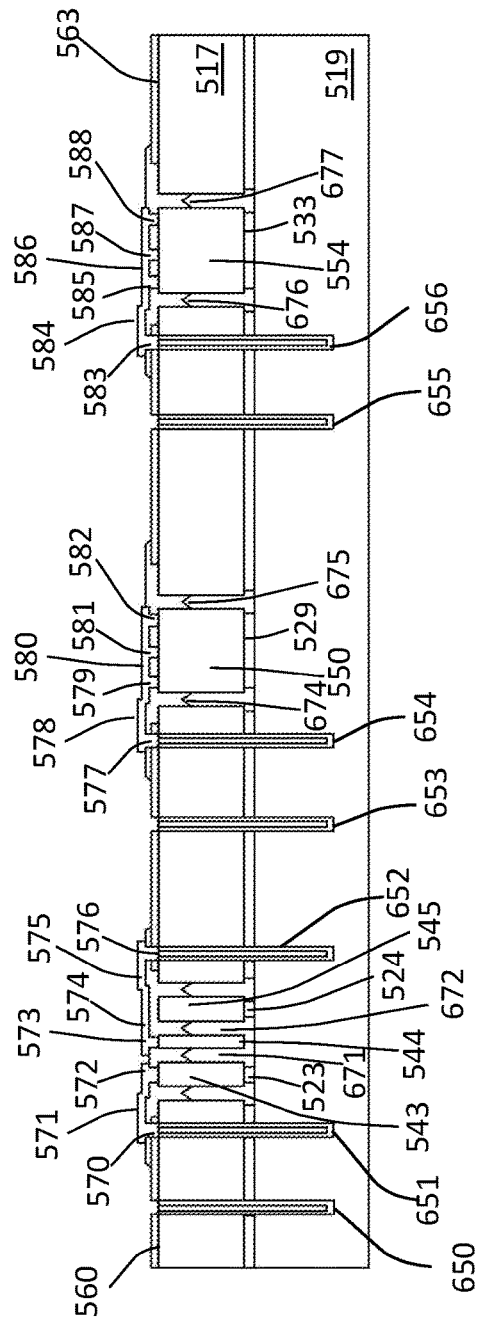

As illustrated in FIG. 18, a structural layer 660 is formed over the device 500 after the formation of the openings in the first sacrificial layer. This layer is used in the field region and sensor region of the accelerometer 502, pressure sensor 504 and microphone 506 to form static and dynamic structural components. Any suitable material can be used for this layer that preferably has a low contact resistance (e.g., doped polysilicon with a contact resistance of approximately 10-40 Ohms/square), has good adhesion with the substrate in the field region and sensor region, has low sheet resistance (e.g., doped polysilicon with a sheet resistance of approximately 10-50 Ohms/square), is not etched during a subsequent release etch, has sufficient mechanical strength to from the static and dynamic structural components of the sensors formed in device 500. The material used for this layer also has low residual stress (less than 200 MPa, tensile or compressive, after being annealed) and is capable of withstanding mechanical shocks and vibration when it is used to form the static and dynamic structural components of the sensor formed in device 500. In one embodiment, the layer 660 is formed of LPCVD polysilicon using the following processes. The substrate 516 is first cleaned with a hydrofluoric acid process (diluted) to remove any native oxide from the exposed surface of the substrate. Next, approximately 2 microns of polysilicon in-situ doped with phosphorus is deposited using LPCVD so that the initial stress is below 200 MPa tensile stress. An anneal process is performed in a later step to reduce the residual stress in the polysilicon layer 660.

As illustrated in FIG. 18, the layer 660 is patterned to form the static and dynamic structural components of the MIMS device 500. In one embodiment, the layer 660 is formed of polysilicon which is patterned using a resist layer and lithography followed by an etch process which may be a dry etch, wet etch or a combination of dry etch and wet etch. The patterned polysilicon forms static and dynamic structural components of the accelerometer 502, pressure sensor 504 and microphone 506 for the MIMS device 500. In the accelerometer 502, the layer 12 is patterned to form the bridge 571 that connects the static electrode 522 using anchor regions 570 and 572 and connected to the vertical interconnect 651. The layer also a suspension spring 574 that is connected to the dynamic structural component 544 with an anchor 573 at one end and to another anchor 576 using a bridge 575 and connected to the vertical interconnect 652. In the pressure sensor 504, the layer 660 is patterned to form the bridge 578 that connects the static or reference electrode 580 of the pressure sensor 504 with the vertical interconnect 654 using anchor 577. The reference plate or electrode 580 is connected to the static device component 550 with anchors 579, 581 and 582. In the microphone, the layer 660 is patterned to form the bridge 584 that connects the static or reference electrode 586 of the microphone 506 with the vertical interconnect 656 using anchor 583. The reference plate or electrode 586 is connected to the static device component 554 with anchors 585, 587 and 588.

Figure 20:
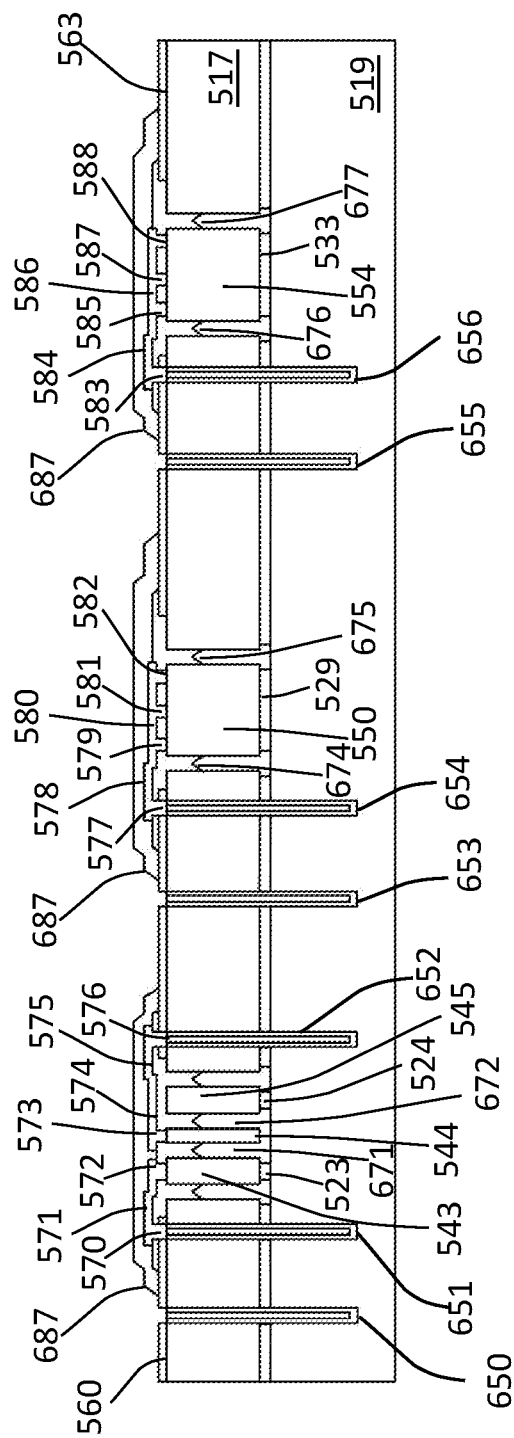

After forming the static and dynamic structural components using layer 660, a second sacrificial layer is formed over the MIMS device 500 and patterned as illustrated in FIG. 20. The second sacrificial layer is used in the sensors in device 500. In one embodiment, the second sacrificial layer is formed by PSG (phosphosilicate glass) using PECVD, LPCVD, APCVD, CVD, SACVD, PVD, and the like and combinations of the above. In one embodiment, the second sacrificial layer is formed by PSG and is approximately 1-3 microns in thickness. In one embodiment, the second sacrificial layer of PSG is densified by annealing at a temperature of (950-1050) degree Celsius. The second sacrificial layer is patterned using resist and photolithography and etched using wet etching by HF, BHF, dry etch or a combination of wet and dry etch. In one embodiment, the second sacrificial layer of PSG is patterned using a wet etch using HF.

In the accelerometer 502, the second sacrificial layer component 687 is used in the sensor region 508 to define the spacing of the accelerometer to the subsequently formed cap layer. The second sacrificial layer is removed in the field region to expose underlying layers of nitride, the vertical interconnects and the like.

In the pressure sensor 504, the second sacrificial layer component 687 is used in the sensor region 511 to define the spacing of the static electrode 580 from the subsequently formed diaphragm. The second sacrificial layer is removed in the field region to expose underlying layers of nitride, the vertical interconnects and the like.

In the microphone 506, the second sacrificial layer component 687 is used in the sensor region 514 to define the spacing of the static electrode 586 from the subsequently formed membrane. The second sacrificial layer is removed in the field region to expose underlying layers of nitride, the vertical interconnects and the like.

Figure 21:
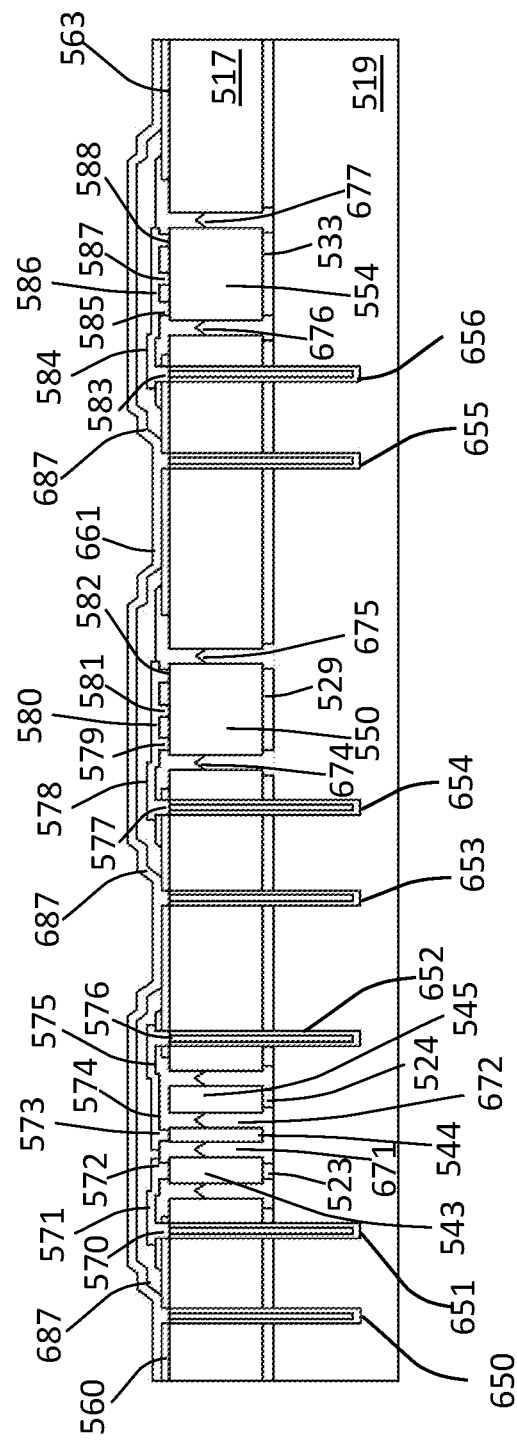

After the patterning of the second sacrificial layer, a structural layer 661 is formed over the MIMS device 500 and the second sacrificial layer as shown in FIG. 21. The structural layer 661 is used in the field region and sensor region of the accelerometer 502, pressure sensor 504 and microphone 506 to form static and dynamic structural components. Any suitable material can be used for this layer that preferably has a low contact resistance (e.g., doped polysilicon with a contact resistance of approximately 10-40 Ohms/square), has good adhesion with the substrate in the field region and sensor region, has low sheet resistance (e.g., doped polysilicon with a sheet resistance of approximately 10-50 Ohms/square), is not etched during a subsequent release etch, has sufficient mechanical strength to from the static and dynamic structural components of the sensors formed in device 500. The material used for this layer also has low residual stress (less than 200 MPa, tensile or compressive, after being annealed) and is capable of withstanding mechanical shocks and vibration when it is used to form the static and dynamic structural components of the sensor formed in device 500. The thickness of this layer 661 is approximately 1-4 microns. In one embodiment, the layer 661 is formed of LPCVD polysilicon using the following processes. The substrate 516 is first cleaned with a hydrofluoric acid process (diluted) to remove any native oxide from the exposed surface of the substrate. Next, approximately 2 microns of polysilicon in-situ doped with phosphorus is deposited using LPCVD so that the initial stress is below 200 MPa tensile stress. An anneal process is performed in a later step to reduce the residual stress in the polysilicon layer 661.

Figure 22:
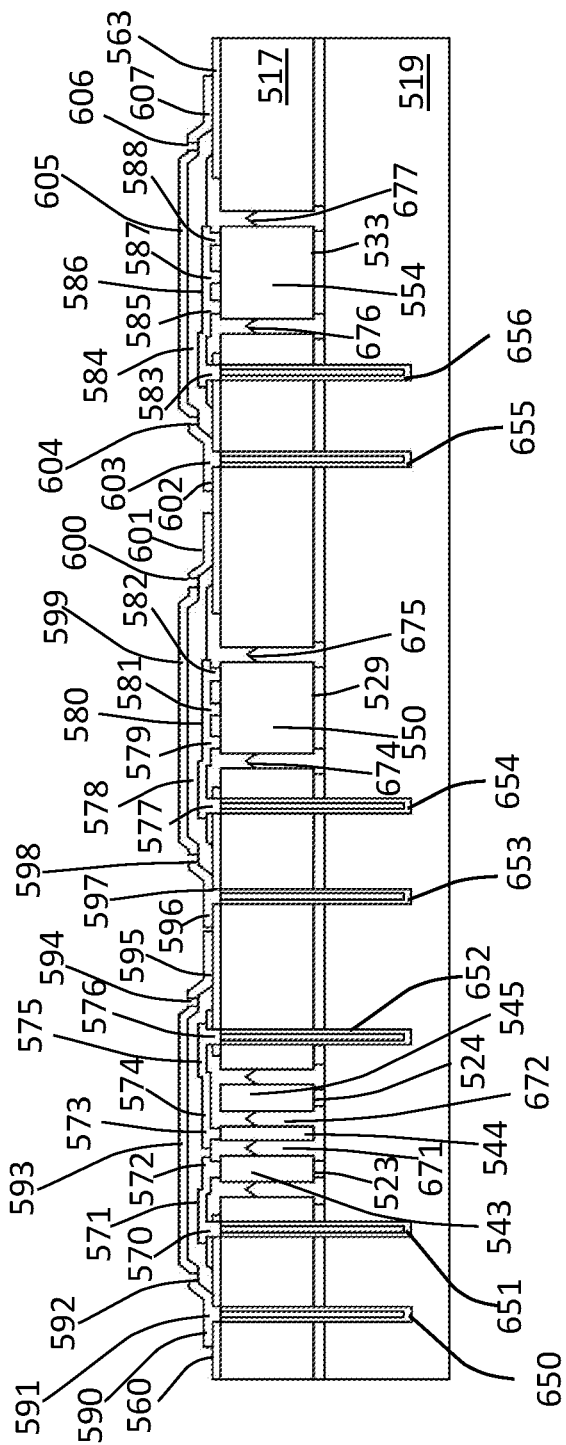

As illustrated in FIG. 22, the layer 661 is patterned to form the static and dynamic structural components of the MIMS device 500. In one embodiment, the layer 661 is formed of polysilicon which is patterned using a resist layer and lithography followed by an etch process which may be a dry etch, wet etch or a combination of dry etch and wet etch. The patterned polysilicon layer forms static and dynamic structural components of the accelerometer 502, pressure sensor 504 and microphone 506 for the MIMS device 500. In the accelerometer 502, the layer 661 is patterned to form a protective cap structure 593 which is used to protect the static and dynamic structural components of the accelerometer from the effects of processing after the device 500 is completed. These processes can include wafer thinning, assembly and packaging. The protective cap structure 593 is anchored to the substrate by 590 and 595 and connected to the vertical interconnect 650 by 591. The layer 661 is also patterned to form etch holes (openings) 592 and 594 to allow the chemicals used in the release etch to reach the second sacrificial layer, first sacrificial layer and the BOX layer so that at least portions of these layers are removed to release the MIMS device 500. The layer 661 may also be used to form pillars or walls (not shown in FIG. 22) supported on the static structural components to improve the mechanical strength of the cap structure 593.

As illustrated in FIG. 22, in the pressure sensor 504, the polysilicon layer 661 is patterned to form the pressure sensitive diaphragm 599 which is separated from the static or reference plate or electrode 580 by the thickness of the second sacrificial layer. The diaphragm 599 formed by the polysilicon layer 661 is supported in the periphery by the anchor regions 596 and 601 and connected to the vertical interconnect 653 by connection region 597. The shape of the diaphragm 599 may be round, square, rectangular, octagonal and the like and may be 50-500 microns in size.

The layer 661 is also patterned to form etch holes (openings) 598 and 600 to allow the chemicals used in the release etch to reach the second sacrificial layer, first sacrificial layer and the BOX layer so that at least portions of these layers are removed to release the MIMS device 500.

As illustrated in FIG. 22, in the microphone 506, the polysilicon layer 661 is patterned to form the sound sensitive membrane 605 which is separated from the static or reference plate or electrode 586 by the thickness of the second sacrificial layer. The membrane 605 formed by the polysilicon layer 661 is supported in the periphery by the anchor regions 602 and 607 and connected to the vertical interconnect 655 by connection region 603. The shape of the membrane 605 may be round, square, rectangular, octagonal and the like and may be 50-500 microns in size.

The layer 661 is also patterned to form etch holes (openings) 604 and 606 to allow the chemicals used in the release etch to reach the second sacrificial layer, first sacrificial layer and the BOX layer so that at least portions of these layers are removed to release the MIMS device 500.

Figure 23:
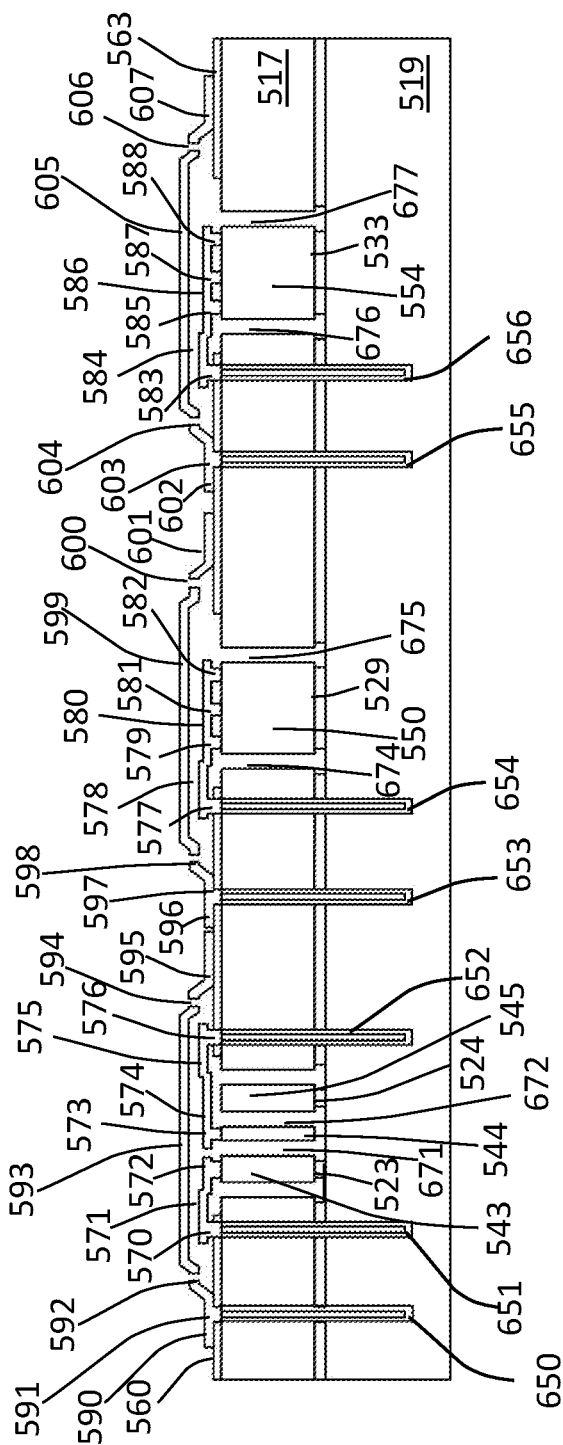

The second release etch is performed in the MIMS device 500 to release the dynamic structural components by removing the second sacrificial layer, the first sacrificial layer and a portion of the BOX layer so that the dynamic structural components are able to move under an input stimulus as shown in FIG. 23. The release etch chemistry chosen preferably minimizes the etching of the anchors 522, 523, 524, 528, 529, 532, 533, and 534 for the MIMS device 500. The release etch preferably has no stiction in the x, y and z directions between the dynamic and static structural components of the sensors in MIMS device 500. It may be desirable to perform an overetch to account for variations across a wafer to ensure complete removal of the second sacrificial layer, the first sacrificial layer and a portion of the BOX sacrificial layer. The second release etch removes the second sacrificial layer and first second sacrificial layer and a portion of the BOX layer in the accelerometer 502 so that the dynamic structural components 544 and 574 are suspended and free to move under an input acceleration. The dynamic structural component consists of the proof or seismic mass, fingers, and suspension spring. In the pressure sensor 504, the second release etch removes the second sacrificial layer, first sacrificial layer and a portion of the BOX layer so that the dynamic structural component 599 is free to move under an input pressure. The dynamic structural component 599 is the pressure sensitive diaphragm. In the microphone 506, the second release etch removes the second sacrificial layer, first sacrificial layer and a portion of the BOX layer so that the dynamic structural component 605 is free to move under an input sound wave. The dynamic structural component 605 is the sound sensitive membrane.

In one embodiment, a hydrofluoric acid (HF) wet etch is used to remove the second sacrificial layer, first sacrificial layer and a portion of the BOX layer below the dynamic structural components. Other processes such as vapor phase HF etch and gaseous HF etch can also be used. The release etch process is performed to minimize the effect of stiction in the x, y and z direction between the dynamic and fixed to static structural components of the sensors.

In another embodiment, the first release etch is not performed and the release etch is performed in a single step to remove the second sacrificial layer, first sacrificial layer and a portion of the BOX layer below the dynamic structural components.

After the release etch, the dynamic structural components of the sensors in MIMS device 500 are now free to move. However, the holes 592 and 594 in the accelerometer cap 593, holes 598 and 600 in pressure sensor diaphragm 599 and holes 604 and 606 in the microphone membrane 605 can allow particles and moisture to enter into the cavity below the accelerometer 593, diaphragm 599 and membrane 605 to negatively affect the performance of the sensors in device 500.

Figure 24:
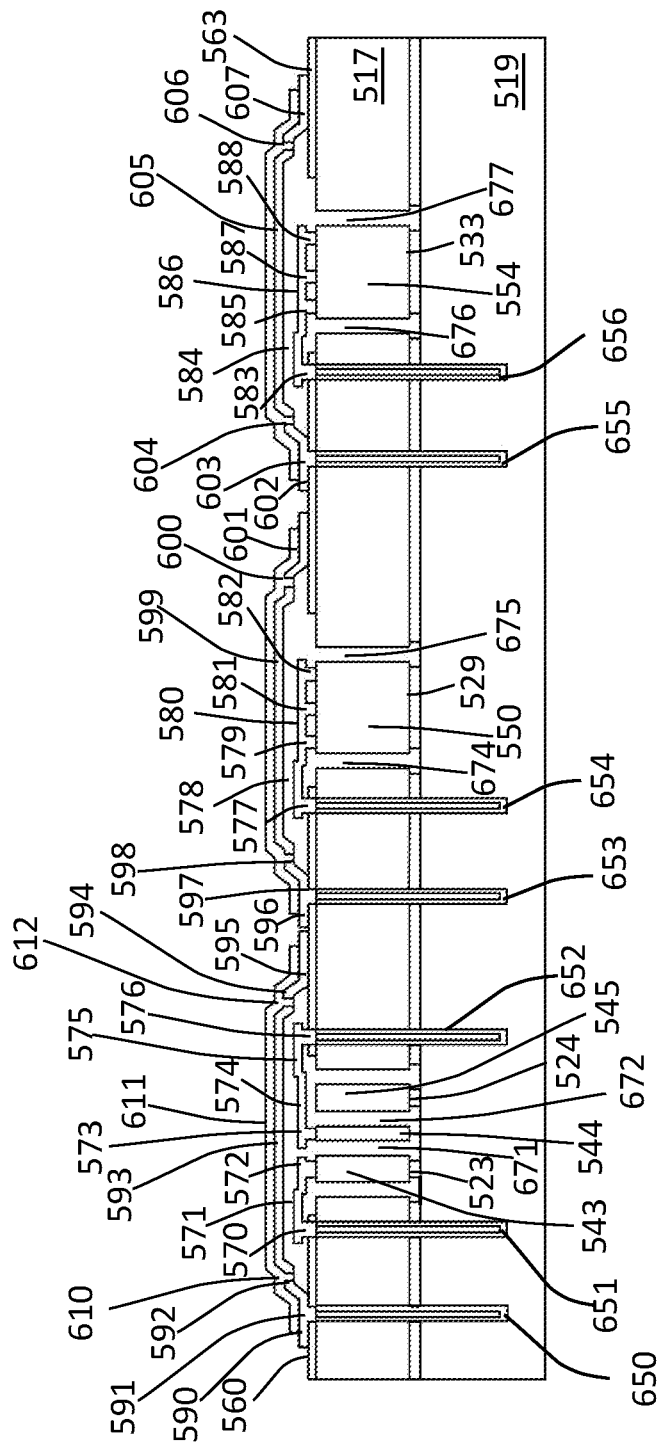

In one embodiment, the holes 592 and 594 in the accelerometer cap 593 are sealed using a first sealing layer forming sealing component 611. The layer forming sealing component 611 seals the etch holes 592 and 594 in a nonconformal manner so that the holes are sealed by plugs 610 and 612. In one embodiment, the sealing layer is an oxide deposited by APCVD (Atmospheric Pressure Chemical Vapor Deposition), which seals the cavity below the cap structure 593 at approximately one atmosphere of pressure. In another embodiment, the sealing component 611 and plugs 610 and 612 are formed by spin-on glass. The thickness of the layer forming 611 is dependent on the size of the etch holes and the height and thickness of the cap layer 593. The sealing layer is patterned using resist and photolithography followed by an etch which may be a wet etch, dry etch or a combination. In FIG. 24, the sealing layer is an APCVD oxide that is patterned to form sealing component 611, plugs 610 and 612 over the accelerometer cap 593 and also leaving the sealing layer over the pressure sensor diaphragm 599 and over the microphone membrane 605.

Figure 25:
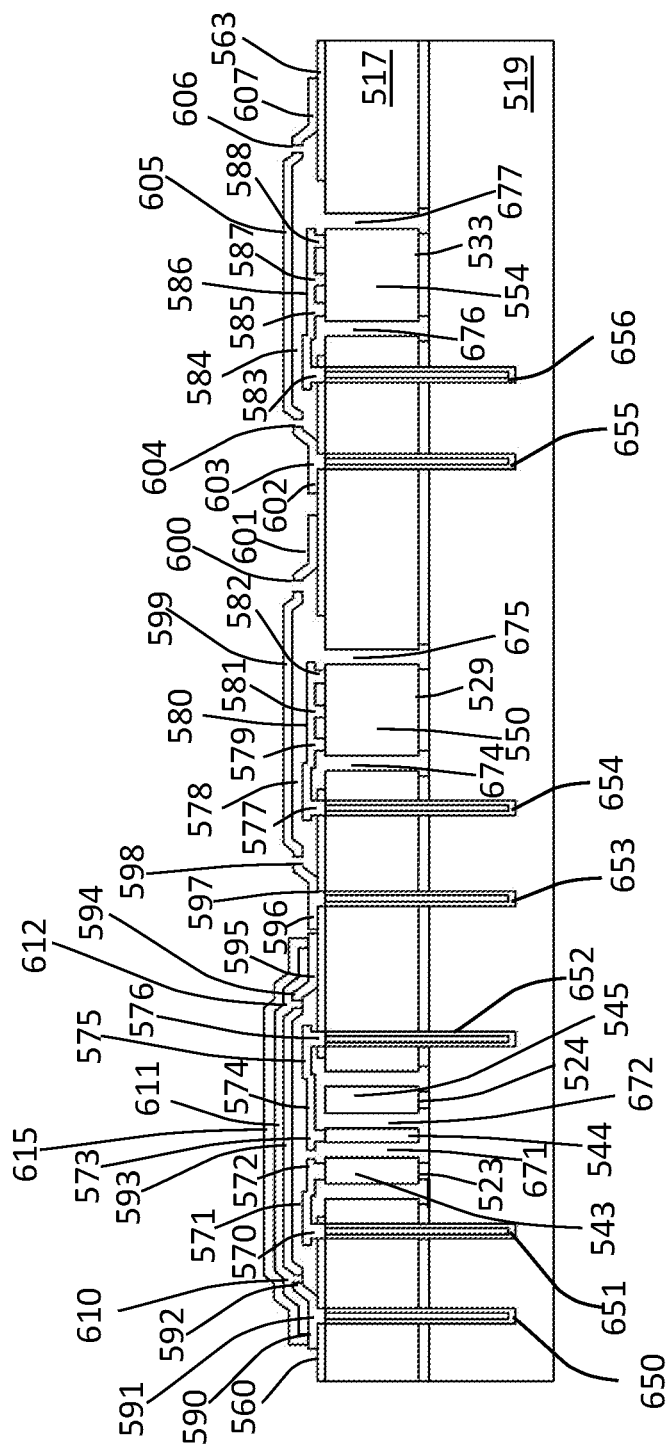

To improve the reliability of the sealing of the cap structure 593 of the accelerometer 502, a second sealing layer is deposited and patterned. In one embodiment, this second sealing layer is formed by depositing a LPCVD silicon nitride layer that is patterned using resist and photolithography followed by an etch which may be a dry etch, wet etch or a combination. In one embodiment, the sealing layer is a LPCVD silicon nitride layer of approximately 0.3 microns in thickness and patterned to form sealing component 615 over the accelerometer with first sealing component 611 formed over cap structure 593. The second sealing layer is etched over the pressure sensor 504 and the microphone 506. This is followed by an etch which removes the first sealing layer above the pressure sensor 504 and microphone 506. As illustrated in FIG. 25, the accelerometer cap 593 is sealed using a first sealing layer component 611 followed by a second sealing layer component 615 while the pressure sensor 504 and microphone 506 are not sealed at this step. In FIG. 25, the sealing of the accelerometer cap using the first and second sealing layers ensures that the cavity below the cap structure 593 are sealed at substantially a fixed volume since the cap structure 593 is designed to stay rigid with high mechanical strength. This ensures that the dynamic structural components of the accelerometer 502 are protected from the environment and free to move under the applied acceleration that it is measuring.

Figure 26:
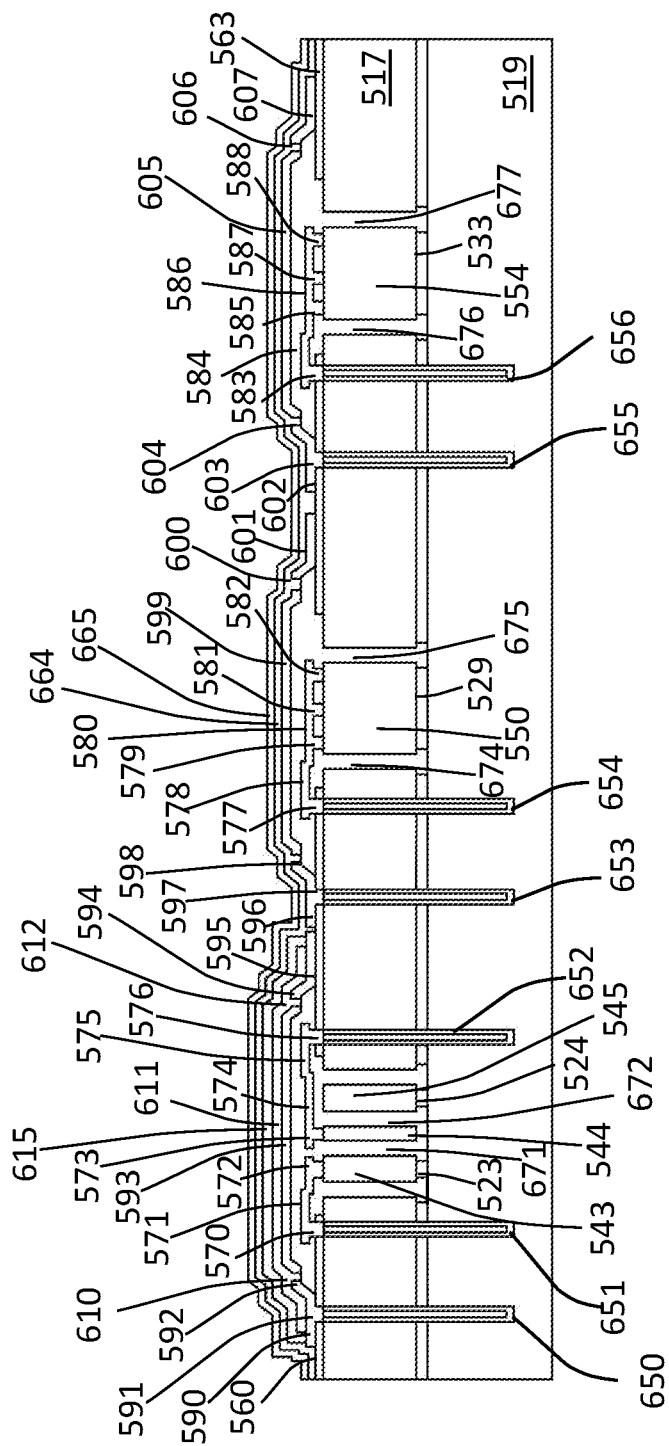
Figure 27:
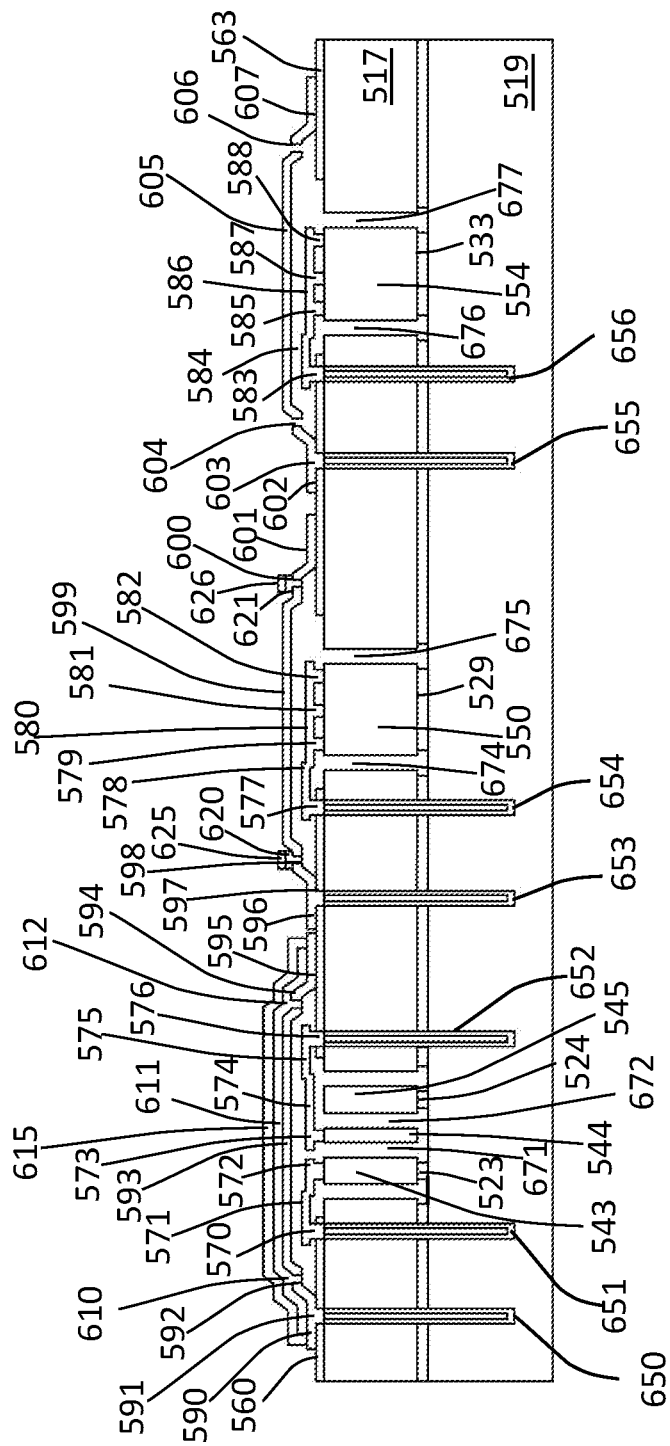

After completing the formation of the accelerometer 502, the cavity below the diaphragm 599 of the pressure sensor 504 is sealed using a third sealing layer 664 and a fourth sealing layer 665 as illustrated in FIG. 26. The cavity below the pressure sensor diaphragm 599 is sealed using the third sealing layer 664 which is deposited in a vacuum. In one embodiment, the sealing layer 664 for the pressure sensor is a PECVD oxide which is deposited in a vacuum of 1-4 Torr and plugs the etch holes 598 and 600 in a non-conformal manner. In another embodiment, the sealing layer 664 is a PECVD PSG. In yet another embodiment, the sealing layer is a sputtered oxide. Whatever the sealing layer 664 used, it is deposited in a vacuum and in a non-conformal manner so as not to encroach into the cavity below the diaphragm. The thickness of the sealing layer 664 is dependent on the size of the etch holes 598 and 600 and the height and thickness of the diaphragm 599. To improve the reliability of the sealing of the etch holes 598 and 600 by the third sealing layer 664, a fourth sealing layer 665 is deposited over the third sealing layer 664. In one embodiment, the fourth sealing is a LPCVD Nitride with an approximate thickness of 0.3 microns.

The third sealing layer and fourth sealing layer are patterned using resist and photolithography followed by the etch of the fourth sealing layer and third sealing layer which may be a dry etch, wet etch, or a combination. In one embodiment, the third and fourth sealing layers are etched using dry etch forming plug comprising 620 and 625 over etch hole 598 and plug comprising 621 and 626 over etch hole 600. In one embodiment, the third sealing layer 12 and fourth sealing layer are removed over accelerometer 502. In another embodiment, the third sealing layer 664 and fourth sealing layer 665 remain over accelerometer 502 to improve the mechanical strength of the cap. The sealing of the cavity below the diaphragm 599 in a vacuum by using plugs comprising 620 and 625 over etch hole 598 and plug comprising 621 and 626 over etch hole 600 ensures that the diaphragm 599 is able to respond to an external pressure by deflecting under the applied pressure. Since the gap between the diaphragm (which is a dynamic structural component) changes with the reference electrode 580 (which is the static structural component), the capacitance changes and the change in the pressure is measured as a change in capacitance. In the microphone 506, the removal of the third sealing layer 664 and fourth sealing layer 665 ensures that the membrane 605 is able to respond to a sound wave and cause a gap change with the reference electrode 586 which causes a change in the capacitance and the input sound wave is measured as a change in capacitance.

Figure 28:
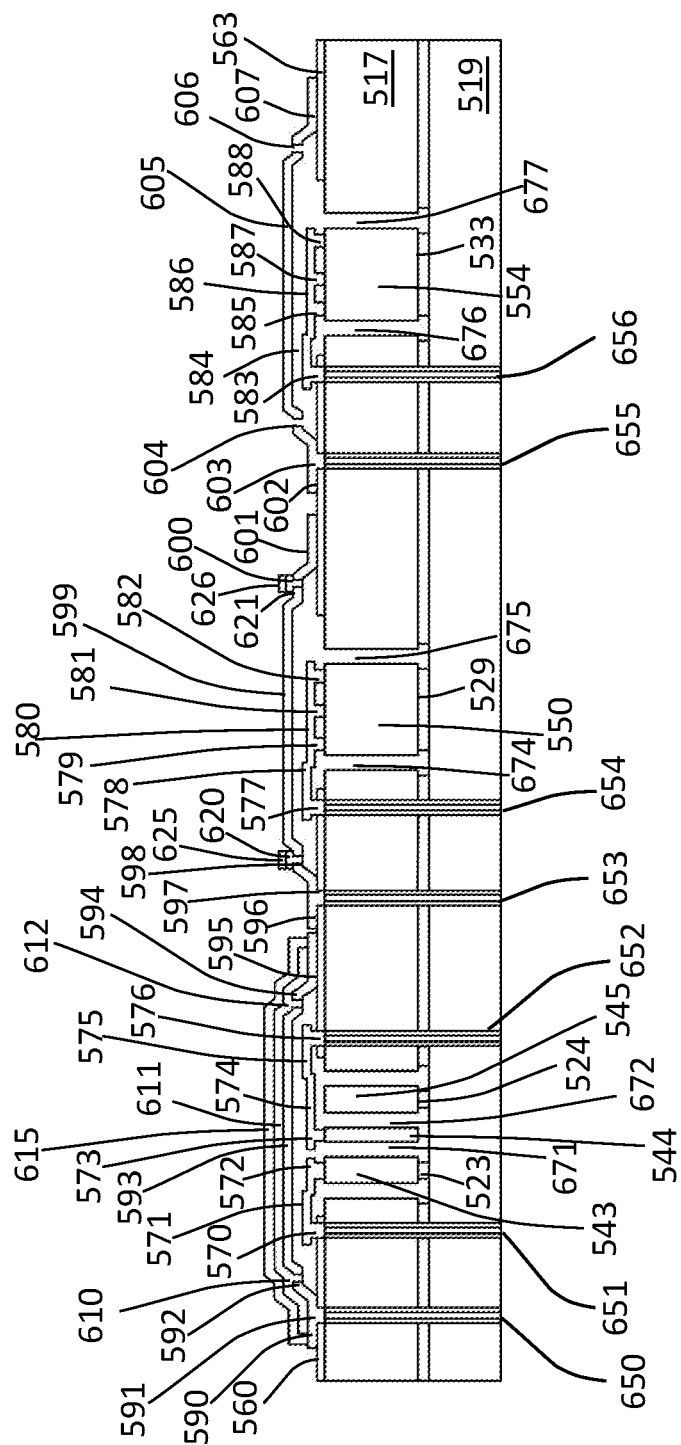

After the completion of the MIMS device 500, the substrate 516 is thinned to expose the vertical interconnects that are used to connect the electrodes of the sensors in the MIMS device 500 to an interface circuit. In one embodiment, the handle layer is thinned using mechanical removal (coarse grind, fine grind), dry etching, wet etching and a combination to expose the vertical interconnects on the back side of the substrate 515. This is illustrated in FIG. 28, when the backside thinning process exposes the conductors in the vertical interconnects 650, 651, 652, 653, 654, 655 and 656.

Figure 29:
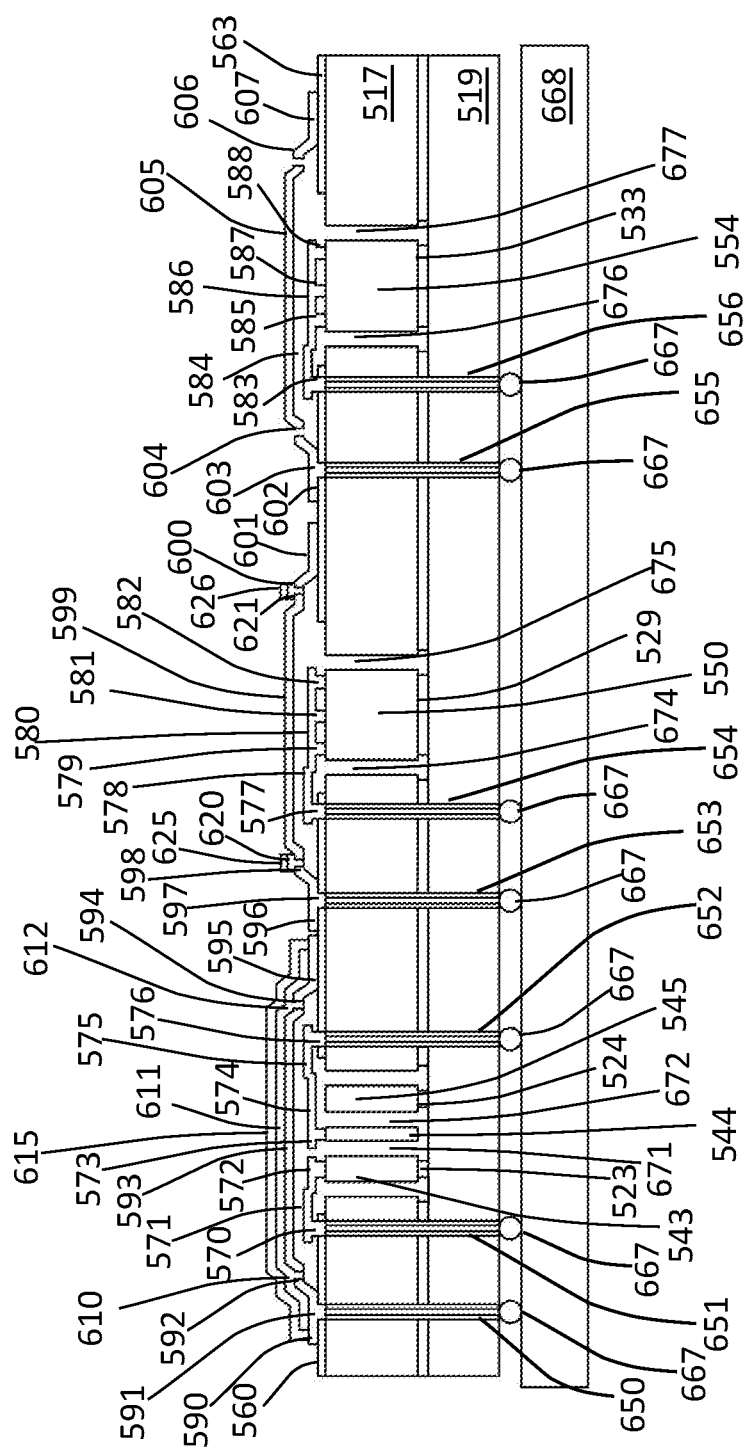

The thinned wafer is then connected to an interface circuit 668 by using a bond process that produces a low resistance connection between the electrodes of the sensors in MIMS device 500 to a corresponding connection in the interface circuit 668. This is illustrated in FIG. 29, where the substrate 516 containing the MIMS device 500 is connected to the interface circuit 668 with bond connections 667. In one embodiment, the bond connections are formed using Gold/Tin eutectic solder. Other solder connections may be used in other embodiments such as Tin/Copper, Tin/Silver and the like. The connection of the MIMS device 500 to the interface circuit may be done at the die to die, or die to wafer or wafer to wafer. In one embodiment, the attachment of the MIMS device 500 die to the interface circuit is performed at the die to die level.

Figure 30:
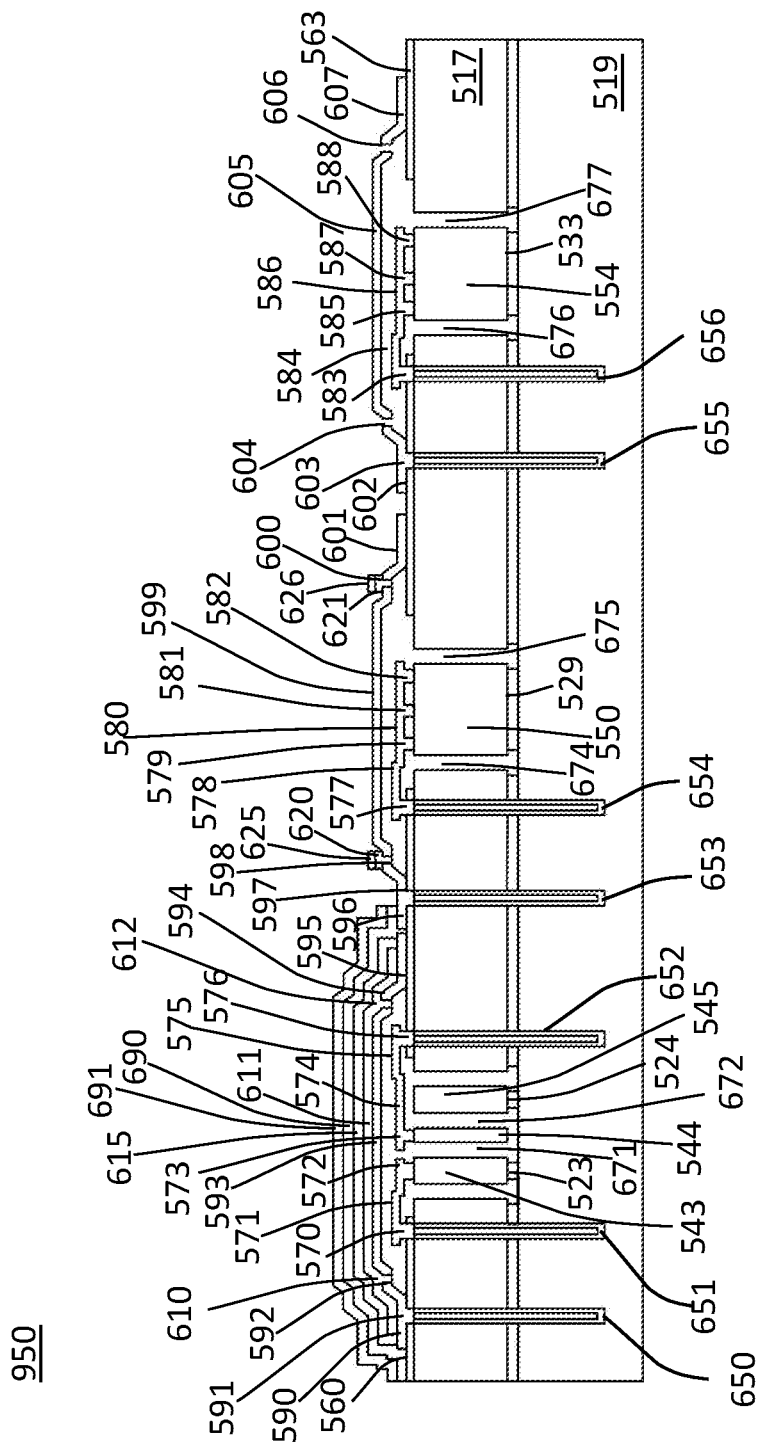
FIG. 30 illustrates a simplified cross view of a MIMS device (Monolithically Integrated Multi-Sensor) in accordance with an example embodiment.

FIG. 30 illustrates a simplified cross-sectional view of an example embodiment 950 for MIMS device 500 in which the layers 664 and 665 are used in the accelerometer 502 over the cap 593 to increase the mechanical stiffness of the protective cap since the layers used for the implementation are 593, 611, 615, 690 and 691. Since the mechanical stiffness of the cap increase as the cubic power of the thickness, the increase of the cap structure to include 690 and 691 increases the stiffness. The same layers 664 and 665 are used for sealing the etch holes 598 and 600 of the diaphragm 599 of the pressure sensor 504. Thus, layers 664 and 665 are used in the accelerometer 502 to increase the mechanical stiffness of the cap structure and for sealing of the etch holes 598 and 600 for the diaphragm 599 of the pressure sensor 504.

Figure 31:
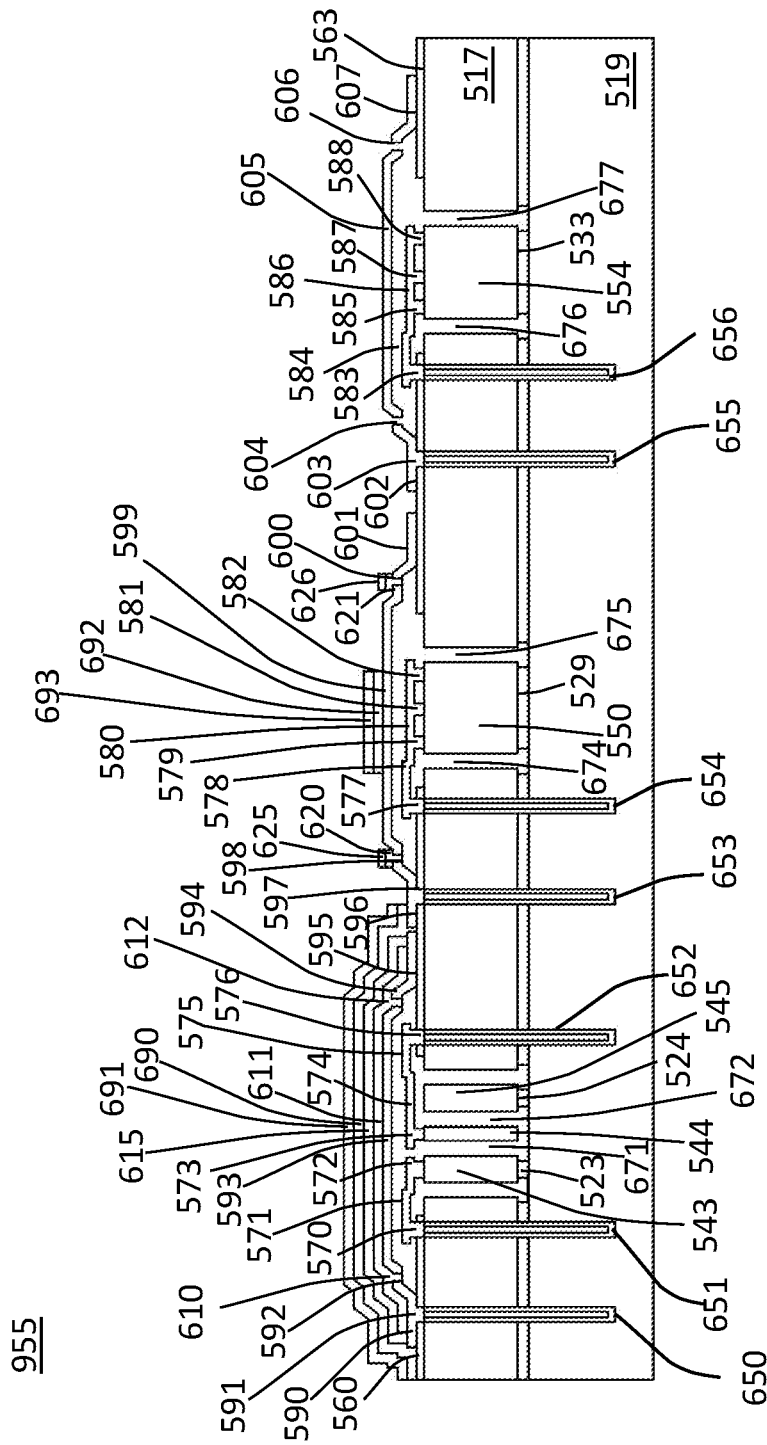
FIG. 31 illustrates a simplified cross view of a MIMS device (Monolithically Integrated Multi-Sensor) in accordance with an example embodiment.

FIG. 31 illustrates a simplified cross-sectional view of an example embodiment 955 for MIMS device 500 in which the layers 664 and 665 are used in the accelerometer 502 over the cap to increase the mechanical stiffness of the cap as well as in the pressure sensor 504 both for sealing the cavity below the diaphragm but also to improve the performance of the pressure sensor. In this implementation, the layers 664 and 665 are used over the cap of the accelerometer to increase the mechanical strength as shown in FIG. 30. In the pressure sensor 504, the layers 664 and 665 are used for sealing the etch holes 598 and 600 to form the sealed cavity below the diaphragm 599. In the alternate embodiment 955, the layers 664 and 665 are used for forming a boss or rigid structure on top of the pressure sensitive diaphragm. Thus, the boss or rigid center structure is formed by structural components 692 and 693 using layers 664 and 665. The boss formed by structural components 692 and 693 improves the linearity of the pressure sensor response to an applied pressure so that the capacitance formed by the rigid boss of the pressure sensor diaphragm 599 and the static or reference electrode 580 shows a more linear response. Thus, in the implementation of FIG. 31, the layers 664 and 665 are used in the accelerometer 502 to increase the stiffness of the static component (cap) 593 and in the pressure sensor 504 to seal the etch holes 598 and 600 to form a vacuum below the diaphragm and in the dynamic component (the pressure sensitive diaphragm) 599 to form a boss or rigid center to improve the linearity of the pressure sensor 504.

Figure 32:
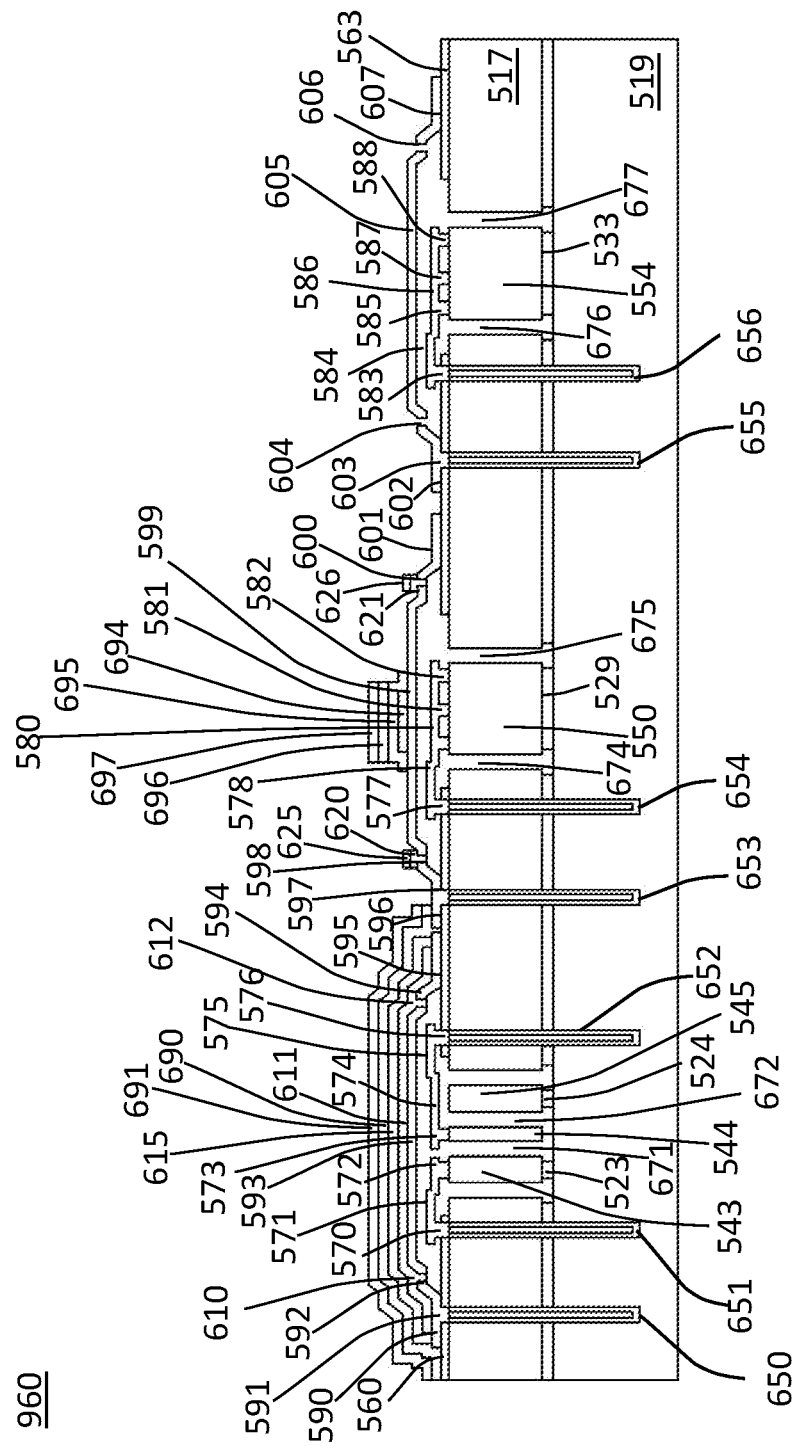
FIG. 32 illustrates a simplified cross view of a MIMS device (Monolithically Integrated Multi-Sensor) in accordance with an example embodiment.

FIG. 32 illustrates a simplified cross-sectional view of an example embodiment 960 for MIMS device 500 in which the layers 662, 663, 664 and 665 are used in the accelerometer 502 as well in the pressure sensor 504. In this implementation, layers 662 and 663 are used in the accelerometer 502 to seal the etch holes 592 and 594 so as to seal the cavity under the cap structural component 593. These layers 662 and 663 are formed over the cap structural component to impart rigidity and prevent any motion of the cap structure. In the pressure sensor 504, the layers 662 and 663 are used to form components 694 and 695 of a boss or rigid structure over the dynamic structural component (diaphragm 599) to improve the linearity of the pressure sensor. Thus, layers 662 and 663 are used in the accelerometer 502 to form static or rigid structural components 611 and 615 over the cap structural component 593 and in the pressure sensor 504, to form dynamic structural components 694 and 695 of the boss or rigid center of the dynamic structural component (diaphragm 599).

Layers 664 and 665 are used for sealing the etch holes 598 and 600 of the pressure sensor diaphragm 599 and also for forming components 696 and 697 of the boss or rigid center over the dynamic structural component (diaphragm 599) to improve the linearity of the pressure sensor. In the accelerometer 502, the layers 664 and 665 are used to form rigid or static structural components to improve the rigidity of the cap 593 of the accelerometer 502. Thus, layers 664 and 665 are used in the accelerometer 502 to form static or rigid structural components 690 and 691 over the cap structural component 593 and in the pressure sensor 504, to form dynamic structural components 696 and 697 of the boss or rigid center of the dynamic structural component (diaphragm 599) and static structural components (plugs 620, 621 625 and 626 over etch holes 598 and 600.

Figure 33:
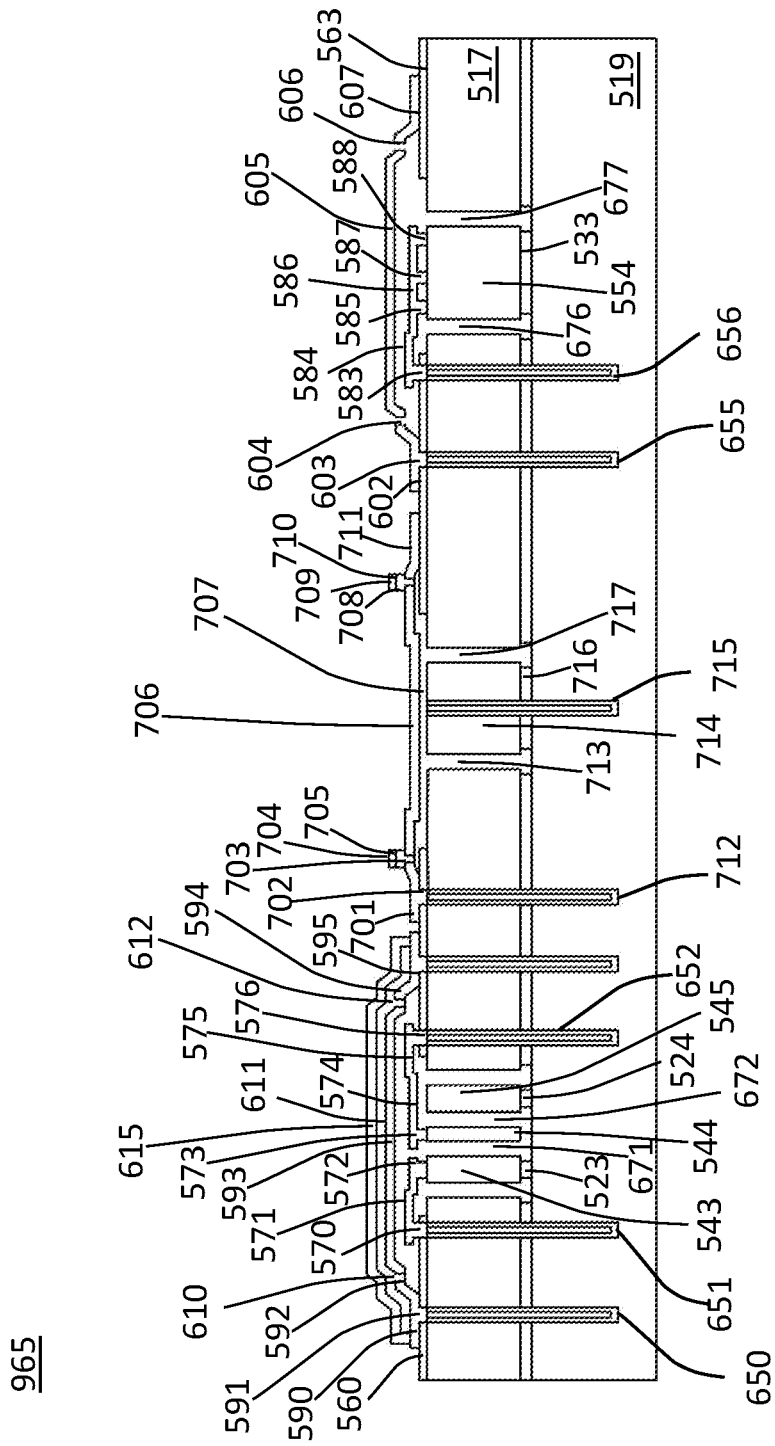
FIG. 33 illustrates a simplified cross view of a MIMS device (Monolithically Integrated Multi-Sensor) in accordance with an example embodiment.

FIG. 33 illustrates a simplified cross-sectional view of an example embodiment 965 where layer 660 is used for the implementation of static and dynamic structural components in the accelerometer 502, pressure sensor 504 and microphone 506 while the accelerometer 502 and microphone 506 is formed as in MIMS device 500.

For the accelerometer 502, the device layer 517 is used for the static and dynamic structural components 543, 544 and 545. The device layer also supports the protective cap 593 formed by layers 661, 662 and 663.

For the pressure sensor 504, the device layer 517 is used as the static or reference electrode 714 and connected to the vertical interconnect 715. The device layer 517 is also used to support the diaphragm formed by layer 660. The reference electrode 714 is defined by etching trenches 713 and 717.

For the microphone 506, the device layer 517 is used for the static or reference electrode 554 for the microphone and connected to vertical interconnect 656.

The polysilicon layer 660 is used in the accelerometer 502 for the formation of the static and dynamic structural components of the accelerometer.

The polysilicon layer 660 is used in the pressure sensor 504 for the formation of the pressure sensitive diaphragm 706 that is a dynamic structural component responding to the pressure applied to the diaphragm and separated from the static or reference electrode formed by device layer component 714 by gap 707. In this implementation, the poly layer is used to form a diaphragm that is suspended above the static electrode 714 formed by the device layer 517 and supported on the edges by anchor 701 and 711 and connected to the vertical interconnect 715 by contact region 702. The etch holes 703 and 708 are used to remove the sacrificial layer between the diaphragm 706 and the static electrode 714. These etch holes 703 and 708 are sealed using layers 664 and 665 to form plugs comprising 704 and 705 and 709 and 710 so that the cavity below the diaphragm (dynamic structural component) formed by layer 660 is at a vacuum and therefore able to respond to the pressure applied to diaphragm 706. In this implementation, the layer 660 is used for the dynamic structural component (diaphragm) 706 of the pressure sensor.

The polysilicon layer 660 is used in the microphone 506 to form the static or reference electrode 586 for the capacitive microphone which uses the polysilicon layer 661 to form the sound sensitive membrane.

Thus, in the implementation of the device 965, the device layer 517 is used as the static and dynamic components of the accelerometer, the reference electrode of the pressure sensor and a component of the reference electrode for the microphone. The polysilicon layer 660 is used for the formation of static and dynamic components of the accelerometer, the dynamic structural component (diaphragm) of the pressure sensor and a component of the reference electrode for the microphone.

Figure 34:
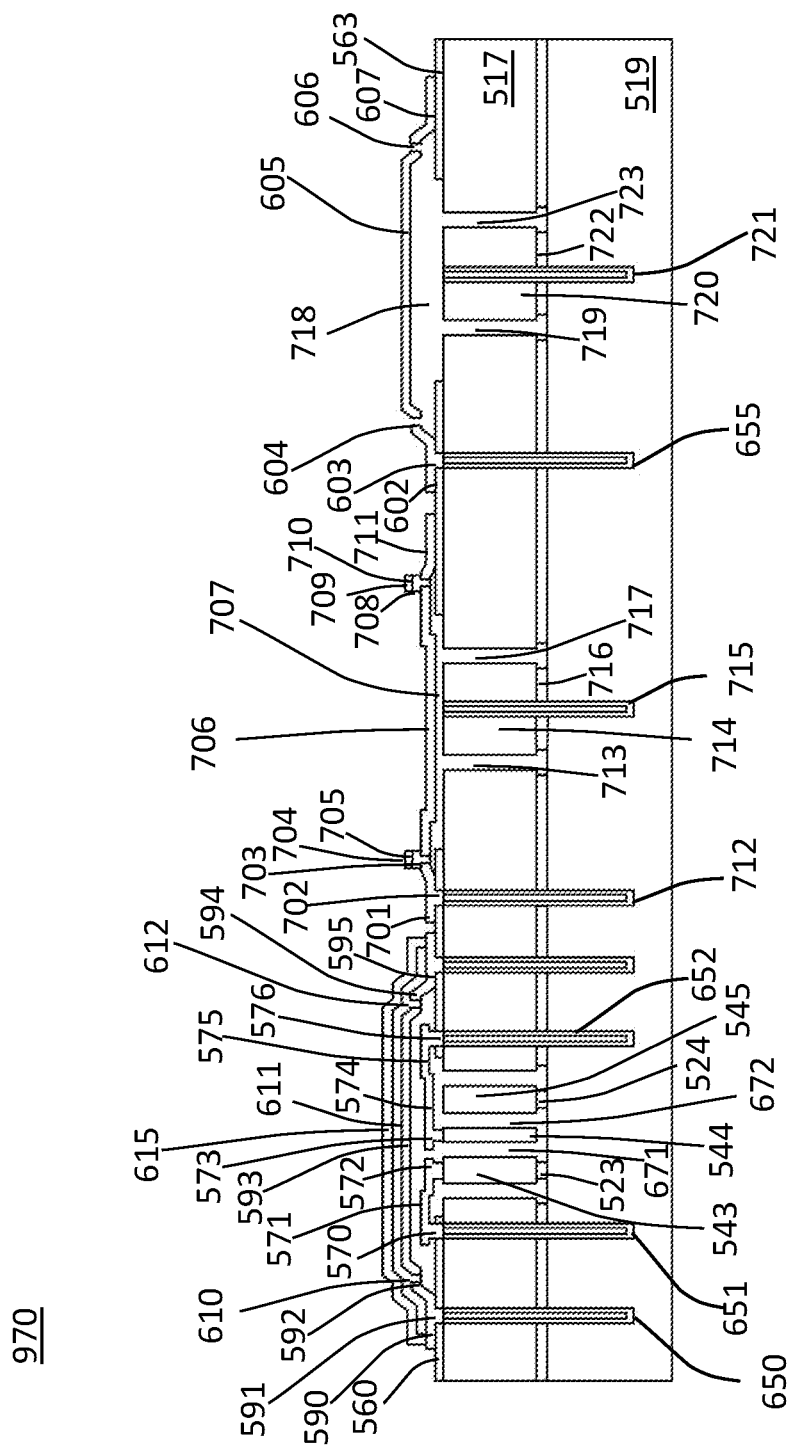
FIG. 34 illustrates a simplified cross view of a MIMS device (Monolithically Integrated Multi-Sensor) in accordance with an example embodiment.

FIG. 34 illustrates a simplified cross-sectional view of an embodiment 970 for MIMS device 965 where the polysilicon layer 660 is used in the accelerometer and pressure sensor but removed in the microphone. In this implementation, the polysilicon layer is removed in the microphone so that the device layer 517 is used as the static or reference electrode and the polysilicon layer 661 is used to form the sound sensitive membrane. The static or reference electrode 720 is formed by etching trenches 719 and 723 and is anchored by BOX 722. The electrode 720 is connected to the vertical interconnect 721. By removing the poly layer 660, the gap 718 between the dynamic structural component (sound sensitive membrane) 605 is enabled to deflect over a larger distance and this results in the increase of the dynamic range of the microphone.

Figure 35:
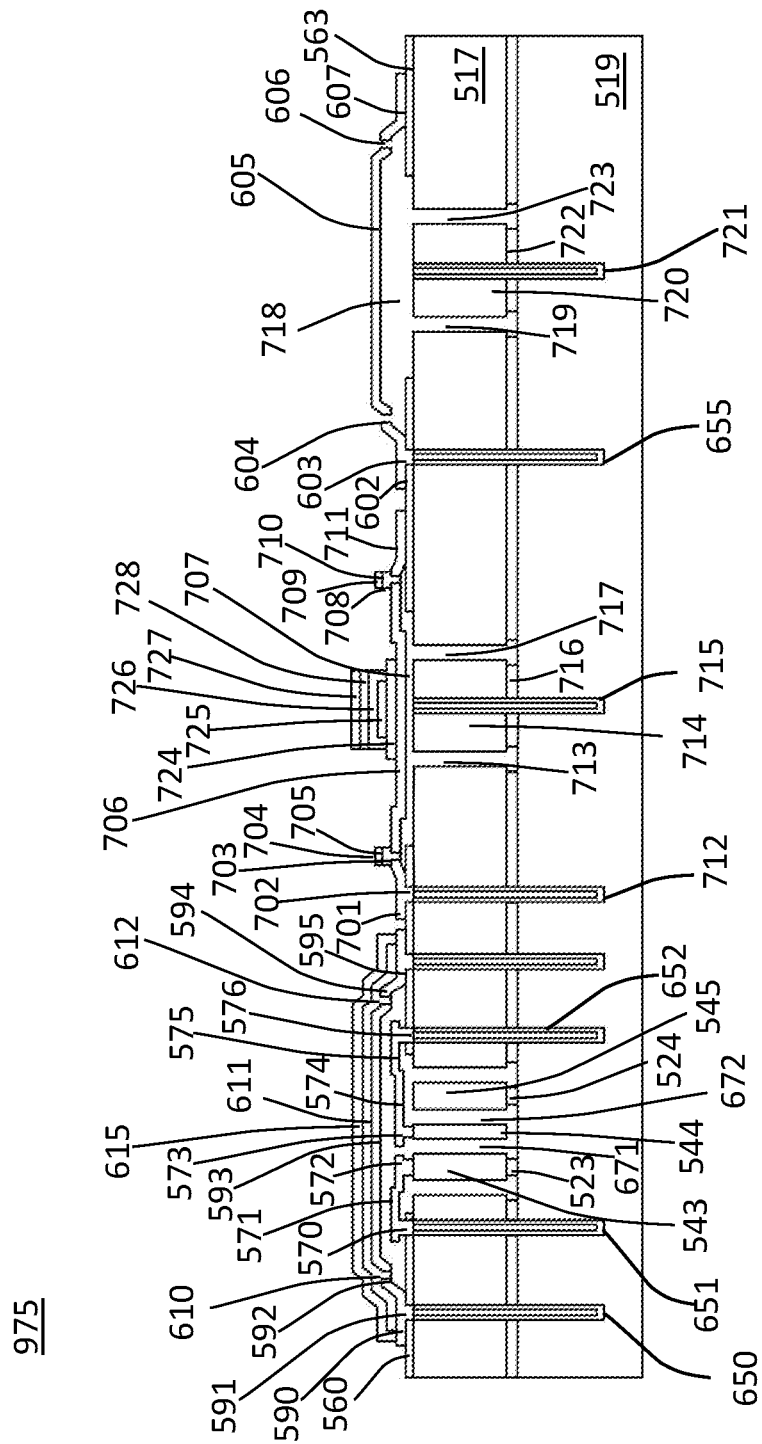
FIG. 35 illustrates a simplified cross view of a MIMS device (Monolithically Integrated Multi-Sensor) in accordance with an example embodiment.

FIG. 35 illustrates a simplified cross-sectional view of an example embodiment 975 for MIMS device 970 where the polysilicon layer 661 is used in the pressure sensor to form a boss or rigid center 724 for a dynamic structural component (diaphragm) 706 formed by the polysilicon layer 660. The other layers used for the boss or rigid center include layers 662, 663, 664 and 665 forming components 725, 726, 727 and 728 of the boss or rigid structure to improve the linearity of the deflection of the diaphragm 706.

Figure 36:
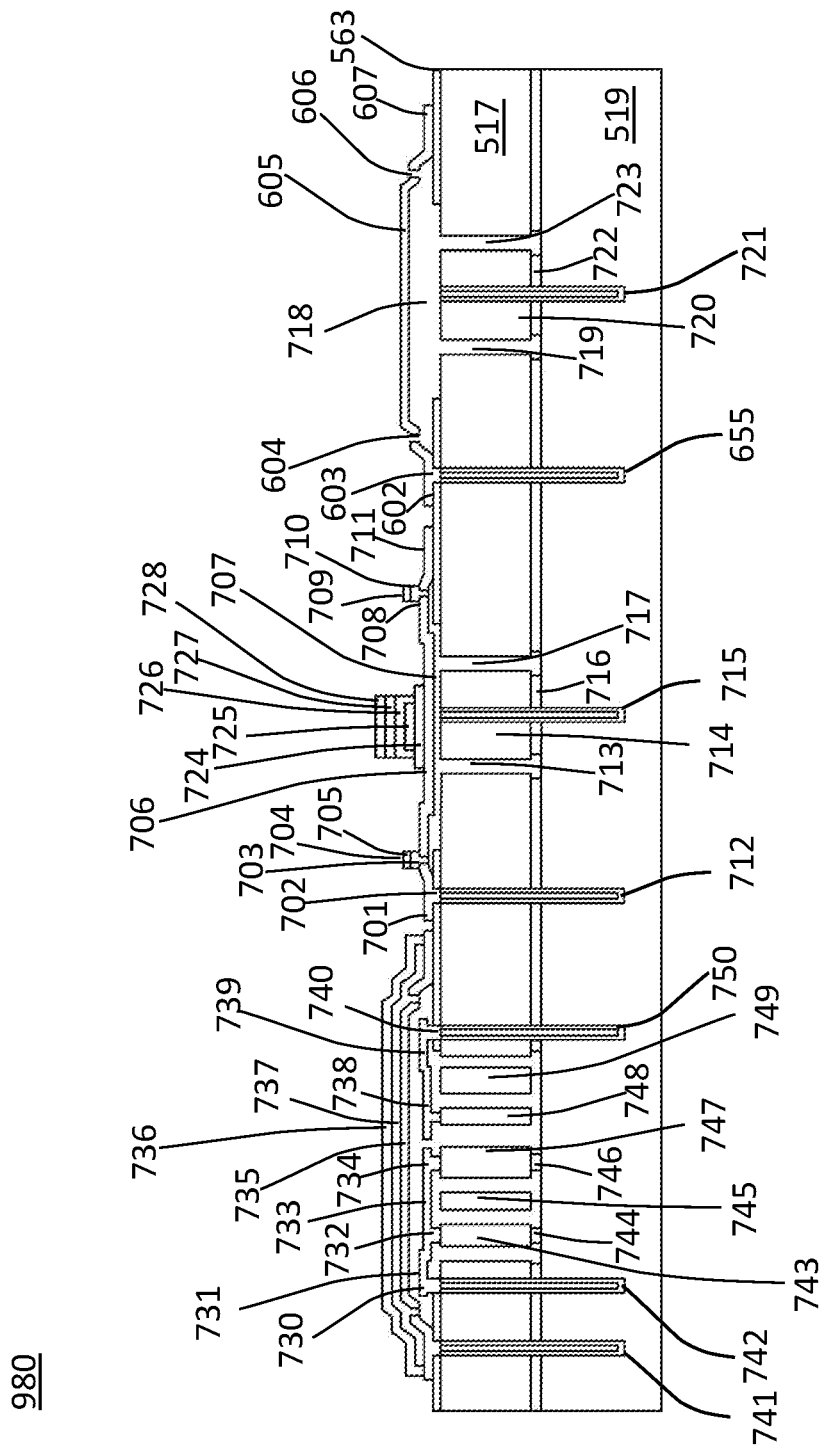
FIG. 36 illustrates a simplified cross view of a MIMS device (Monolithically Integrated Multi-Sensor) in accordance with an example embodiment.

FIG. 36 illustrates a simplified cross-sectional view of an example embodiment 980 for MIMS device 975 where the layers 517 and 660 are used to implement an acceleration sensor that responds to acceleration in the z-axis (in a direction perpendicular to the surface of the substrate. In this implementation, device layer 517 is used to form structural elements 743 and 747 that are static being anchored to the handle layer by the buried oxide anchors 744 and 746. The device layer 517 is also used to form dynamic structural components 745, 748 and 749 which form the proof mass (that moves under the inertial force-in this case, acceleration), the sensing plate and other dynamic components. The dynamic structural components are free to move vertically since the buried oxide components below them are removed. Dynamic structural component 745 represents a sensing plate, while 748 and 749 represents the proof mass. The static structural component 743 is connected to the vertical connect 742.

The poly layer 660 is used to form static and dynamic structural components of the vertical axis accelerometer. In this implementation, the structural component 733 forms a static or reference plate, being anchored to the handle layer by anchor region 730 and 734. The static or reference plate is also connected to the vertical interconnect 742 by bridge interconnect 731. The poly layer 660 is used in the dynamic structural component 748 to form a suspension spring 738 for the proof mass formed by 748 and 749 connected to an anchor 740 which is also connected to the vertical interconnect 750 by a bridge 739.

When the dynamic components of the accelerometer 745, 748 and 749 are subjected to an acceleration in the direction perpendicular to the surface of the substrate, the proof mass being suspended by the spring 738 moves towards the fixed or reference plate formed 733 by the polysilicon layer 660. This movement of the dynamic structural components also causes the sensing plate 745 to move towards the static or reference plate 733 formed by the poly layer 660. This movement may be linear or torsional depending on the design of the suspension spring 738 formed by polysilicon layer 660. Since the gap between the dynamic structural component (sensing plate) 745 formed by the device layer and the static structural component (reference plate or electrode) 733 is changed, the capacitance is changed in proportion to the input acceleration. More than one pair of plates can be formed for the z-axis accelerometer to provide differential measurements of the input acceleration.

The accelerometer in FIG. 36 thus uses the device layer 517 to form static and dynamic structural components for the z-axis accelerometer, and uses polysilicon layer 660 to form the static reference plate and the spring suspension for the static and dynamic structural components of the z-axis accelerometer. Thus, it is evident to those skilled in the art that the structural layers used in MIMS device 980 can be used to form both lateral and z-axis accelerometers.

Figure 37:
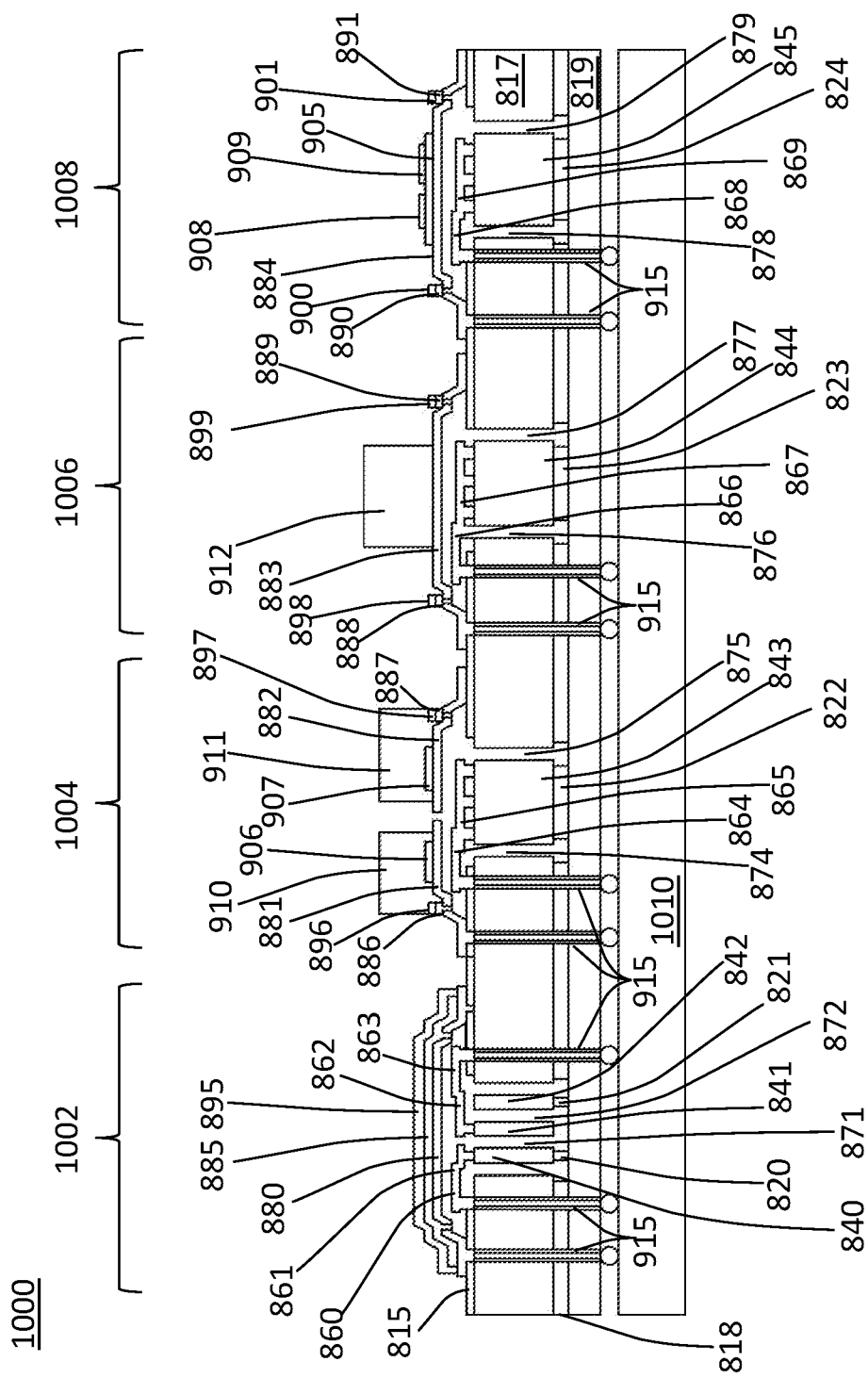
FIG. 37 illustrates a simplified cross view of a MIMS device (Monolithically Integrated Multi-Sensor) in accordance with an example embodiment.

FIG. 37 shows a simplified cross-sectional view of a MIMS device 1000 that consists of multiple devices that are formed on the same substrate, using the same layers used in FIG. 5B for implementation of MIMS device 500 and the principle of parallel design. The device 1000 also uses some additional layers for implementation of multiple sensors on the same substrate with added capability. Thus, in this embodiment, device 1000 consists of a magnetic sensor 1002, infra-red sensor 1004, force sensor 1006 and humidity sensor 1008.

Device 1000 is formed on a substrate comprising a handle layer 819, buried oxide layer 818 and device layer 817. The handle layer 819 is used to provide mechanical support for the sensor 1002, 1004, 1006 and 1008. In this implementation, the buried oxide layer 818 is used to form anchors 820 and 821 for the static structural components 840 and 842 for the magnetic sensor, and is removed below the dynamic structural component 841. In the infra-red sensor 1004, the buried oxide layer is used to form an anchor 822 for the static component 843. In the force sensor 1006, the buried oxide layer is used to form an anchor 823 for the static or reference component 844. In the humidity sensor 1008, the buried oxide layer is used to form an anchor 824 for the static or reference component 845.

The device layer 817 is used for device 1000 for the implementation of static and dynamic components of the magnetic sensor 1002, infra-red sensor 1004, force sensor 1006 and humidity sensor 1008.

In the magnetic sensor 1002, device layer 817 is used for the static structural components 840 and 842, which acts as reference electrodes for capacitances using gaps 871 and 872 that are formed with the dynamic component 841 which is suspended by a suspension spring 862. When an electrical current is passed through the dynamic component 841, it deflects under the influence of an ambient magnetic field due to the Lorenz force. This deflection of the dynamic structural component 841 changes the gaps 871 and 872 which change the capacitances, and the change in capacitance from a reference position is a measure of the magnetic field. A fixed magnet may also be used to establish the initial reference position of the dynamic structural component 841 with a known electrical current.

In the infra-red sensor 1004, the device layer 817 is used to form a static structural component 843 that supports a reference heater for the infra-red sensor. The static structural component 843 is supported by the buried oxide anchor 822.

In the force sensor 1006, the device layer 817 is used to form a static structural component 844 that supports a reference electrode for the force sensor. The static structural component 844 is supported by the buried oxide anchor 823.

In the humidity sensor 1008, the device layer 817 is used to form a static structural component 845 that supports a reference heater for the humidity sensor. The static structural component 845 is supported by the buried oxide anchor 824.

In the device MIMS 1000, the layer 815 is an isolation layer to provide electrical isolation between different static and dynamic components that are at different electrical potentials for the magnetic sensor 1002, infra-red sensor 1004, force sensor 1006 and humidity sensor 1008.

In the device 1000, the polysilicon layer 660 used in MIMS device 500 is a structural layer used for the static and dynamic structural components of the magnetic sensor 1002, infra-red sensor 1004, force sensor 1006 and humidity sensor 1008. The polysilicon layer 660 is a LPCVD polycrystalline silicon or polysilicon layer. Layer represented by 660 is a conductive layer.

In the magnetic sensor 1002, the polysilicon layer 660 is used to form a bridge or interconnect 860 to connect the static structural component 861 to the vertical interconnect 915. Layer 660 is also used to form a plate structure 861 to act as a reference or static electrode for the magnetic sensor 1002. The layer 660 is used to form the suspension spring 862 and a bridge connection 863 to connect the dynamic structural component 841 to and also connect it to an anchor which is connected to the vertical interconnect 915. The suspension spring 862 also enables the injection of the device current to interact with the magnetic field.

In the infra-red sensor 1004, the layer 660 is used to form a static structural component that is connected to the vertical interconnect 915 by a bridge interconnect 864 and also forms a suspended heater 865 that is used as a reference for the infra-red sensor.

In the force sensor 1006, the layer 660 is used to form a static structural component that is connected to the vertical interconnect 915 by a bridge interconnect 866 and also to form a static plate or reference electrode 867 for the capacitance force sensor.

In the humidity sensor 1008, the layer 660 is used to form a static structural component that is connected to the vertical interconnect 915 by a bridge interconnect 868 and also forms a suspended heater 869.

In the device 1000, the layer 661 is the structural layer in MIMS device 500 and used for the static and dynamic structural components of the magnetic sensor 1002, infra-red sensor 1004, force sensor 1006 and humidity sensor 1008. Layer 661 is a LPCVD polycrystalline silicon or polysilicon layer used in device 500. Layer 661 is a conductive layer.

In the magnetic sensor 1002, the layer 661 is used to form a protective cap over the static and dynamic structural components. Layer 661 is used to form the static protective cap structure 880 which protects the static and dynamic structural components of the magnetic sensor and is connected to the vertical interconnect 915. The layer 661 may also be used to form pillars, post, walls to increase the mechanical stiffness of the protective cap 880. The layer 661 may also be used to form etch holes that are subsequently sealed to enclose the cavity below the cap structure 880 in a fixed atmosphere.

In the infra-red sensor 1004, the layer 661 is used to form the elements of the infra-red sensor. Thus, 881 and 882 are used to form a suspended static structure that has two junctions to form a thermopile. By suspending the structural components 881 and 882, the thermal resistance is improved and the thermal isolation increased. The static structural component 881 is connected to the vertical interconnect 915.

In the force sensor 1006, the layer 661 is used to form a dynamic structural component that responds to the applied force. The dynamic structural component 883 is a plate or diaphragm is suspended above the reference plate or electrode formed by 867. The diaphragm 883 is supported by anchor structures in the periphery and connected to the vertical interconnect 915. The diaphragm moves downwards when a force is applied so that the gap between the diaphragm 883 and the reference electrode 867 is reduced and the capacitance increases. The change in capacitance is a measure of the force applied on 883.

In the humidity sensor 1008, the layer 661 is used to form a static structural component of the humidity sensor. The static structural component 884 is used to form a suspended reference plate or electrode for the capacitive humidity sensor. The reference plate 884 is connected to the vertical interconnect 915.

The layer 664 used in MIMS device 500 is a layer used for the static and dynamic structural components of device 1000. Layer 664 is an insulating layer. In the magnetic sensor 1002, the layer 664 is used to seal the etch holes in the structural component 880 so that the cavity below is sealed at a vacuum. The component 885 combines with cap structure 880 to protect the static and dynamic structural components of the magnetic sensor from the external atmosphere while still coupling with the magnetic fields. In the infra-red sensor 1004, the layer 664 is used to seal the etch holes in the structural components 881 and 882 using plugs 886 and 887. In the force sensor 1006, the layer 664 is used to seal the etch holes in the structural component 883 so that the cavity below is sealed at a vacuum. The components 888 and 889 seals the etch holes in the cap structure 883 to protect the static structural components of the force sensor from the external atmosphere. In the humidity sensor 1008, the layer 664 is used to seal the etch holes in the structural component 884 so that the cavity below is sealed at a vacuum. The components 890 and 891 seals the etch holes in the cap structure 884 to protect the static structural components of the humidity sensor from the external atmosphere.

In the device 1000, the layer 665 used in MIMS device 500 is another layer used for the static and dynamic structural components. Layer 665 is an insulating layer.

In the magnetic sensor 1002, the layer 665 is used to protect the static and dynamic structural components of the sensor. The component 895 combines with cap structure 880 and 885 to protect the static and dynamic structural components of the magnetic sensor from the external atmosphere while still coupling with the magnetic fields.

In the infra-red sensor 1004, the layer 665 to is used to seal the etch holes in the structural components 881 and 882. The layer 665 is used to form plugs 896 and 897 above the sealing plugs 886 and 887.

In the force sensor 1006, the layer 665 is used to seal the etch holes in the structural component 883 so that the cavity below is sealed at a vacuum. The components 898 and 899 combines with 888 and 889 and cap structure 883 to protect the static structural components of the force sensor from the external atmosphere.

In the humidity sensor 1008, the layer 665 is used to seal the etch holes in the structural component 884 so that the cavity below is sealed at a vacuum. The components 900 and 901 combines with component 890 and 891 and with cap structure 884 to protect the static structural components of the humidity sensor from the external atmosphere.

In the implementation of the MIMS device 1000, the layers used in MIMS 500 are used. In addition to these layers, some additional layers are used to implement additional sensors.

Layer 905 is an additional layer used for the implementation of the humidity sensor 1008. The layer 905 is a layer used in device 1000 in addition to the layers used in device 500, to enable the formation of the humidity sensor. Layer 905 is a polyimide layer that is sensitive to the change in the humidity and which changes its dielectric constant with the ambient humidity. Structural component 905 is a polyimide layer that changes its dielectric constant with the ambient humidity in the humidity sensor 1008.

Another layer used in the implementation of sensors in MIMS device 1000 is a metallic layer. The layer is a metallic layer such as tantalum, platinum, titanium and the like which is used for the implementation of the infra-red sensor 1004 and the humidity sensor 1008.

In the infra-red sensor 1004, the metallic layer is used to form the structural component 906 and 907 which forms the junctions with the layer 661, which is a doped polysilicon layer. The metallic layer components 906 and 907 formed by the metallic layer is chosen to have a large difference in Seebeck coefficients so that the voltage difference between the two junctions is large and changes proportionally with the infra-red radiation that is being measured.

In the humidity sensor 1008, the metallic layer is used to form the static structural components that form the upper plate or electrode 908 and 909 of the capacitance that is formed with the structural component 884 as the lower plate or electrode and the polyimide humidity sensitive dielectric 905 between 908 and 909 and 884. The components 908 and 909 may be used in the humidity sensor 1008 in the shape of fingers, plates, plates with holes to allow access for the ambient humidity to the underlying polyimide dielectric component 905.

The metallic layer may also be used in the device 1000 for the magnetic sensor 1002 to form a protective layer over the cap structural component 880. If the metallic layer is a magnetic layer such as Nickel, it may be used in magnetic sensor 1002 to form a reference magnet.

Another layer is used in the device 1000 in addition to the layers used in device 500. This layer is an insulating layer used in the implementation of the device 1000. In this exemplary implementation, this layer is a thick oxide layer deposited by PECVD.

The insulating layer is used in the infra-red sensor 1004 to protect one of the junctions of the infrared sensor from the incident radiation. The structural components 910 and 911 are used to protect one of the junctions formed between the polysilicon layer 661 and metal components 906 and 907 so that the Seebeck voltage that is generated reflects the incident radiation.

The insulating layer is used in the force sensor 1006 to form a dynamic structural component 912 that combines with the dynamic structural component 883, which is the diaphragm. The layer insulating is used to form the force concentrator or force transmitter 912 that transmits the force being measured to the dynamic structural component 883. The force transmitted by 912 causes the diaphragm 883 to deflect towards the static or reference plate or electrode 867 effectively changing the gap and thereby the capacitance. The change in the capacitance due to the force transmitted as compared to a reference capacitance is a measure of the force being applied on 912.

The insulating layer may also be used in MIMS device 1000 for the magnetic sensor 1002 over the cap structure 880 to increase the mechanical strength of the cap structure.

In MIMS device 1000, it is evident that the layers used in MIMS device 500 is used to implement device 1000 along with the incremental addition of layers to implement magnetic sensor 1002, infrared sensor 1004, force sensor 1006 and humidity sensor 1008. It will be evident to those skilled in the art that the combination of layers from MIMS device 500 and MIMS device 1000 can be used for the parallel design and fabrication of multiple sensors with static and dynamic structural components. Thus, in the embodiments of MIMS device 500 and MIMS device 1000, a MIMS device can be implemented with an accelerometer, pressure sensor, microphone, magnetic sensor, infrared sensor, force sensor and humidity sensor. It will be further evident to those skilled in the art that these embodiments are illustrative of the parallel design and fabrication of multiple sensors that substantially share layers for the implementation of static and dynamic components for the implementation of different sensors that respond to physical, chemical and biological inputs.

Figure 38:
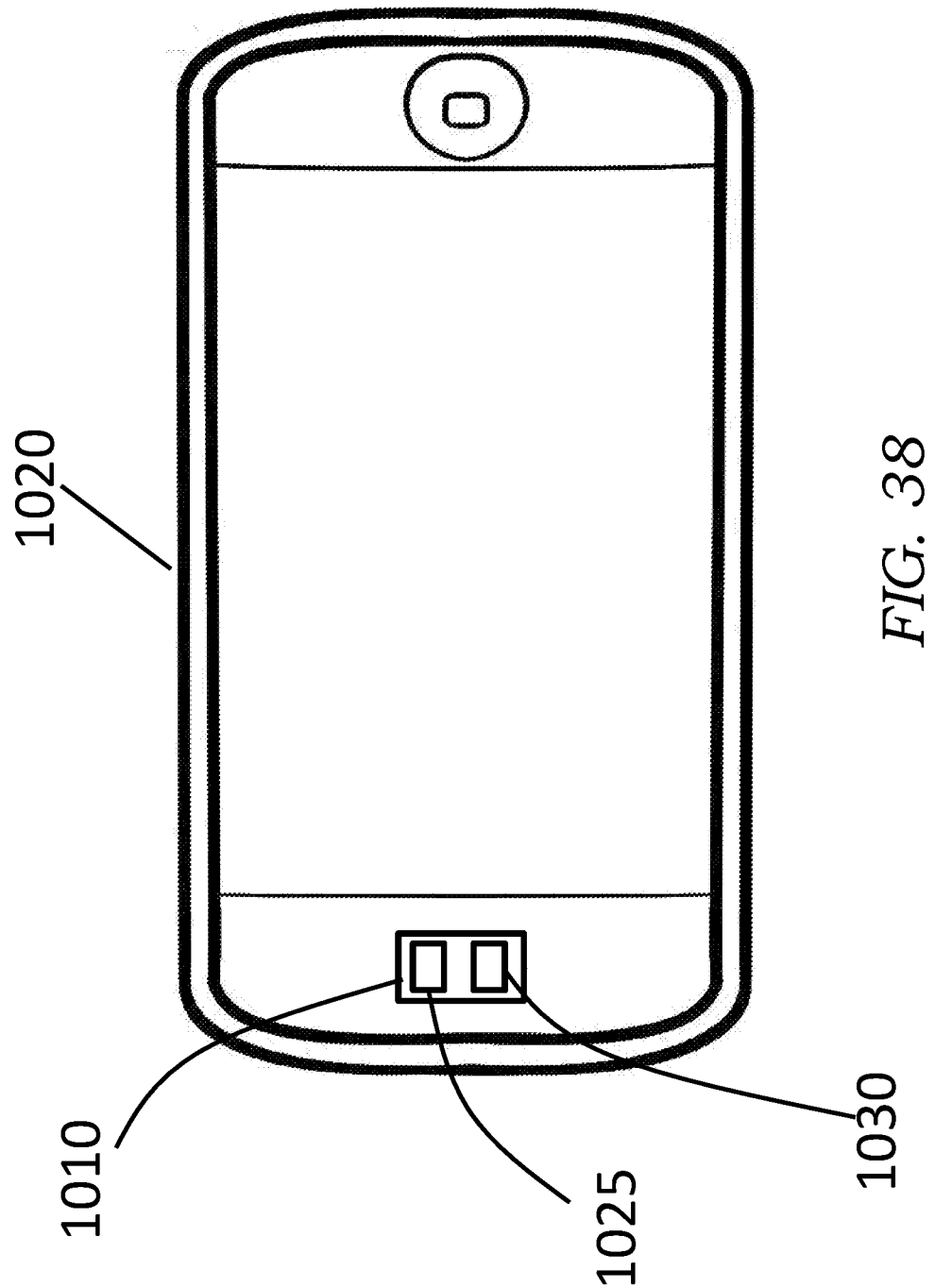
FIG. 38 illustrates a MIMS device (Monolithically Integrated Multi-Sensor) in a cellphone in accordance with an example embodiment.

FIG. 38 illustrates a MIMS device 1010 used in a cellphone 1020. The MIMS 1010 device comprises an indirect interface sensor comprising an accelerometer 1025 and a direct interface sensor comprising a microphone 1030.

Figure 39:
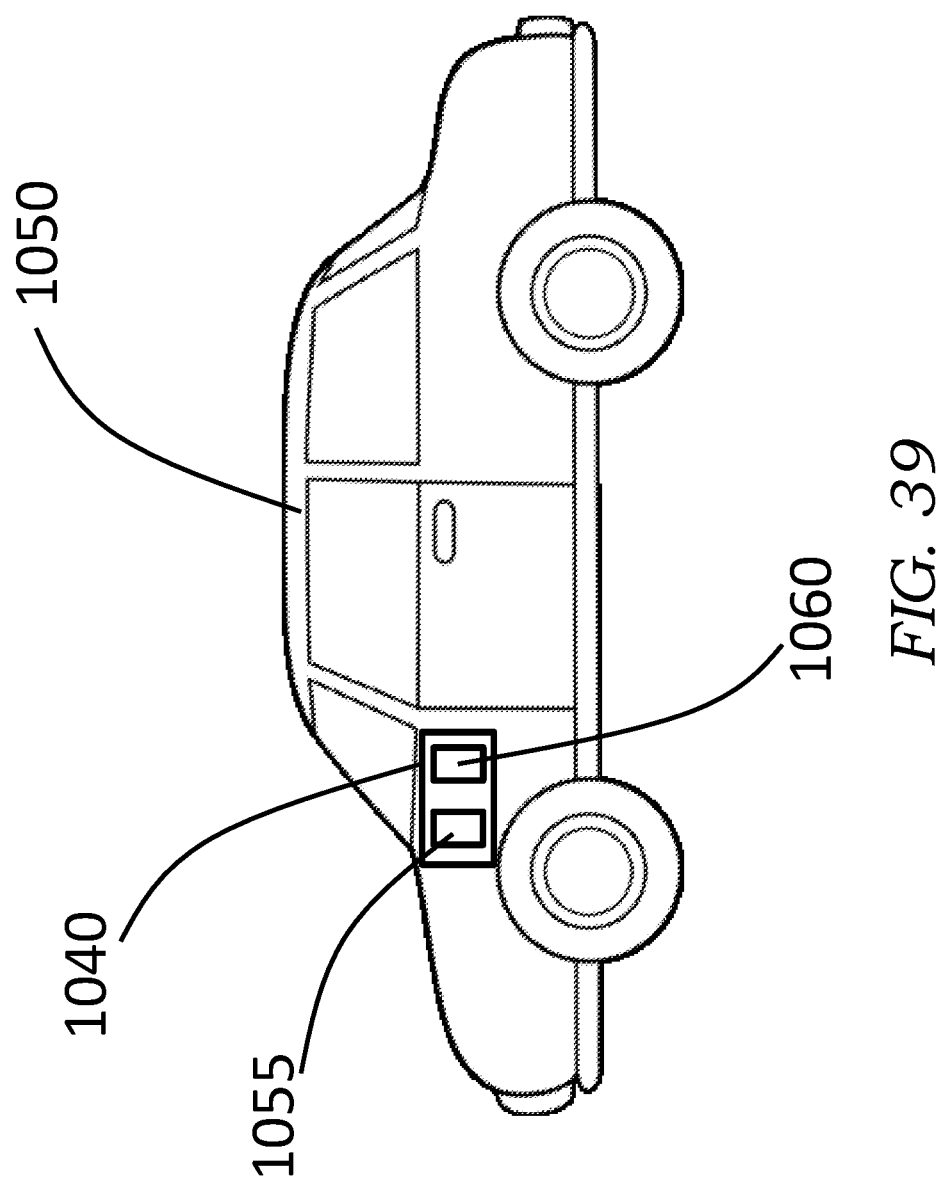
FIG. 39 illustrates a MIMS device (Monolithically Integrated Multi-Sensor) in a wearable device in accordance with an example embodiment.

FIG. 39 illustrates a MIMS device 1040 used in a transportation device 1050 such as a car. The MIMS device 1040 comprises an indirect interface sensor comprising an accelerometer 1055 and a direct interface sensor comprising a pressure sensor 1060.

Figure 40:
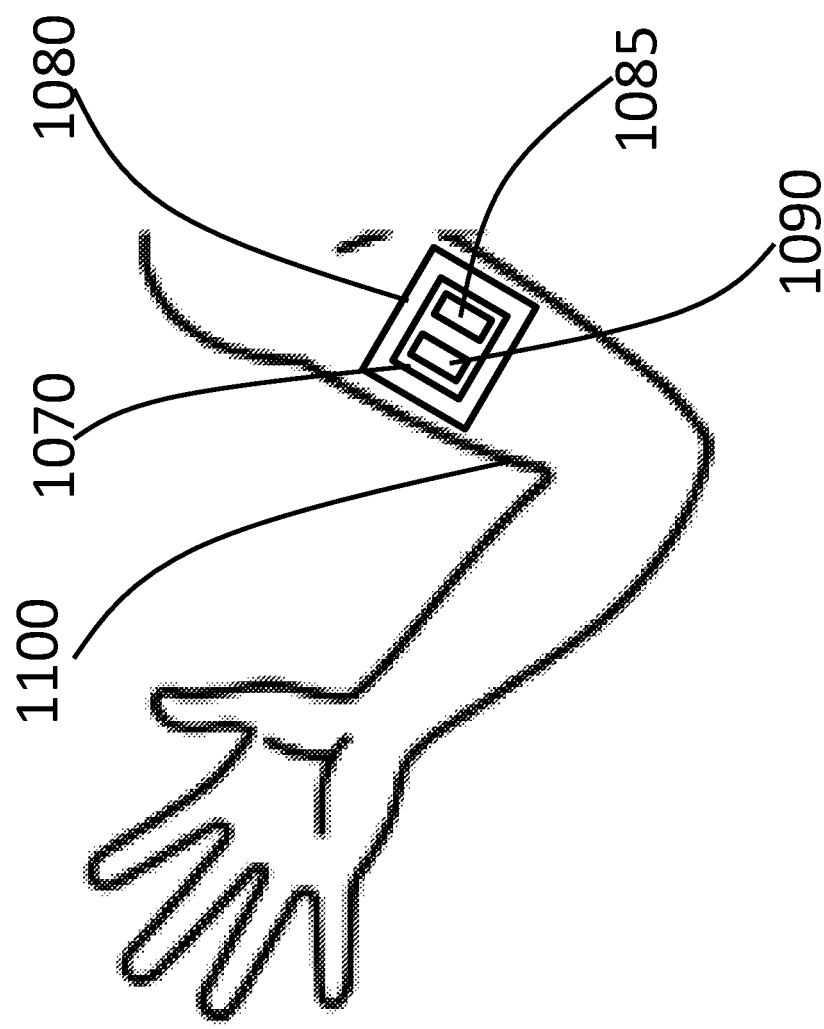
FIG. 40 illustrates a MIMS device (Monolithically Integrated Multi-Sensor) in a transportation device in accordance with an example embodiment.

FIG. 40 illustrates a MIMS device 1070 used in a wearable device 1080 such as an adhesive patch attached to an arm 1100. The MIMS device 1070 comprises an indirect interface sensor comprising an accelerometer 1085 and a direct interface sensor comprising a pressure sensor 1090.

From these embodiments, it will be evident to those skilled in the art that an integrated circuit can be formed with a plurality of sensors comprising a first sensor configured to measure a first parameter where the first parameter is configured to be directly applied to the sensor and a second sensor configured to measure a second parameter where the second parameter is configured to be indirectly applied to the sensor where the first and second sensors are formed on a semiconductor wafer.

From these embodiments, it will be evident to those skilled in the art that an integrated circuit can be formed having a plurality of sensors comprising a first sensor and a second sensor where the first sensor is configured to directly measure a first parameter and the second sensor is configured to indirectly measure a second parameter where the first and second sensors are formed at the same time on a semiconductor substrate From these embodiments, it will be evident to those skilled in the art that a method is described of forming an integrated circuit having a plurality of sensors comprising a step of forming a direct sensor and an indirect sensor on a semiconductor substrate using photolithographic techniques From these embodiments, it will be further evident to those skilled in the art that an integrated circuit can be formed comprising a first sensor and a second sensor where the first sensor and second sensor share a layer in common and where the layer is configured to be rigid in the first sensor and where the layer is configured to flex in the second sensor.

From these embodiments, it will be further evident to those skilled in the art that an integrated circuit can be formed having a layer where the layer is common to a first sensor and a second sensor of the integrated circuit where a portion of the layer in the first sensor is configured not to move, where a portion of the layer in the second sensor is configured to move, and where the layer overlies a semiconductor substrate.

From these embodiments, it will be further evident to those skilled in the art that a method is described of forming an integrated circuit comprising the steps of forming at least a portion of a first sensor, forming at least a portion of a second sensor, depositing a layer overlying the first sensor and the second sensor, using photolithographic techniques to define the layer, etching the layer where the layer in the first sensor is configured not to move and where the layer in the second sensor is configured to move.

From these embodiments, it will be evident to those skilled in the art that an integrated circuit can be formed comprising a first sensor; and a second sensor where the first and second sensors are formed having a layer in common, where the layer seals a cavity in the first sensor, where the layer seals a cavity in the second sensor, where the cavity of the first sensor has a fixed volume and where a volume of the cavity of the second sensor is variable From these embodiments, it will be evident to those skilled in the art an integrated circuit can be formed comprising a first sensor and a second sensor formed overlying a semiconductor substrate, where the first and second sensors are formed having a layer in common, where the layer seals a cavity in the first sensor, where the layer seals a cavity in the second sensor, where at least a portion of the layer is removed, and where the cavity of the first sensor has a fixed volume and where the integrated circuit is configured to receive a stimulus that changes a volume of the cavity of the second sensor.

From these embodiments, it will be evident to those skilled in the art that an integrated circuit can be formed comprising a first sensor comprising a first cavity in a semiconductor substrate, a second sensor comprising a second cavity in the semiconductor substrate, a layer overlying the first cavity and the second cavity where the layer seals the first cavity having a fixed volume, where the layer seals the second cavity, where the layer is configured to receive a stimulus that changes a volume of the second cavity, and where the first sensor is one of an accelerometer, gyroscope, humidity sensor, magnetic sensor, flow sensor, light sensor, electrical field sensor, biological sensor, or chemical sensor While the present invention has been described with reference to particular embodiments, those skilled in the art will recognize that many changes may be made thereto without departing from the spirit and scope of the present invention. Each of these embodiments and obvious variations thereof is contemplated as falling within the spirit and scope of the invention.

What is claimed is:

1. A monolithically integrated multi-sensor (MIMs) comprising:
  a first integrated circuit comprising:
    a microphone configured to measure an parameter; and
    a first MEMs sensor configured to measure a first parameter; and
    a second MEMs sensor configured to measure a second parameter wherein the the first parameter, the second parameter and the parameter measured by the microphone are different and wherein the microphone, the first MEMs sensor, and the second MEMs sensor are formed on or in a single semiconductor substrate.

2. The MIMS of claim 1 wherein at least one of the microphone, the first MEMs sensor, or the second MEMs sensor is exposed to an external environment and wherein at least one of the microphone, the first MEMs sensor, or the second MEMs sensor is sealed from the external environment.

3. The MIMS of claim 1 wherein at least one layer of the first integrated circuit is shared in common with the microphone, the first MEMs sensor, and the second MEMs sensor and wherein at least a portion of the at least one layer is etched.

4. The MIMS of claim 1 wherein at least one layer of the first integrated circuit forms a cap on at least one of the microphone, the first MEMs sensor, or the second MEMs sensor and wherein the at least one layer of the first integrated circuit forms a moving plate on at least one of the microphone, the first MEMs sensor, or the second MEMs sensor.

5. The MIMS of claim 1 wherein the at least one layer of the first integrated circuit is configured to flex in at least one of the microphone, the first MEMs sensor, or the second MEMs sensor and wherein the at least one layer of the first integrated circuit is configured not to flex in at least one of the microphone, the first MEMs sensor, or the second MEMs sensor.

6. The MIMS of claim 1 wherein the first or the second MEMs sensors are sealed from an external environment at a different pressure.

7. The MIMS of claim 1 further including a third sensor configured to measure a third parameter wherein the first parameter, the second paremeter, and the third parameter, and the parameter of the microphone are different.

8. The MIMs of claim 1 wherein the first integrated circuit comprises at least two of an inertial sensor, a pressure sensor, a tactile sensor, a humidity sensor, a temperature sensor, a microphone, a force sensor, an IR sensor, a load sensor, a magnetic sensor, a flow sensor, a light sensor, an electric field sensor, an electrical impedance sensor, a galvanic skin response sensor, a chemical sensor, a gas sensor, a liquid sensor, a solids sensor, or a biological sensor.

9. The MIMS of claim 1 wherein at least one sensor of the microphone, the first MEMs sensor, or the second MEMs sensor is sealed by depositing a layer using low pressure chemical vapor deposition, plasma enhanced chemical vapor deposition, atmospheric pressure chemical vapor deposition, sub atmospheric chemical vapor deposition, physical vapor deposition, atomic layer deposition, metallo organic chemical vapor deposition, molecular beam epitaxy, sputtering, evaporating, spin-coating, electro-plating, or spray coating.

10. A monolithically integrated multi-sensor (MIMs) comprising:
a first integrated circuit comprising:
a microphone configured to measure an parameter; and
a first MEMs sensor configured to measure a first parameter;
a second MEMs sensor configured to measure a second parameter; and
a third MEMs sensor configured to measure a third parameter wherein the first parameter, the second parameter, the third parameter, and the parameter measured by the microphone are different and wherein the microphone, the first MEMs sensor, and the second MEMs sensor, and the third MEMs sensor are formed on or in a single semiconductor substrate.

11. The MIMS of claim 10 wherein at least one of the microphone, the first MEMs sensor, the second MEMs sensor or the third MEMs sensor is exposed to an external environment and wherein at least one of the microphone, the first MEMs sensor, the second MEMs sensor, or the third MEMs sensor is sealed from the external environment.

12. The MIMS of claim 10 wherein at least one layer of the first integrated circuit is shared in common with the microphone, the first MEMs sensor, the second MEMs sensor, or the third MEMs sensor and wherein at least a portion of the at least one layer is etched.

13. The MIMS of claim 10 wherein at least one layer of the first integrated circuit forms a cap on at least one of the microphone, the first MEMs sensor, the second MEMs sensor, or the third MEMs sensor and wherein the at least one layer of the first integrated circuit forms a moving plate on at least one of the microphone, the first MEMs sensor, the second MEMs sensor, or the third MEMs sensor.

14. The MIMS of claim 10 wherein the at least one layer of the first integrated circuit is configured to flex in at least one of the microphone, the first MEMs sensor, the second MEMs sensor, or the third MEMs sensor and wherein the at least one layer of the first integrated circuit is configured not to flex in at least one of the microphone, the first MEMs sensor, the second MEMs sensor, or the third MEMs sensor.

15. The MIMS of claim 10 wherein the first, second, or third MEMs sensors are sealed from an external environment at a different pressure.

16. The MIMs of claim 10 wherein the first integrated circuit comprises at least two of an inertial sensor, a pressure sensor, a tactile sensor, a humidity sensor, a temperature sensor, a microphone, a force sensor, an IR sensor, a load sensor, a magnetic sensor, a flow sensor, a light sensor, an electric field sensor, an electrical impedance sensor, a galvanic skin response sensor, a chemical sensor, a gas sensor, a liquid sensor, a solids sensor, or a biological sensor.

17. The MIMs of claim 10 wherein the first integrated circuit comprises at least three of an inertial sensor, a pressure sensor, a tactile sensor, a humidity sensor, a temperature sensor, a microphone, a force sensor, an IR sensor, a load sensor, a magnetic sensor, a flow sensor, a light sensor, an electric field sensor, an electrical impedance sensor, a galvanic skin response sensor, a chemical sensor, a gas sensor, a liquid sensor, a solids sensor, or a biological sensor.

18. The MIMS of claim 10 wherein at least one sensor of the microphone, the first MEMs sensor, the second MEMs sensor, or the third MEMs sensor is sealed by depositing a layer using low pressure chemical vapor deposition, plasma enhanced chemical vapor deposition, atmospheric pressure chemical vapor deposition, sub atmospheric chemical vapor deposition, physical vapor deposition, atomic layer deposition, metallo organic chemical vapor deposition, molecular beam epitaxy, sputtering, evaporating, spin-coating, electroplating, or spray coating.

19. A monolithically integrated multi-sensor (MIMs) comprising:
a first integrated circuit comprising:
a microphone configured to measure an parameter; and
a first MEMs sensor configured to measure a first parameter;
a second MEMs sensor configured to measure a second parameter; and
at least a third sensor configured to measure a third parameter wherein the first parameter, the second parameter, the third parameter, and the parameter measured by the microphone are different and wherein the microphone, the first MEMs sensor, and the second MEMs sensor, and the at least third sensor are formed on or in a single semiconductor substrate.

20. The MIMs of claim 19 wherein the first integrated circuit comprises at least three of an inertial sensor, a pressure sensor, a tactile sensor, a humidity sensor, a temperature sensor, a microphone, a force sensor, an IR sensor, a load sensor, a magnetic sensor, a flow sensor, a light sensor, an electric field sensor, an electrical impedance sensor, a galvanic skin response sensor, a chemical sensor, a gas sensor, a liquid sensor, a solids sensor, or a biological sensor.

* * * * *